(12) United States Patent
Yamazaki et al.

(10) Patent No.: US 9,905,585 B2
(45) Date of Patent: Feb. 27, 2018

(54) SEMICONDUCTOR DEVICE COMPRISING CAPACITOR

(71) Applicant: Semiconductor Energy Laboratory Co., Ltd., Atsugi-shi, Kanagawa-ken (JP)

(72) Inventors: Shunpei Yamazaki, Setagaya (JP); Hiroyuki Miyake, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/134,284

(22) Filed: Dec. 19, 2013

(65) Prior Publication Data

US 2014/0175433 A1   Jun. 26, 2014

(30) Foreign Application Priority Data

Dec. 25, 2012 (JP) ................... 2012-281865

(51) Int. Cl.
*H01L 27/12* (2006.01)

(52) U.S. Cl.
CPC ...... *H01L 27/1255* (2013.01); *H01L 27/1225* (2013.01); *H01L 27/1259* (2013.01)

(58) Field of Classification Search
CPC ............. H01L 27/1225; H01L 27/1255; G02F 1/136213; G02F 1/1368
See application file for complete search history.

(56) References Cited

U.S. PATENT DOCUMENTS

| | | |
|---|---|---|
| 5,299,041 A | 3/1994 | Morin et al. |
| 5,724,107 A | 3/1998 | Nishikawa et al. |
| 5,731,856 A | 3/1998 | Kim et al. |
| 5,744,864 A | 4/1998 | Cillessen et al. |
| 6,294,274 B1 | 9/2001 | Kawazoe et al. |
| 6,421,101 B1 | 7/2002 | Zhang et al. |
| 6,559,477 B2 | 5/2003 | Tada et al. |
| 6,563,174 B2 | 5/2003 | Kawasaki et al. |
| 6,566,685 B2 | 5/2003 | Morikawa et al. |
| 6,727,522 B1 | 4/2004 | Kawasaki et al. |

(Continued)

FOREIGN PATENT DOCUMENTS

| | | |
|---|---|---|
| CN | 001317761 A | 10/2001 |
| EP | 1037095 A | 9/2000 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1-73, vol. 45A, No. 2, pp. 115-116.

(Continued)

*Primary Examiner* — Stephen Bradley
(74) *Attorney, Agent, or Firm* — Robinson Intellectual Property Law Office; Eric J. Robinson

(57) ABSTRACT

A semiconductor device in which the aperture ratio and which includes a capacitor with increased charge capacity is provided. A semiconductor device in which the number of masks used in a manufacturing process is reduced and the manufacturing costs are reduced is also provided. An impurity is contained in a light-transmitting semiconductor film so that the semiconductor film functions as one of a pair of electrodes in a capacitor. The other pair of electrodes is formed using a light-transmitting conductive film such as a pixel electrode. Further, a scan line and a capacitor line are provided on the same surface and in parallel to each other. An opening reaching the capacitor line and an opening reaching a conductive film which can be formed in the formation of a source electrode or a drain electrode of the transistor can be formed concurrently in an insulating film.

12 Claims, 49 Drawing Sheets

(56) References Cited

U.S. PATENT DOCUMENTS

| | | |
|---|---|---|
| 6,784,949 B1 | 8/2004 | Nagata et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,142,260 B2 | 11/2006 | Yang |
| 7,211,825 B2 | 5/2007 | Shih et al. |
| 7,250,991 B2 | 7/2007 | Nagata et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,515,217 B2 | 4/2009 | Yang |
| 7,674,650 B2 | 3/2010 | Akimoto et al. |
| 7,732,819 B2 | 6/2010 | Akimoto et al. |
| 7,745,798 B2 | 6/2010 | Takahashi |
| 7,773,167 B2 | 8/2010 | Tsai et al. |
| 7,872,261 B2 | 1/2011 | Ikeda |
| 8,102,476 B2 | 1/2012 | Son et al. |
| 8,368,066 B2 | 2/2013 | Yamazaki et al. |
| 8,441,011 B2 | 5/2013 | Yamazaki et al. |
| 8,476,625 B2 | 7/2013 | Kimura et al. |
| 8,558,960 B2 | 10/2013 | Yamazaki et al. |
| 9,305,944 B2 | 4/2016 | Yamazaki et al. |
| 9,437,454 B2 | 9/2016 | Kurata et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0169991 A1 | 9/2004 | Nagata et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0141203 A1* | 6/2009 | Son .............. G02F 1/136213 349/39 |
| 2009/0152506 A1 | 6/2009 | Umeda et al. |
| 2009/0152541 A1 | 6/2009 | Maekawa et al. |
| 2009/0189156 A1 | 7/2009 | Akimoto |
| 2009/0278122 A1 | 11/2009 | Hosono et al. |
| 2009/0280600 A1 | 11/2009 | Hosono et al. |
| 2009/0283762 A1 | 11/2009 | Kimura |
| 2010/0044711 A1 | 2/2010 | Imai |
| 2010/0065844 A1 | 3/2010 | Tokunaga |
| 2010/0092800 A1 | 4/2010 | Itagaki et al. |
| 2010/0102311 A1 | 4/2010 | Ito et al. |
| 2010/0109002 A1 | 5/2010 | Itagaki et al. |
| 2010/0123136 A1 | 5/2010 | Lee et al. |
| 2010/0163867 A1 | 7/2010 | Yamazaki et al. |
| 2010/0163874 A1 | 7/2010 | Koyama et al. |
| 2011/0024750 A1 | 2/2011 | Yamazaki et al. |
| 2011/0024751 A1 | 2/2011 | Yamazaki et al. |
| 2011/0031491 A1 | 2/2011 | Yamazaki et al. |
| 2011/0031492 A1 | 2/2011 | Yamazaki et al. |
| 2011/0032435 A1 | 2/2011 | Kimura |
| 2011/0037068 A1 | 2/2011 | Yamazaki et al. |
| 2011/0084271 A1 | 4/2011 | Yamazaki et al. |
| 2011/0220888 A1 | 9/2011 | Choi et al. |
| 2012/0062811 A1* | 3/2012 | Miyake .............. G02F 1/136213 349/39 |
| 2012/0062814 A1* | 3/2012 | Yamazaki .............. G02F 1/1333 349/43 |
| 2012/0138932 A1* | 6/2012 | Lin .................... G02F 1/136213 257/59 |
| 2012/0273780 A1 | 11/2012 | Yamazaki et al. |
| 2012/0280230 A1 | 11/2012 | Akimoto et al. |
| 2012/0298988 A1 | 11/2012 | Hara |
| 2012/0319107 A1 | 12/2012 | Miyake |
| 2013/0140635 A1* | 6/2013 | Yan ...................... H01L 27/1255 257/347 |
| 2013/0161612 A1* | 6/2013 | Kakkad .................. H01L 27/13 257/43 |
| 2013/0280858 A1 | 10/2013 | Kimura et al. |
| 2014/0034954 A1 | 2/2014 | Yamazaki et al. |
| 2016/0218118 A1 | 7/2016 | Yamazaki et al. |
| 2016/0343587 A1 | 11/2016 | Kurata et al. |

FOREIGN PATENT DOCUMENTS

| | | |
|---|---|---|
| EP | 1737044 A | 12/2006 |
| EP | 2192441 A | 6/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |

(56) References Cited

FOREIGN PATENT DOCUMENTS

| | | |
|---|---|---|
| JP | 63-265818 A | 11/1988 |
| JP | 01-129234 A | 5/1989 |
| JP | 05-251705 A | 9/1993 |
| JP | 07-104312 A | 4/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-323698 A | 11/2000 |
| JP | 2001-051300 A | 2/2001 |
| JP | 2002-050761 A | 2/2002 |
| JP | 2002-076356 A | 3/2002 |
| JP | 2002-289859 A | 10/2002 |
| JP | 2002-359252 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-077822 A | 3/2005 |
| JP | 2007-096055 A | 4/2007 |
| JP | 2007-123861 A | 5/2007 |
| JP | 2010-171394 A | 8/2010 |
| JP | 2011-054949 A | 3/2011 |
| JP | 2012-033896 A | 2/2012 |
| JP | 2012-083738 A | 4/2012 |
| JP | 2012-084865 A | 4/2012 |
| JP | 2012-234187 A | 11/2012 |
| WO | WO-2004/114391 | 12/2004 |
| WO | WO-2011/089767 | 7/2011 |
| WO | WO-2012/002236 | 1/2012 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.M et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe,. Ni, Cu, or Zn] at Temeprature Over 1000° C.", Journal of Solid State Chemistry, 1985, vol. 6, pp. 382-384.

Nakamura.M et al., "The phase relations in the In2O3—Ga2ZnO4-ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No, 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Device, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Kimizuka.M et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe,. Ni, Cu, or Zn] at Temeprature Over 1000° C.", Journal of Solid State Chemistry, 1985, vol. 6, pp. 382-384.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2005, vol. 18, No. 3, pp. 339-342

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs for AMLCDS", Journal of the SID, 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2008, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Digest of Technical Papers, May 31, 2009, pp. 983-985.

(56) References Cited

OTHER PUBLICATIONS

Lee.M et al., "15.4:Excellent Performance of Indium-Oxide-Based Thin-Film Transistors by DC Sputtering", SID Digest 09 : SID International Symposium Digest of Technical Papers, May 31, 3009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—-Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m <4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) ,Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39. pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, . No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno,K et al,, "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Chinese Office Action (Application No. 201310724113.1) dated Jul. 3, 2017.

* cited by examiner

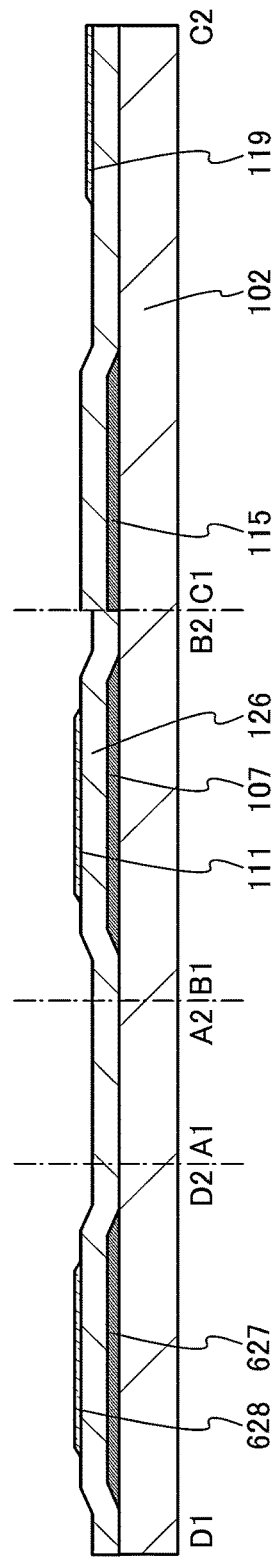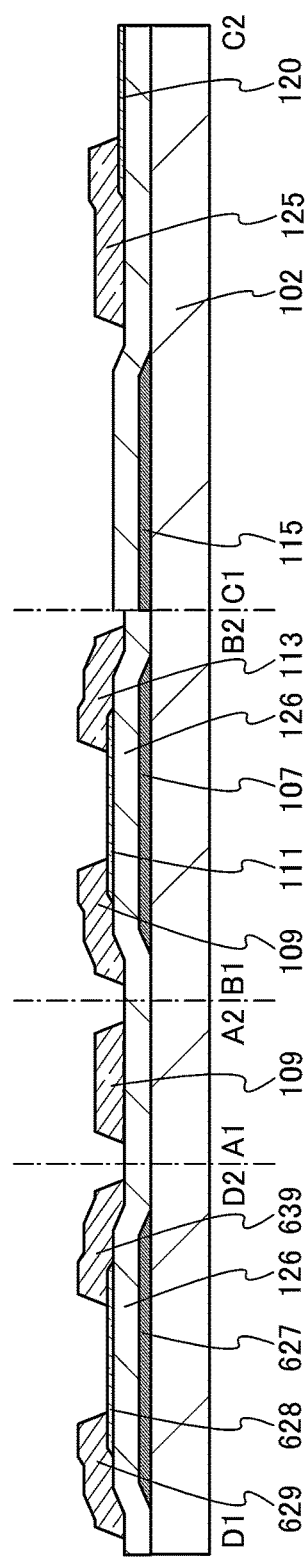

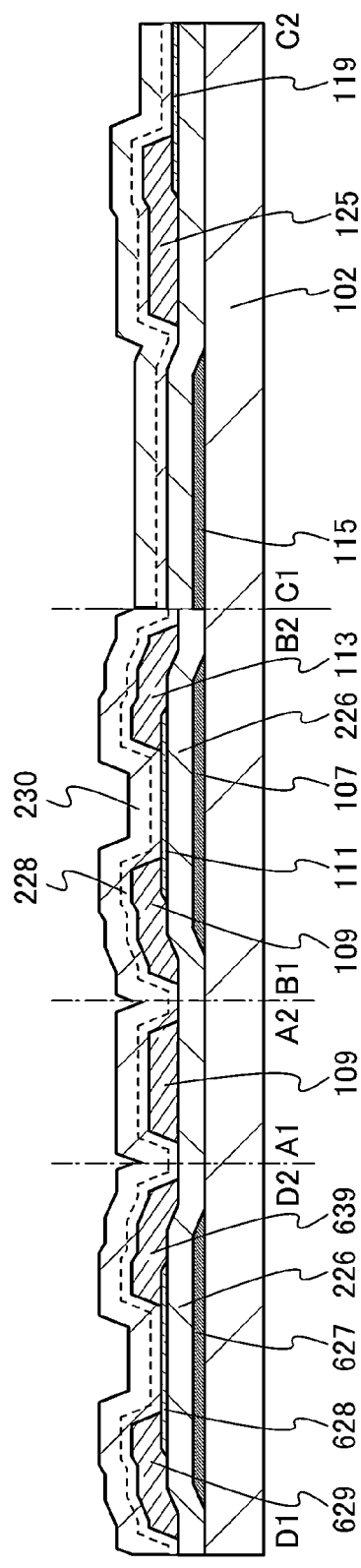
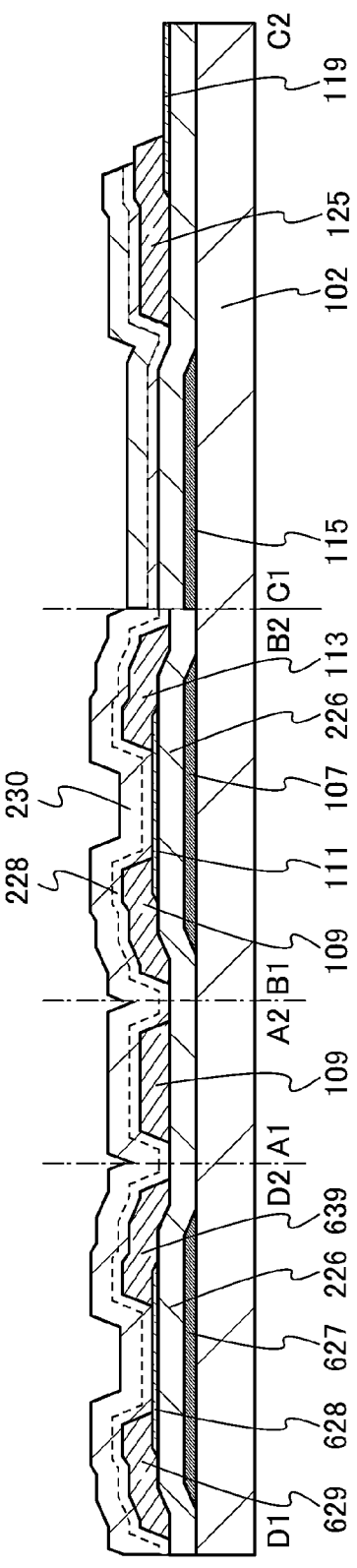
FIG. 8A
FIG. 8B

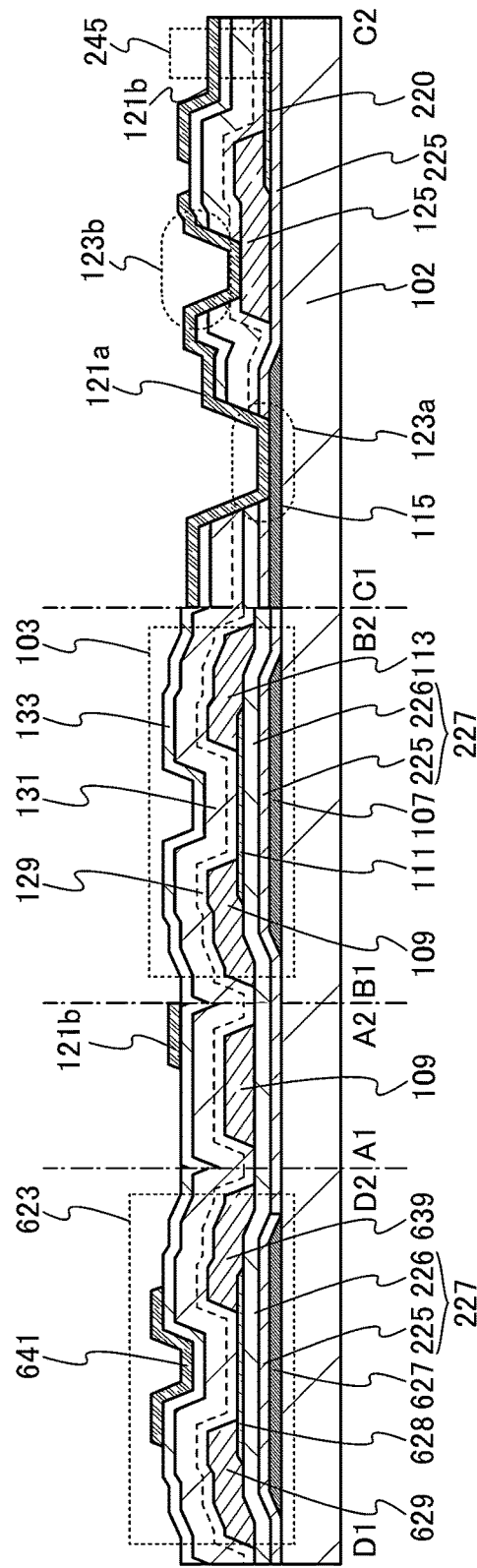

FIG. 18A
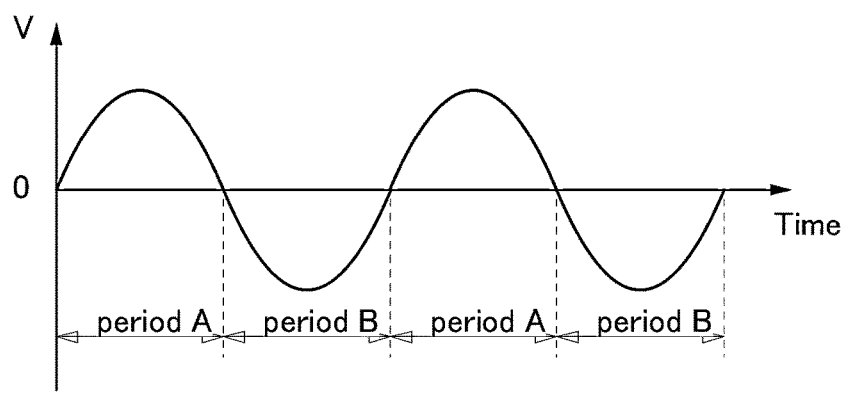
FIG. 18B1
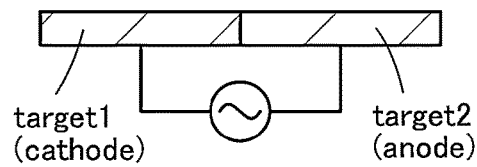
FIG. 18B2
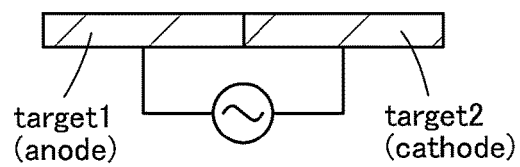
FIG. 18C
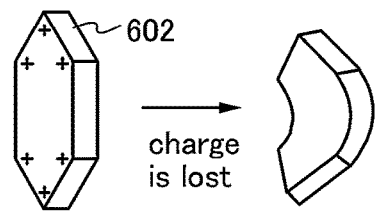

During not Touched

Input Voltage Waveform

Output Current Waveform

During Touched

Input Voltage Waveform

Output Current Waveform formation of oxide powder manufacture of polycrystalline sputtering target FIG. 27A
FIG. 27B
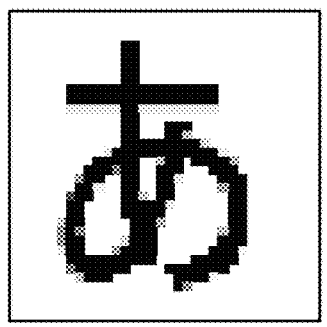
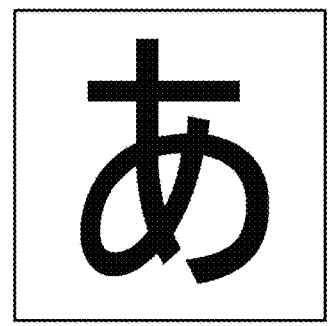

point① surface side of film point② center of film point③ base side of film point④ whole film FIG. 47A
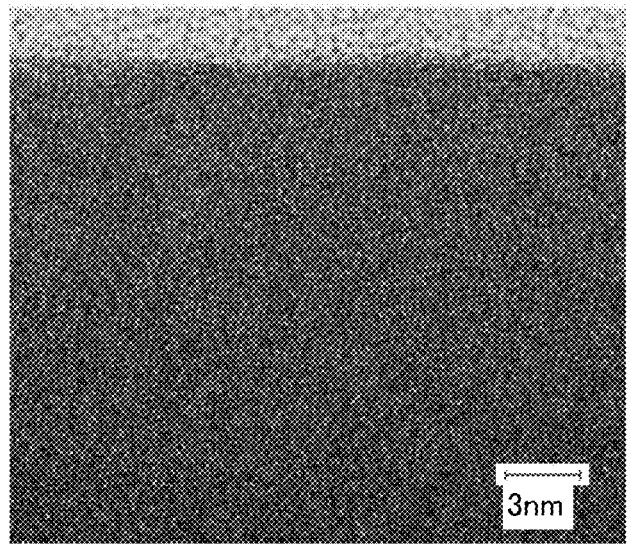
visinity of surface
FIG. 47B  central portion of film in thickness direction
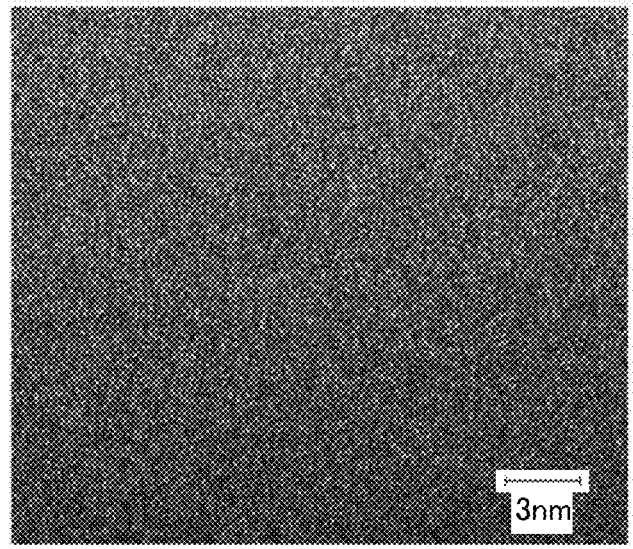

SEMICONDUCTOR DEVICE COMPRISING CAPACITOR

BACKGROUND OF THE INVENTION

1. Field of the Invention

The present invention relates to a product (including a machine, a manufacture, and a composition of matter) and a process (including a simple process and a production process). In particular, one embodiment of the present invention relates to a semiconductor device, a display device, a light-emitting device, and a power storage device, to a method for driving the same, and to a method for manufacturing the same. In particular, one embodiment of the present invention relates to a semiconductor device including an oxide semiconductor, a display device including an oxide semiconductor, or a light-emitting device including an oxide semiconductor.

2. Description of the Related Art

In recent years, flat panel displays such as liquid crystal displays (LCDs) have been widespread. In each of pixels provided in the row direction and the column direction in a display device such as a flat panel display, for example, a transistor serving as a switching element, a liquid crystal element electrically connected to the transistor, and a capacitor connected to the liquid crystal element in parallel are provided.

As a semiconductor material for forming a semiconductor film of the transistor, a silicon semiconductor such as amorphous silicon or polysilicon (polycrystalline silicon) is generally used.

Metal oxides having semiconductor characteristics (hereinafter referred to as oxide semiconductors) can be used for semiconductor films in transistors. For example, techniques for forming transistors using zinc oxide or an In—Ga—Zn-based oxide semiconductor are disclosed (see Patent Documents 1 and 2).

REFERENCE

[Patent Document 1] Japanese Published Patent Application No. 2007-123861
[Patent Document 2] Japanese Published Patent Application No. 2007-96055

SUMMARY OF THE INVENTION

In a capacitor, a dielectric film is provided between a pair of electrodes at least one of which is formed, in many cases, using a light-blocking film partly serving as a gate electrode, a source electrode, a drain electrode, or the like of a transistor.

As the capacitance value of a capacitor is increased, a period in which the alignment of liquid crystal molecules of a liquid crystal element can be kept constant in the state where an electric field is applied can be made longer. When the period can be made longer in a display device which displays a still image, the number of times of rewriting image data can be reduced, leading to a reduction in power consumption.

One of methods for increasing the charge capacity of a capacitor is to increase the area occupied by the capacitor, specifically, to increase the area of a portion where a pair of electrodes overlap each other. However, when the area of a light-blocking conductive film is increased to increase the area of a portion where a pair of electrodes overlaps with each other, the aperture ratio of a pixel is lowered and thus display quality of an image is degraded.

In view of the above problems, an object of one embodiment of the present invention is to provide a semiconductor device which has a high aperture ratio and includes a capacitor capable of increasing capacitance, or the like.

Another object of one embodiment of the present invention is a semiconductor device in which the number of masks used in a manufacturing process is reduced and manufacturing costs are reduced.

Another object of one embodiment of the present invention is to provide a semiconductor device or the like with low off-state current. Another object of one embodiment of the present invention is to provide a semiconductor device or the like with low power consumption. Another object of one embodiment of the present invention is to provide an eye-friendly display device or the like. Another object of one embodiment of the present invention is to provide a semiconductor device or the like including a transparent semiconductor film. Another object of one embodiment of the present invention is to provide a semiconductor device or the like including a semiconductor film with high reliability. Another object of one embodiment of the present invention is to provide a semiconductor device or the like including a semiconductor film with low impurity concentration. Another object of one embodiment of the present invention is to provide a semiconductor device or the like including an electrode with high transmittance. Another object of one embodiment of the present invention is to provide a semiconductor device or the like which is easily normally off. Another object of one embodiment of the present invention is to provide a novel semiconductor device. Note that the descriptions of these objects do not disturb the existence of other objects. Note that in one embodiment of the present invention, there is no need to achieve all the objects. Other objects will be apparent from and can be derived from the description of the specification, the drawings, the claims, and the like.

One embodiment of the present invention is a semiconductor device including a transistor and a light-transmitting capacitor. Specifically, a pair of electrodes and a dielectric film included in the capacitor are formed using light-transmitting materials. As one of the pair of electrodes, an electrode formed of a light-transmitting semiconductor film containing an impurity is used. As the other of the pair of electrodes, a light-transmitting conductive film such as a pixel electrode is used. Further, a scan line and a capacitor line which extends in the direction parallel to the scan line and is provided on the same surface as the scan line are provided. An opening reaching the capacitor line and an opening reaching a conductive film are formed at the same time in insulating films over the capacitor line and the conductive film which can be formed when a source electrode or a drain electrode of the transistor is formed.

One embodiment of the present invention is a semiconductor device which includes a transistor, a capacitor, a pixel electrode, a capacitor line, an electrode, and a conductive film. The transistor includes a gate electrode, a source electrode, a drain electrode, and a light-transmitting semiconductor film. In the capacitor, a dielectric film is provided between a pair of electrodes. The pixel electrode is electrically connected to the transistor. The capacitor line is formed over a surface where the gate electrode is formed. The electrode is provided over a surface where the pixel electrode is formed. The conductive film is formed over a surface where the source electrode or the drain electrode is formed. In the capacitor, the conductive film formed over a surface where the light-transmitting semiconductor film of the transistor is formed functions as one of the pair of electrodes; the pixel electrode functions as the other pair of electrodes; and insulating films provided over the light-transmitting conductive film function as the dielectric film. The capacitor line is electrically connected to the light-transmitting conductive film of the capacitor through the electrode and the conductive film. The light-transmitting conductive film of the capacitor includes a region whose conductivity is higher than that of the light-transmitting semiconductor film of the transistor.

The light-transmitting semiconductor film can be formed using an oxide semiconductor. This is because an oxide semiconductor has an energy gap as wide as 3.0 eV or more and high visible-light transmissivity.

In order to achieve stable electrical characteristics of a transistor in which a channel is formed in an oxide semiconductor film, for example, it is effective to reduce the concentration of impurities in the oxide semiconductor film in which the channel is formed in a multilayer film including the oxide semiconductor film so that the oxide semiconductor film is highly purified to be intrinsic. The expression "the oxide semiconductor film is highly purified to be intrinsic" means that the concentration of impurities in the oxide semiconductor film is reduced so that the oxide semiconductor film is intrinsic or substantially intrinsic. The term "substantially intrinsic" refers to the state where an oxide semiconductor film has a carrier density lower than $1\times10^{17}/cm^3$, preferably lower than $1\times10^{15}/cm^3$, further preferably lower than $1\times10^{13}/cm^3$. In the oxide semiconductor film, hydrogen, nitrogen, carbon, silicon, and metal elements other than the main components are impurities. In order to reduce the concentration of impurities in the oxide semiconductor film, the concentration of impurities in a film which is adjacent to the oxide semiconductor film is preferably reduced.

For example, silicon forms an impurity level in an oxide semiconductor film. In some cases, the impurity level serves as a trap to deteriorate electrical characteristics of a transistor. Specifically, the concentration of silicon in the oxide semiconductor film is set to lower than $1\times10^{19}$ atoms/cm$^3$, preferably lower than $5\times10^{18}$ atoms/cm$^3$, further preferably lower than $1\times10^{18}$ atoms/cm$^3$. Note that since an insulating film containing silicon, such as a silicon oxide film, a silicon oxynitride film, a silicon nitride film, or a silicon nitride oxide film is used for a gate insulating film of a transistor in many cases, a channel is preferably formed in a layer of the oxide semiconductor film which is not in contact with the gate insulating film.

Further, in an oxide semiconductor film, hydrogen and nitrogen form donor levels, which increase carrier density.

In the case where a channel is formed at an interface between a gate insulating film and an oxide semiconductor film, interface scattering occurs at the interface, so that the field-effect mobility of a transistor is reduced. In view of the above, the channel of the transistor is preferably formed in a layer of an oxide semiconductor film which is not in contact with a gate insulating film.

In order that a channel of a transistor is separate from a gate insulating film, for example, a multilayer film including an oxide semiconductor film may be formed. For example, the multilayer film has a stacked structure of a first oxide film, an oxide semiconductor film, and a second oxide film. The first oxide film, the oxide semiconductor film, and the second oxide film may have the same constituent elements and different atomic ratios, whereby the oxide semiconductor film serving as the channel of the transistor can be separate from the gate insulating film.

Note that a "channel" in this specification and the like refers to, for example, a portion where carriers flow and a "channel formation region" refers to, for example, a region where a channel can be formed.

The light-transmitting capacitor can be formed by utilizing a formation process of the transistor. One of the electrodes of the capacitor can be formed by utilizing a formation process of the semiconductor film of the transistor, the dielectric film of the capacitor can be formed by utilizing a formation process of the insulating film over the semiconductor film of the transistor, and the other electrode of the capacitor can be formed by utilizing a formation process of the pixel electrode electrically connected to the transistor.

When a semiconductor film formed in the formation process of the semiconductor film of the transistor is used for the one of the electrodes of the capacitor, the conductivity of the semiconductor film is increased to form the light-transmitting conductive film. For example, it is preferable that one or more selected from hydrogen, boron, nitrogen, fluorine, aluminum, phosphorus, arsenic, indium, tin, antimony, and a rare gas element be contained in the semiconductor film (to be the light-transmitting conductive film). An ion implantation method, an ion doping method, or the like may be employed to add the element to the semiconductor film. Alternatively, the semiconductor film may be exposed to plasma containing the element so that the element can be added thereto. In that case, the conductivity of the light-transmitting conductive film serving as the one electrode of the capacitor is greater than or equal to 10 S/cm and less than or equal to 1000 S/cm, preferably greater than or equal to 100 S/cm and less than or equal to 1000 S/cm.

One embodiment of the present invention is a semiconductor device which includes a transistor, a capacitor, a pixel electrode, a capacitor line, an electrode, and a conductive film. The transistor includes a gate electrode, a source electrode, a drain electrode, and a light-transmitting semiconductor film. In the capacitor, a dielectric film is provided between a pair of electrodes. The pixel electrode is electrically connected to the transistor. The capacitor line is formed over a surface where the gate electrode is formed. The electrode is provided over a surface where the pixel electrode is formed. The conductive film is formed over a surface where the source electrode or the drain electrode is formed. In the transistor, an insulating film in which an oxide insulating film and a nitride insulating film are stacked in this order is provided over the light-transmitting semiconductor film. In the capacitor, a light-transmitting conductive film formed over a surface where the light-transmitting semiconductor film of the transistor is formed is in contact with the nitride insulating film of the insulating film and functions as one of the pair of electrodes; the pixel electrode functions as the other of the pair of electrodes; and the nitride insulating film functions as the dielectric film. The capacitor line is electrically connected to the light-transmitting conductive film of the capacitor through the electrode and the conductive film. The light-transmitting conductive film of the capacitor includes a region whose conductivity is higher than that of the light-transmitting semiconductor film of the transistor.

Note that when a structure in which the light-transmitting conductive film functioning as the one of the electrodes of the capacitor is in contact with the nitride insulating film is employed, a step of adding any of the above element by an ion implantation method, an ion doping method, or the like can be skipped; thus, the yield of a semiconductor device can be improved and the manufacturing costs thereof can be reduced.

With the above structure, the capacitor transmits light and thus can be formed large (in a large area) in a pixel region except a portion where transistors are formed in the pixel. For this reason, the semiconductor device can have charge capacity increased while improving the aperture ratio. As a result, the semiconductor device can have excellent display quality.

In the case where the insulating film which is provided over the oxide semiconductor film of the transistor included in the semiconductor device is a stack of an oxide insulating film and a nitride insulating film, it is preferable that the oxide insulating film be not easily permeable to nitrogen, that is, have a barrier property against nitrogen.

With the above structure, one of or both nitrogen and hydrogen can be prevented from diffusing into the oxide semiconductor film as the semiconductor film of the transistor, so that variations in the electrical characteristics of the transistor can be suppressed.

The semiconductor device of one embodiment of the present invention includes a scan line including a gate electrode of the transistor and a capacitor line extending in the direction parallel to the scan line on the same surface as the scan line. The one of the electrodes (the light-transmitting conductive film) of the capacitor is electrically connected to the capacitor line through a conductive film which can be formed at the same time as formation of source and drain electrodes of the transistor.

Further, in a driver circuit portion, a mask is formed over insulating films over the capacitor line and the conductive film which can be formed when the source electrode or the drain electrode of the transistor is formed, and an opening reaching the capacitor line and an opening reaching the conductive film are formed at the same time. After the formation of the openings, the electrode electrically connected to the capacitor line and the conductive film can be formed in the same process as the pixel electrode.

As described above, the step of forming the opening in the insulating films over the capacitor line and the step of forming the opening in the insulating films over the conductive film which can be formed when the source electrode or the drain electrode of the transistor is formed can be performed at the same time, which results in a reduction in the number of masks used in the manufacturing process and a reduction in manufacturing costs.

Note that a method for manufacturing a semiconductor device of one embodiment of the present invention is also one embodiment of the present invention.

According to one embodiment of the present invention, a semiconductor device including a capacitor whose charge capacity is increased while the aperture ratio is improved can be provided. In addition, a semiconductor device in which the number of masks used in a manufacturing process is reduced and the manufacturing costs are reduced can be provided.

BRIEF DESCRIPTION OF THE DRAWINGS

FIGS. 4A and 4B are cross-sectional views illustrating a method for manufacturing a semiconductor device of one embodiment of the present invention.

FIGS. 8A and 8B are cross-sectional views illustrating a method for manufacturing a semiconductor device of one embodiment of the present invention.

FIG. 10 is a cross-sectional view illustrating a semiconductor device of one embodiment of the present invention.

FIGS. 18A, 18B1, 18B2, and 18C are views for explaining a discharge state when sputtering is performed using an AC power source.

FIGS. 27A and 27B are views for explaining muscular asthenopia.

FIGS. 29A-1, 29A-2, 29B-1, and 29B-2 are block diagrams and circuit diagrams illustrating a structure of a display portion in a display device of Embodiment.

FIGS. 47A and 47B are cross-sectional TEM images of a nanocrystalline oxide semiconductor film.

DETAILED DESCRIPTION OF THE INVENTION

Figure 1A:
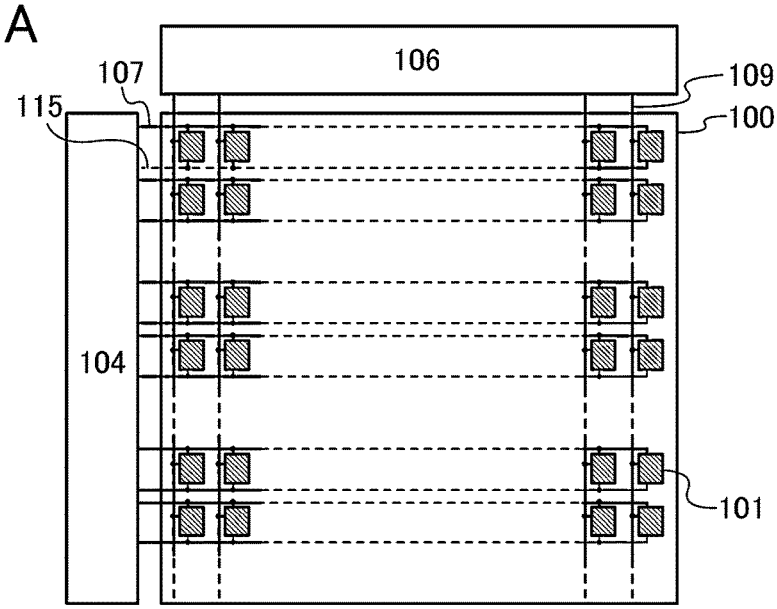
FIG. 1A illustrates a semiconductor device of one embodiment of the present invention and FIGS. 1B and 1C are circuit diagrams each illustrating a pixel.

Hereinafter, embodiments of the present invention will be described in detail with reference to the accompanying drawings. Note that the present invention is not limited to the description below, and it is easily understood by those skilled in the art that modes and details can be modified in various ways without departing from the spirit and scope of the present invention. Therefore, the present invention is not construed as being limited to description of the embodiments.

In structures of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

In each drawing described in this specification, the size, the film thickness, or the region of each component is exaggerated for clarity in some cases. Therefore, embodiments of the present invention are not limited to such scales.

Note that ordinal numbers such as "first" and "second" in this specification and the like are used for convenience and do not denote the order of steps or the stacking order of layers. In addition, the ordinal numbers in this specification do not denote particular names which specify the present invention.

Note that voltage refers to a difference between potentials of two points, and a potential refers to electrostatic energy (electric potential energy) of a unit charge at a given point in an electrostatic field. Note that in general, a difference between a potential of one point and a reference potential is merely called a potential or a voltage, and a potential and a voltage are used as synonymous words in many cases. Therefore, in this specification and the like, a potential may be rephrased as voltage and voltage may be rephrased as a potential unless otherwise specified.

In this specification and the like, in the case where etching treatment is performed after photolithography treatment, a mask formed by the photolithography treatment is removed.

Embodiment 1

In the present embodiment, a semiconductor device of one embodiment of the present invention is described with reference to drawings. Note that in this embodiment, a semiconductor device of one embodiment of the present invention is described with a liquid crystal display device taken as an example.

<Structure of Semiconductor Device>

FIG. 1A illustrates an example of a semiconductor device. The semiconductor device illustrated in FIG. 1A includes a pixel portion 100, a scan line driver circuit 104, a signal line driver circuit 106, m scan lines 107 which are arranged in parallel or almost in parallel and whose potentials are controlled by the scan line driver circuit 104, and n signal lines 109 which are arranged in parallel or almost in parallel and whose potentials are controlled by the signal line driver circuit 106. Further, the pixel portion 100 includes a plurality of pixels 101 arranged in a matrix. Capacitor lines 115 which are arranged in parallel or almost in parallel to the scan lines 107 are also provided. Note that the capacitor lines 115 may be arranged in parallel or almost in parallel along the signal lines 109.

Each scan line 107 is electrically connected to the n pixels 101 in the corresponding row among the pixels 101 arranged in m rows and n columns in the pixel portion 100. Each signal line 109 is electrically connected to the m pixels 101 in the corresponding column among the pixels 101 arranged in m rows and n columns. Note that m and n are each an integer of 1 or more. Each capacitor line 115 is electrically connected to the n pixels 101 in the corresponding row among the pixels 101 arranged in m rows and n columns. Note that in the case where the capacitor lines 115 are arranged in parallel or almost in parallel along the signal lines 109, each capacitor line 115 is electrically connected to the m pixels 101 in the corresponding column among the pixels 101 arranged in m rows and n columns.

Figure 1B:
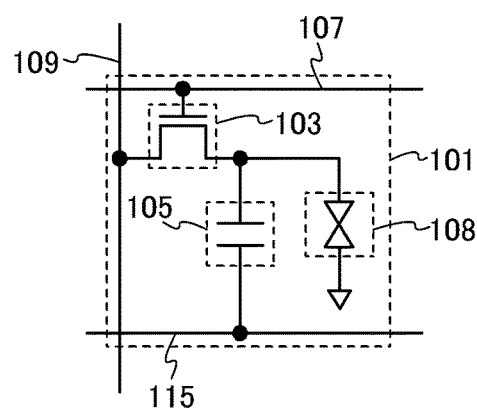

FIG. 1B is an example of a circuit diagram of the pixel 101 included in the semiconductor device illustrated in FIG. 1A. The pixel 101 illustrated in FIG. 1B includes a transistor 103, a capacitor 105, and a liquid crystal element 108. The transistor 103 is electrically connected to the scan line 107 and the signal line 109. One electrode of the capacitor 105 is electrically connected to a drain electrode of the transistor 103, and the other electrode of the capacitor 105 is electrically connected to the capacitor line 115 which supplies a constant potential. A pixel electrode of the liquid crystal element 108 is electrically connected to the drain electrode of the transistor 103 and the one electrode of the capacitor 105 and is electrically connected to a wiring which supplies a counter potential to an electrode (counter electrode) facing the pixel electrode.

The liquid crystal element 108 is an element which controls transmission of light by an optical modulation action of liquid crystal which is sandwiched between a substrate provided with the transistor 103 and the pixel electrode and a substrate provided with the counter electrode. The optical modulation action of a liquid crystal is controlled by an electric field applied to the liquid crystal (including a vertical electric field and an oblique electric field). Note that in the case where a counter electrode (also referred to as a common electrode) is provided over a substrate where a pixel electrode is provided, an electric field applied to liquid crystal is a transverse electric field.

Figure 2:
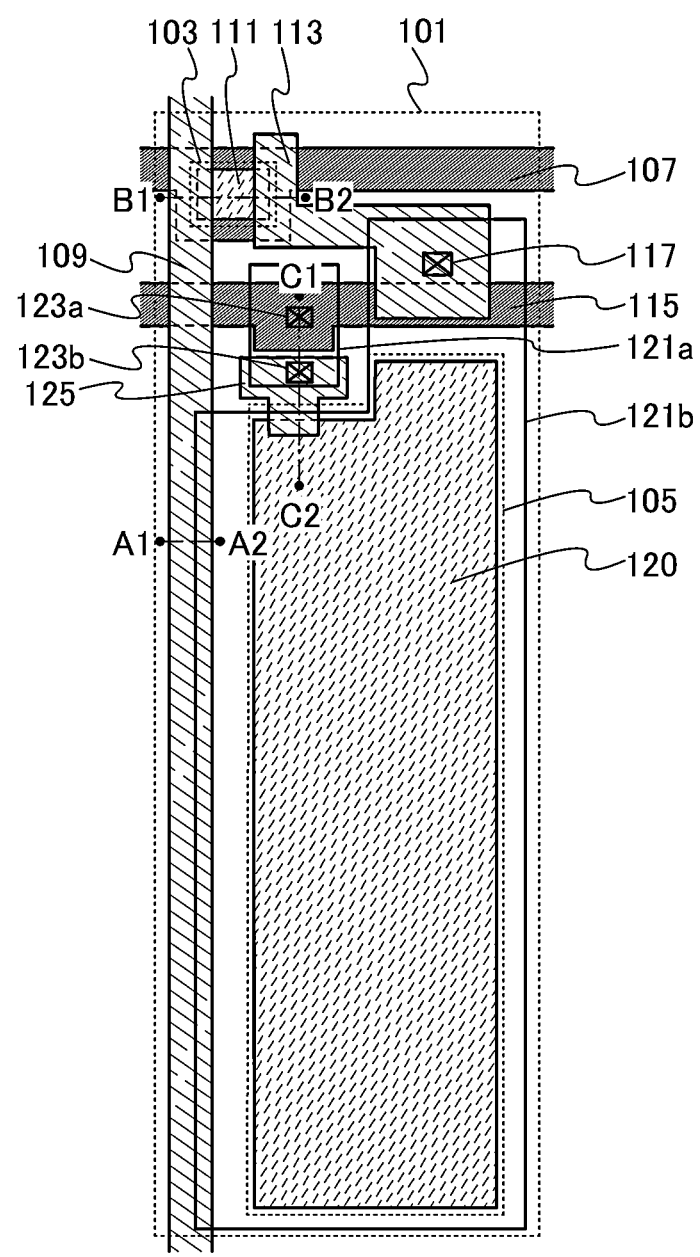
FIG. 2 is a top view illustrating a semiconductor device of one embodiment of the present invention.

Next, a specific example of the pixel 101 of the liquid crystal display device is described. FIG. 2 is a top view of the pixel 101. Note that in FIG. 2, the counter electrode and the liquid crystal element are omitted.

In FIG. 2, the scan line 107 is provided so as to extend in the direction perpendicular or almost perpendicular to the signal line 109 (in the horizontal direction in the drawing). The signal line 109 is provided so as to extend in the direction perpendicular or almost perpendicular to the scan line 107 (in the vertical direction in the drawing). The capacitor line 115 is provided so as to extend in the direction parallel to the scan line 107. Note that the scan line 107 and the capacitor line 115 are electrically connected to the scan line driver circuit 104 (see FIG. 1A), and the signal line 109 is electrically connected to the signal line driver circuit 106 (see FIG. 1A).

The transistor 103 is provided in a region where the scan line 107 and the signal line 109 cross each other. The transistor 103 includes at least a semiconductor film 111 including a channel formation region, a gate electrode, a gate insulating film (not illustrated in FIG. 2), a source electrode, and a drain electrode. A portion of the scan line 107 which overlaps with the semiconductor film 111 functions as the gate electrode of the transistor 103. A portion of the signal line 109 which overlaps with the semiconductor film 111 functions as the source electrode of the transistor 103. A portion of a conductive film 113 which overlaps with the semiconductor film 111 functions as the drain electrode of the transistor 103. Thus, the gate electrode, the source electrode, and the drain electrode may be referred to as the scan line 107, the signal line 109, and the conductive film 113, respectively. Further, in FIG. 2, an edge of the scan line 107 is on the outer side than an edge of the semiconductor film when seen from above. Thus, the scan line 107 functions as a light-blocking film for blocking light from a light source such as a backlight. For this reason, the semiconductor film 111 included in the transistor is not irradiated with light, so that variations in the electrical characteristics of the transistor can be reduced.

Further, an oxide semiconductor processed under appropriate conditions can significantly reduce the off-state current of a transistor; therefore, such an oxide semiconductor is used for the semiconductor film 111 in one embodiment of the present invention. Thus, power consumption of a semiconductor device can be reduced.

Further, an oxide semiconductor tends to absorb blue light and thus is preferable. Since blue light reaches the retina without being absorbed into the cornea and lens of the eye, long-term effects of blue light on the retina (e.g., age-related macular degeneration), adverse effects of exposure to blue light until midnight on the circadian rhythm, and the like are caused. In view of the above, when blue light is absorbed by an oxide semiconductor, users of a semiconductor device can have less eye fatigue.

The conductive film 113 is electrically connected to a pixel electrode 121b formed using a light-transmitting conductive film through an opening 117. In FIG. 2, the hatch pattern of the pixel electrode 121b is not illustrated.

The capacitor 105 is provided in a region which is in the pixel 101 and is surrounded by the capacitor lines 115 and the signal lines 109. The capacitor 105 is electrically connected to the capacitor line 115 through an electrode 121a and a conductive film 125 provided in an opening 123a and an opening 123b. The capacitor 105 is formed using a light-transmitting oxide semiconductor and includes a light-transmitting conductive film 120 with increased conductivity, the light-transmitting pixel electrode 121b, and, as a dielectric film, light-transmitting insulating films (not illustrated in FIG. 2) included in the transistor 103. That is, the capacitor 105 transmits light.

Owing to the light-transmitting property of the conductive film 120, the capacitor 105 can be formed large (in a large area) in the pixel 101. Thus, a semiconductor device having charge capacity increased while improving the aperture ratio, to typically 55% or more, preferably 60% or more can be obtained. For example, in a high-resolution semiconductor device such as a liquid crystal display device, the area of a pixel is small and the area of a capacitor is small accordingly. For this reason, the capacity of charge stored in the capacitor is small in the high-resolution semiconductor device. However, since the capacitor 105 of this embodiment transmits light, when it is provided in a pixel, enough charge capacity can be obtained in the pixel and the aperture ratio can be improved. Typically, the capacitor 105 can be favorably used in a high-resolution semiconductor device with a pixel density of 200 ppi or more, or furthermore, 300 ppi or more. Further, according to one embodiment of the present invention, the aperture ratio can be improved even in a display device with a high resolution, which makes it possible to use light from a light source such as a backlight efficiently, so that power consumption of the display device can be reduced.

Here, characteristics of a transistor including an oxide semiconductor are described. The transistor including an oxide semiconductor is an n-channel transistor. Oxygen vacancies in an oxide semiconductor might generate carriers, which might lower the electrical characteristics and reliability of the transistor. For example, in some cases, the threshold voltage of the transistor is shifted in the negative direction, and drain current flows when the gate voltage is 0 V. A transistor in which drain current flows when gate voltage is 0 V is referred to as a normally-on transistor, whereas a transistor in which substantially no drain current flows when gate voltage is 0 V is referred to as a normally-off transistor.

In view of the above, it is preferable that defects in an oxide semiconductor film as the semiconductor film 111, typically, oxygen vacancies be reduced as much as possible when an oxide semiconductor is used for the semiconductor film 111. For example, it is preferable that the spin density of the oxide semiconductor film (the density of defects in the oxide semiconductor film) at a g-value of 1.93 measured in electron spin resonance spectroscopy in which a magnetic field is applied in parallel to the film surface be reduced to lower than or equal to the lower detection limit of measurement equipment. When the defects typified by oxygen vacancies in the oxide semiconductor film are reduced as much as possible, the transistor 103 can be prevented from being normally on, leading to improvements in the electrical characteristics and reliability of a semiconductor device.

The shift of the threshold voltage of a transistor in the negative direction is caused in some cases by hydrogen (including a hydrogen compound such as water) contained in an oxide semiconductor as well as by oxygen vacancies. Hydrogen contained in the oxide semiconductor reacts with oxygen bonded to a metal atom to be water, and in addition, vacancies (also referred to as oxygen vacancies) are formed in a lattice from which oxygen is released (or a portion from which oxygen is released). In addition, the reaction of part of hydrogen and oxygen causes generation of electrons serving as carriers. Thus, a transistor including an oxide semiconductor which contains hydrogen is likely to be normally on.

In view of the above, when an oxide semiconductor is used for the semiconductor film 111, it is preferable that hydrogen in the oxide semiconductor film be reduced as much as possible. Specifically, the concentration of hydrogen in the semiconductor film 111, which is measured by secondary ion mass spectrometry (SIMS), is set to lower than $5 \times 10^{18}$ atoms/cm$^3$, preferably lower than or equal to $1 \times 10^{18}$ atoms/cm$^3$, more preferably lower than or equal to $5 \times 10^{17}$ atoms/cm$^3$, still more preferably lower than or equal to $1 \times 10^{16}$ atoms/cm$^3$.

Further, the concentration of alkali metals or alkaline earth metals in the semiconductor film 111, which is measured by secondary ion mass spectrometry (SIMS), is set to lower than or equal to $1 \times 10^{18}$ atoms/cm$^3$, preferably lower than or equal to $2 \times 10^{16}$ atoms/cm$^3$. This is because an alkali metal and an alkaline earth metal might generate carriers when bonded to an oxide semiconductor, in which case the off-state current of the transistor 103 might be increased.

Further, when nitrogen is contained in the oxide semiconductor film as the semiconductor film 111, electrons serving as carriers are generated and the carrier density increases, so that the oxide semiconductor film easily becomes n-type. Thus, a transistor including an oxide semiconductor which contains nitrogen is likely to be normally on. For this reason, nitrogen in the oxide semiconductor film is preferably reduced as much as possible; the concentration of nitrogen is preferably set to, for example, lower than or equal to $5 \times 10^{18}$ atoms/cm$^3$.

When such an oxide semiconductor film highly purified by reducing impurities (such as hydrogen, nitrogen, an alkali metal, and an alkaline earth metal) as much as possible is used as the semiconductor film 111, the transistor 103 can be prevented from being normally on, so that the off-state current of the transistor 103 can be significantly reduced. Thus, a semiconductor device having favorable electrical characteristics can be manufactured. Further, a semiconductor device with improved reliability can be manufactured.

Various experiments can prove the low off-state current of a transistor including a highly purified oxide semiconductor film. For example, even when an element has a channel width (W) of $1 \times 10^6$ μm and a channel length (L) of 10 μm, off-state current can be less than or equal to the measurement limit of a semiconductor parameter analyzer, i.e., less than or equal to $1 \times 10^{-13}$ A, at a voltage (drain voltage) between the source electrode and the drain electrode of from 1 V to 10 V. In this case, it can be found that the off-state current corresponding to a value obtained by dividing the off-state current by the channel width of the transistor is 100 zA/μm or lower. In addition, a capacitor and a transistor are connected to each other and the off-state current is measured with a circuit in which charge flowing into or from the capacitor is controlled by the transistor. In the measurement, a purified oxide semiconductor film has been used for a channel formation region of the transistor, and the off-state current of the transistor has been measured from a change in the amount of charge of the capacitor per unit time. As a result, it is found that in the case where the voltage between the source electrode and the drain electrode of the transistor is 3 V, lower off-state current of several tens of yoctoamperes per micrometer (yA/μm) can be obtained. Thus, the transistor including the highly purified oxide semiconductor film has a significantly low off-state current.

Figure 3:
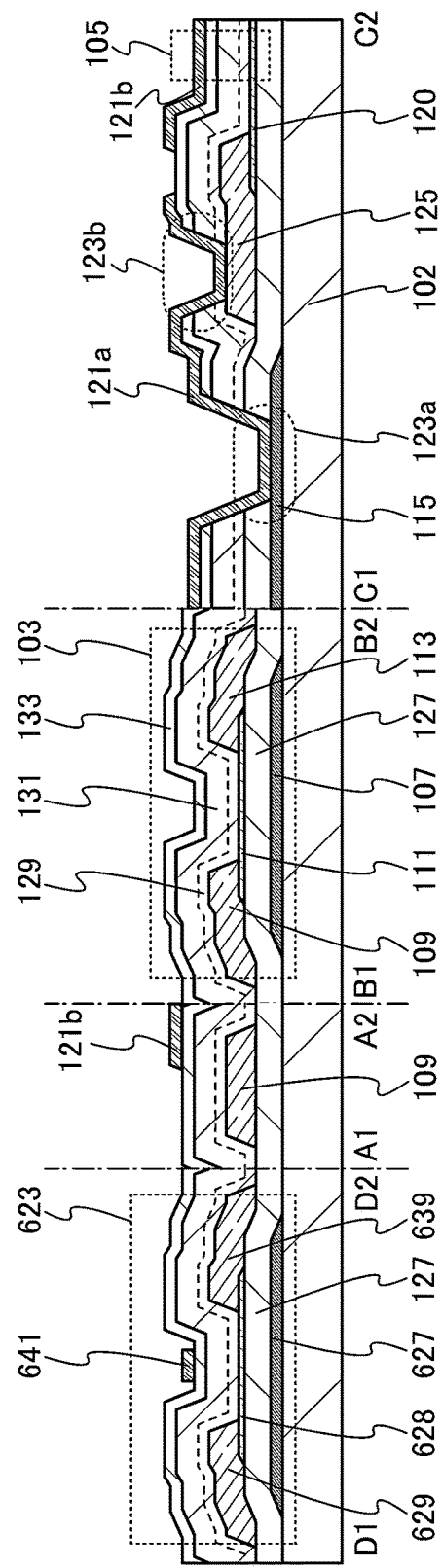
FIG. 3 is a cross-sectional view illustrating a semiconductor device of one embodiment of the present invention.

FIG. 3 is a cross-sectional view of a transistor provided in the scan line driver circuit 104 (see FIG. 1A) and cross-sectional views taken along the dashed-dotted line A1-A2, the dashed-dotted line B1-B2, and the dashed-dotted line C1-C2 in FIG. 2. Here, a top view of the scan line driver circuit 104 is omitted, and a cross-sectional view of the scan line driver circuit 104 taken along the dashed-dotted line D1-D2 is illustrated. The cross-sectional view of the transistor provided in the scan line driver circuit 104 is illustrated here, and the transistor can be provided in the signal line driver circuit 106.

First, structures of the pixel 101 taken along the dashed-dotted line A1-A2, the dashed-dotted line B1-B2, and the dashed-dotted line C1-C2 are described. The scan line 107 including a gate electrode of the transistor 103 and the capacitor line 115 over the same surface as the scan line 107 are provided over the substrate 102. A gate insulating film 127 is provided over the scan line 107 and the capacitor line 115. The semiconductor film 111 is provided over a region of the gate insulating film 127 which overlaps with the scan line 107, and the conductive film 120 is provided over the gate insulating film 127. The signal line 109 including a source electrode of the transistor 103 and the conductive film 113 including a drain electrode of the transistor 103 are provided over the semiconductor film 111 and the gate insulating film 127. The conductive film 125 is provided over the conductive film 120. The insulating film 129, the insulating film 131, and the insulating film 133 which function as protective insulating films of the transistor 103 are provided over the gate insulating film 127, the signal line 109, the semiconductor film 111, the conductive film 113, the conductive film 125, and the conductive film 120. The opening 123a reaching the capacitor line 115 is formed in the gate insulating film 127, the insulating film 129, the insulating film 131, and the insulating film 133. The opening 123b reaching the conductive film 125 is formed in the insulating film 129, the insulating film 131, and the insulating film 133. The electrode 121a is provided in the openings 123a and 123b and over the capacitor line 115, the conductive film 125, and the insulating film 133. The opening 117 (see FIG. 2) reaching the conductive film 113 is formed in the insulating films 129, 131, and 133, and the pixel electrode 121b is provided in the opening 117 and over an insulating film 133.

In the capacitor 105 described in this embodiment, the conductive film 120 which is formed in a manner similar to that of the semiconductor film 111 and has increased conductivity serves as one of a pair of electrodes, the pixel electrode 121b serves as the other of the pair of electrodes, and the insulating films 129, 131, and 133 serve as a dielectric film provided between the pair of electrodes.

Next, the structure of the transistor provided in the scan line driver circuit 104 is described. A gate electrode 627 of a transistor 623 is provided over the substrate 102. The gate insulating film 127 is provided over the gate electrode 627. A semiconductor film 628 is provided over a region of the gate insulating film 127 which overlaps with the gate electrode 627. A source electrode 629 and a drain electrode 639 of the transistor 623 are provided over the semiconductor film 628 and the gate insulating film 127. Further, the insulating films 129, 131, and 133 which serve as protective insulating films of the transistor 623 are provided over the gate insulating film 127, the source electrode 629, the semiconductor film 628, and the drain electrode 639. A conductive film 641 is provided over the insulating film 133.

Note that a base insulating film may be provided between the substrate 102, and the scan line 107, the capacitor line 115, the gate electrode 627, and the gate insulating film 127.

In the transistor 623, the conductive film 641 which overlaps with the gate electrode 627 with the semiconductor film 628 interposed therebetween is provided, whereby variations in gate voltage at which an on-current rises at different drain voltages can be reduced. Further, current flowing between the source electrode 629 and the drain electrode 639 at a surface of the semiconductor film 628 facing the conductive film 641 can be controlled; thus, variations in electrical characteristics between different transistors can be reduced. Further, when the conductive film 641 is provided, an influence of a change in ambient electric field on the semiconductor film 628 can be reduced, leading to an improvement in the reliability of the transistor. Further, when the potential of the conductive film 641 is the same or substantially the same as the minimum potential (Vss; for example, the potential of the source electrode 629 in the case where the potential of the source electrode 629 is a reference potential), a variation in threshold voltage of the transistor can be reduced and the reliability of the transistor can be improved. Note that the conductive film 641 is not necessarily provided depending on the situation or the condition.

The insulating films 129 and 131 can be formed to have a single-layer structure or a stacked structure using, for example, any of oxide insulating materials such as silicon oxide, silicon oxynitride, aluminum oxide, hafnium oxide, gallium oxide, and a Ga—Zn-based metal oxide.

The thickness of the insulating film 129 can be greater than or equal to 5 nm and less than or equal to 150 nm, preferably greater than or equal to 5 nm and less than or equal to 50 nm, more preferably greater than or equal to 10 nm and less than or equal to 30 nm. The thickness of the insulating film 131 can be greater than or equal to 30 nm and less than or equal to 500 nm, preferably greater than or equal to 150 nm and less than or equal to 400 nm.

Further, the insulating film 133 can be formed using a nitride insulating material such as silicon nitride oxide, silicon nitride, aluminum nitride, aluminum nitride oxide, and the like to have a single-layer structure or a stacked structure.

As the nitride insulating film 133, a nitride insulating film where the hydrogen content is low may be provided. The nitride insulating film is as follows, for example: the number of hydrogen molecules released from the nitride insulating film is less than $5.0 \times 10^{21}$ molecules/cm$^3$, preferably less than $3.0 \times 10^{21}$ molecules/cm$^3$, more preferably less than $1.0 \times 10^{21}$ molecules/cm$^3$ when measured by thermal desorption spectroscopy (hereinafter referred to as TDS spectroscopy) in which heat treatment is performed at a surface temperature of higher than or equal to 100° C. and lower than or equal to 700° C., preferably higher than or equal to 100° C. and lower than or equal to 500° C.

The insulating film 133 has a thickness large enough to prevent entry of impurities such as hydrogen and water from the outside. The thickness can be, for example, greater than or equal to 50 nm and less than or equal to 200 nm, preferably greater than or equal to 50 nm and less than or equal to 150 nm, and further preferably greater than or equal to 50 nm and less than or equal to 100 nm.

Further, the insulating film 133 which is a nitride insulating film is provided over the transistors 103 and 623 to block impurities such as carbon contained in the silicon oxide film, so that transfers of impurities to the semiconductor film 111 of the transistor 103 and the semiconductor film 628 of the transistor 623 can be reduced, which results in a reduction in variations in the electrical characteristics of the transistors.

Further, an oxide insulating film in which the oxygen content is higher than that in the stoichiometric composition is preferably used as one of or both the insulating film 129 and the insulating film 131. In that case, oxygen can be prevented from being released from the oxide semiconductor film, and the oxygen contained in an oxygen excess region can be transferred to the oxide semiconductor film to compensate oxygen vacancies. For example, when the number of oxygen molecules released from an oxide insulating film is greater than or equal to $1.0 \times 10^{18}$ molecules/cm$^3$ when measured by TDS spectroscopy in which heat treatment is performed at a surface temperature of higher than or equal to 100° C. and lower than or equal to 700° C., preferably higher than or equal to 100° C. and lower than or equal to 500° C., with use of such an oxide insulating film, the oxygen vacancies in the oxide semiconductor film can be filled. Note that an oxide insulating film partly including a region in which the oxygen content is higher than that in the stoichiometric composition (oxygen excess region) may be used as one of or both the insulating film 129 and the insulating film 131. When such an oxygen excess region is present in a region overlapping with at least the semiconductor film 111, oxygen is prevented from being released from the oxide semiconductor film and the oxygen contained in the oxygen excess region can be transferred to the oxide semiconductor film to fill oxygen vacancies.

In the case where the insulating film 131 is an oxide insulating film in which the oxygen content is higher than that in the stoichiometric composition, the insulating film 129 is preferably an oxide insulating film through which oxygen penetrates. Oxygen which enters the insulating film 129 from the outside does not completely penetrate through the insulating film 129 to be released and part thereof remains in the insulating film 129. Further, there is oxygen which is contained in the insulating film 129 from the first and is released from the insulating film 129 to the outside. Thus, the insulating film 129 preferably has a high coefficient of diffusion of oxygen.

Since the insulating film 129 is in contact with the semiconductor film 111 and the semiconductor film 628 which are oxide semiconductor films, the insulating film 129 is preferably an oxide insulating film through which oxygen is transmitted and by which the density of interface states at the interface with the semiconductor film 111 is reduced. For example, the insulating film 129 is preferably an oxide insulating film having defect density lower than that of the insulating film 131. The spin density at a g-value of 2.001 measured by electron spin resonance spectroscopy corresponds to the number of dangling bonds in the insulating film 129.

An insulating film having a barrier property against nitrogen is preferably used as one or both of the insulating film 129 and the insulating film 131. For example, a dense oxide insulating film can have a barrier property against nitrogen. Specifically, an oxide insulating film which can be etched at a rate of less than or equal to 10 nm per minute when the temperature is 25° C. and 0.5 wt % of fluoric acid is used is preferably used.

In the case where an oxide insulating film containing nitrogen, such as a silicon oxynitride film or a silicon nitride oxide film, is used as one or both of the insulating film 129 and the insulating film 131, the nitrogen concentration measured by SIMS is higher than or equal to the lower limit of measurement by SIMS and lower than $3 \times 10^{20}$ atoms/cm$^3$, preferably higher than or equal to $1 \times 10^{18}$ atoms/cm$^3$ and lower than or equal to $1 \times 10^{20}$ atoms/cm$^3$. In that case, the amount of nitrogen which enters the semiconductor film 111 of oxide semiconductor films included in the transistor 103 can be reduced and the number of defects in the nitrogen-containing oxide insulating film itself can be reduced.

The details of the components of the above structure are described below.

Although there is no particular limitation on a material and the like of the substrate 102, it is necessary that the substrate have heat resistance high enough to withstand at least heat treatment performed in a fabrication process of a semiconductor device. Examples of the substrate are a glass substrate, a ceramic substrate, and a plastic substrate, and as the glass substrate, an alkali-free glass substrate such as a barium borosilicate glass substrate, an aluminoborosilicate glass substrate, or an aluminosilicate glass substrate is preferably used. Alternatively, a non-light-transmitting substrate such as a stainless alloy substrate may be used. Alternatively, a non-light-transmitting substrate such as a stainless alloy substrate may be used, in which case a surface of the substrate is preferably provided with an insulating film. As the substrate 102, any of the following may alternatively be used: a quartz substrate, a sapphire substrate, a single crystal semiconductor substrate, a polycrystalline semiconductor substrate, a compound semiconductor substrate, and a silicon on insulator (SOI) substrate.

The scan line 107, the capacitor line 115, and the gate electrode 627, through which a large amount of current flows, are preferably formed using a metal film; typically, they are formed to have a single-layer structure or a stacked structure using any of metal materials such as molybdenum (Mo), titanium (Ti), tungsten (W), tantalum (Ta), aluminum (Al), copper (Cu), chromium (Cr), neodymium (Nd), or scandium (Sc), or an alloy material which contains any of these materials as its main component.

Examples of the scan line 107, the capacitor line 115, and the gate electrode 627 are a single-layer structure using aluminum containing silicon, a two-layer structure in which titanium is stacked over aluminum, a two-layer structure in which titanium is stacked over a titanium nitride, a two-layer structure in which tungsten is stacked over a titanium nitride, a two-layer structure in which tungsten is stacked over a tantalum nitride, a two-layer structure in which copper is stacked over a copper-magnesium-aluminum alloy, and a three-layer structure in which titanium nitride, copper, and tungsten are stacked in this order.

As a material of the scan line 107, the capacitor line 115, and the gate electrode 627, a light-transmitting conductive material that can be used for the pixel electrode 121b can be used.

Further, as the material of the scan line 107, the capacitor line 115, and the gate electrode 627, a metal oxide containing nitrogen, specifically, an In—Ga—Zn-based oxide containing nitrogen, an In—Sn-based oxide containing nitrogen, an In—Ga-based oxide containing nitrogen, an In—Zn-based oxide containing nitrogen, a Sn-based oxide containing nitrogen, an In-based oxide containing nitrogen, or a metal nitride (InN, SnN, or the like) film can be used. These materials each have a work function higher than or equal to 5 eV (electron volts). When such an oxide semiconductor is used for the semiconductor film 111 in the transistor 103, the use of a metal oxide containing nitrogen for the scan line 107 (the gate electrode of the transistor 103) allows the threshold voltage of the transistor 103 to be shifted in the positive direction, i.e., the transistor can be normally off. For example, in the case of using an In—Ga—Zn-based oxide containing nitrogen, an In—Ga—Zn-based oxide having at least a higher nitrogen concentration than the semiconductor film 111 which is an oxide semiconductor film, specifically, an In—Ga—Zn-based oxide having a nitrogen concentration of 7 at. % or higher can be used.

It is preferable to use aluminum or copper which is a low-resistant material for the scan line 107, the capacitor line 115, and the gate electrode 627. With the use of aluminum or copper, signal delay is reduced, so that higher image quality can be achieved. Note that aluminum has low heat resistance, and thus a defect due to hillocks, whiskers, or migration is easily generated. To prevent migration of aluminum, a layer of a metal material having a higher melting point than aluminum, such as molybdenum, titanium, or tungsten, is preferably stacked over an aluminum layer. Also in the case where copper is used, in order to prevent a defect due to migration and diffusion of copper element, a layer of a metal material having a higher melting point than copper, such as molybdenum, titanium, or tungsten, is preferably stacked over a copper layer.

The gate insulating film 127 is formed to have a single-layer structure or a stacked structure using, for example, any of insulating materials such as silicon oxide, silicon oxynitride, silicon nitride oxide, silicon nitride, aluminum oxide, hafnium oxide, gallium oxide, and a Ga—Zn-based metal oxide. In order to improve the characteristics of the interface between the gate insulating film 127 and the oxide semiconductor film as the semiconductor film 111, a region in the gate insulating film 127 which is in contact with at least the semiconductor film 111 is preferably formed using an oxide insulating film.

Further, it is possible to prevent outward diffusion of oxygen from the oxide semiconductor film as the semiconductor film 111 and entry of hydrogen, water, or the like into the oxide semiconductor film from the outside by providing an insulating film having a barrier property against oxygen, hydrogen, water, and the like under the gate insulating film 127. Examples of the insulating film having a barrier property against oxygen, hydrogen, water, and the like are an aluminum oxide film, an aluminum oxynitride film, a gallium oxide film, a gallium oxynitride film, an yttrium oxide film, an yttrium oxynitride film, a hafnium oxide film, a hafnium oxynitride film, and a silicon nitride film.

The gate insulating film 127 may be formed using a high-k material such as hafnium silicate (HfSi$_x$O$_y$), hafnium silicate (HfSi$_x$O$_y$) containing nitrogen, hafnium aluminate (HfAl$_x$O$_y$) containing nitrogen, hafnium oxide, or yttrium oxide, in which case gate leakage current of the transistor 103 can be reduced.

The gate insulating film 127 preferably has the following stacked structure. It is preferable that a silicon nitride film having fewer defects be provided as a first silicon nitride film, a silicon nitride film from which less hydrogen and ammonia are released be provided as a second silicon nitride film over the first silicon nitride film, and any of the oxide insulating films listed as those used for the gate insulating film 127 be provided over the second silicon nitride film.

In the second silicon nitride film, in thermal desorption spectrometry, the number of released hydrogen molecules is preferably less than $5\times10^{21}$ molecules/cm$^3$, more preferably less than or equal to $3\times10^{21}$ molecules/cm$^3$, further preferably less than or equal to $1\times10^{21}$ molecules/cm$^3$, and the number of released ammonia molecules is preferably less than $1\times10^{22}$ molecules/cm$^3$, more preferably less than or equal to $5\times10^{21}$ molecules/cm$^3$, further preferably less than or equal to $1\times10^{21}$ molecules/cm$^3$. The first silicon nitride film and the second silicon nitride film are used as part of the gate insulating film 127, so that a gate insulating film with a small number of defects and small amounts of released hydrogen and released ammonia can be formed as the gate insulating film 127. Thus, the amount of hydrogen and nitrogen contained in the gate insulating film 127 which enter the semiconductor film 111 can be reduced.

In the case where the trap levels (also referred to as interface states) are present at the interface between an oxide semiconductor film and a gate insulating film or in the gate insulating film in a transistor including an oxide semiconductor, a shift of the threshold voltage of the transistor, typically, a shift of the threshold voltage in the negative direction, and an increase in the subthreshold swing (S value) showing a gate voltage needed for changing the drain current by an order of magnitude when the transistor is turned on are caused. As a result, there is a problem in that electric characteristics vary among transistors. For this reason, when, as the gate insulating film, the silicon nitride film with a small number of defects is used, and the oxide insulating film is provided in a region of the gate insulating film which is in contact with the semiconductor film 111, a negative shift of the threshold voltage and an increase of an S value can be suppressed.

The thickness of the gate insulating film 127 is greater than or equal to 5 nm and less than or equal to 400 nm, preferably greater than or equal to 10 nm and less than or equal to 300 nm, more preferably greater than or equal to 50 nm and less than or equal to 250 nm.

The semiconductor film 111 and the semiconductor film 628 are oxide semiconductor films which can be amorphous, single-crystalline, or polycrystalline. The conductivity of the oxide semiconductor film is increased to form the conductive film 120. The thickness of the semiconductor film 111 is greater than or equal to 1 nm and less than or equal to 100 nm, preferably greater than or equal to 1 nm and less than or equal to 50 nm, more preferably greater than or equal to 1 nm and less than or equal to 30 nm, still more preferably greater than or equal to 3 nm and less than or equal to 20 nm.

Further, an oxide semiconductor that can be used for the semiconductor films 111 and 628 has an energy gap greater than or equal to 2 eV, preferably greater than or equal to 2.5 eV, more preferably greater than or equal to 3 eV. The use of such an oxide semiconductor having a wide energy gap can reduce the off-state current of the transistor 103.

An oxide semiconductor that can be used for the semiconductor films 111 and 628 preferably contains at least indium (In) or zinc (Zn). Alternatively, the semiconductor films 111 and 628 preferably contain both In and Zn. In order to reduce variations in electrical characteristics of the transistors including the oxide semiconductor, the oxide semiconductor preferably contains one or more stabilizers in addition to one of or both In and Zn.

As a stabilizer, gallium (Ga), tin (Sn), hafnium (Hf), aluminum (Al), zirconium (Zr), and the like can be given. As another stabilizer, lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), and the like can be given.

For an oxide semiconductor that can be used for the semiconductor films 111 and 628, for example, the following can be used: an indium oxide; a tin oxide; a zinc oxide; an oxide containing two kinds of metals, such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; an oxide containing three kinds of metals, such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or an oxide containing four kinds of metals, such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co, or the above-described element as a stabilizer.

For example, it is possible to use an In—Ga—Zn-based metal oxide containing In, Ga, and Zn at an atomic ratio of 1:1:1, 2:2:1, or 3:1:2. Alternatively, it is possible to use an In—Sn—Zn-based metal oxide containing In, Sn, and Zn at an atomic ratio of 1:1:1, 2:1:3, or 2:1:5. Note that a proportion of each atom in the atomic ratio of the metal oxide varies within a range of ±20% as an error.

Note that without limitation to the materials given above, a material with an appropriate atomic ratio depending on semiconductor characteristics and electrical characteristics (e.g., field-effect mobility and threshold voltage) may be used. In order to obtain necessary semiconductor characteristics, it is preferable that the carrier density, the impurity concentration, the defect density, the atomic ratio of a metal element to oxygen, the interatomic distance, the density, and the like be set to be appropriate. For example, high field-effect mobility can be obtained relatively easily in the case of using an In—Sn—Zn-based oxide. Also in the case of using an In—Ga—Zn-based oxide, field-effect mobility can be increased by reducing the defect density in a bulk.

The scan line 109 including the source electrode of the transistor 103, the conductive film 113 including the drain electrode of the transistor 103, the conductive film 125 electrically connecting the conductive film 120 of the capacitor 105 and the capacitor line 115, the source electrode 629, and the drain electrode 639 are formed to have a single-layer structure or a stacked structure using a material which can be used for the scan line 107, the capacitor line 115, and the gate electrode 627.

The electrode 121a, the pixel electrode 121b, and the conductive film 641 are formed using a light-transmitting conductive material such as an indium tin oxide, an indium oxide containing a tungsten oxide, an indium zinc oxide containing a tungsten oxide, an indium oxide containing a titanium oxide, an indium tin oxide containing a titanium oxide, an indium zinc oxide, or an indium tin oxide to which a silicon oxide is added.

Here, connection of the components included in the pixel 101 described in this embodiment is described with reference to the circuit diagram of FIG. 1C and the cross-sectional view of FIG. 3.

Figure 1C:
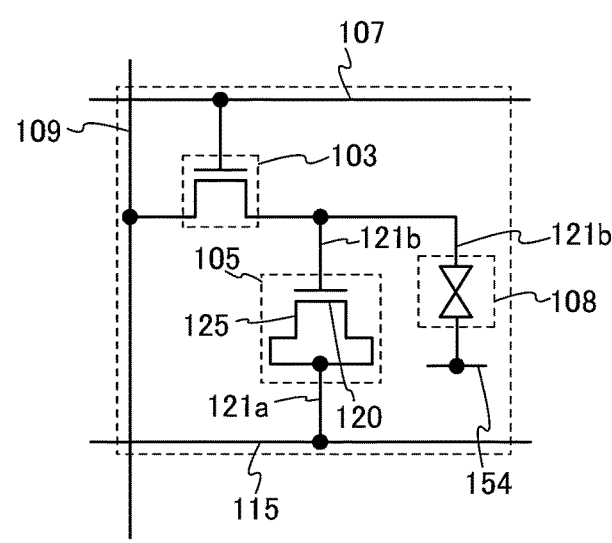

FIG. 1C is an example of a detailed circuit diagram of the pixel 101 included in the semiconductor device illustrated in FIG. 1A. As illustrated in FIG. 1C and FIG. 3, the transistor 103 includes the scan line 107 including the gate electrode, the signal line 109 including the source electrode, and the conductive film 113 including the drain electrode.

The conductive film 120 which is connected to the capacitor line 115 through the electrode 121a and the conductive film 125 functions as the one electrode of the capacitor 105. Further, the pixel electrode 121b which is connected to the conductive film 113 including the drain electrode functions as the other electrode of the capacitor 105. The insulating films 129, 131, and 133 provided between the conductive film 120 and the pixel electrode 121b functions as a dielectric film.

The liquid crystal element 108 includes the pixel electrode 121b, the counter electrode 154, and the liquid crystal layer provided between the pixel electrode 121b and the counter electrode 154.

In the capacitor 105, the conductive film 120 having a structure which is the same as that of the semiconductor film 111 is doped with a dopant to function as the electrode of the capacitor 105. This is because the pixel electrode 121b can function as a gate electrode, the insulating films 129, 131, and 133 can function as gate insulating films, and the capacitor line 115 can function as a source electrode or a drain electrode, so that the capacitor 105 can be operated in a manner similar to that of a transistor and the conductive film 120 can be made to be in a conductive state. In other words, the capacitor 105 can be a metal oxide semiconductor (MOS) capacitor. Power is supplied to a MOS capacitor when a voltage higher than the threshold voltage (Vth) is applied to one electrode of the MOS capacitor (the pixel electrode 121b of the capacitor 105). Further, the conductive film 120 can be made to be in a conductive state so that the conductive film 120 can function as one electrode of the capacitor by controlling a potential to be supplied to the capacitor line 115. In this case, the potential to be supplied to the capacitor line 115 is set as follows. The potential of the pixel electrode 121b is changed in the positive direction and the negative direction relative to the center potential of a video signal in order to operate the liquid crystal element 108 (see FIG. 1C). The potential of the capacitor line 115 needs to be constantly lower than the potential to be supplied to the pixel electrode 121b by the threshold voltage of the capacitor 105 (MOS capacitor) or more in order that the capacitor 105 (MOS capacitor) be constantly in a conductive state. However, in the capacitor 105, the conductive film 120 serving as one electrode is n-type and has high conductivity, so that the threshold voltage is shifted in the negative direction. The potential of the conductive film 120 (in other words, the potential of the capacitor line 115) can be raised in accordance with the shift amount of the threshold voltage of the capacitor 105 in the negative direction, from the lowest potential of the pixel electrode 121b. Therefore, in the case where the threshold voltage of the capacitor 105 is a larger negative value, the potential of the capacitor line 115 can be higher than the potential of the pixel electrode 121b. In such a manner, the conductive film 120 can be made to be constantly in a conductive state; thus, the capacitor 105 (MOS capacitor) can be made to be in a conductive state.

An oxide insulating film through which oxygen penetrates and which has a lower density of interface states between the semiconductor films 111 and 628 and the oxide insulating film is used as the insulating film 129 over the semiconductor films 111 and 628, and an oxide insulating film which includes an oxygen excess region or an oxide insulating film in which the oxygen content is higher than that in the stoichiometric composition is used as the insulating film 131. In such a case, oxygen can be easily supplied to the oxide semiconductor films as the semiconductor films 111 and 628, the release of oxygen from the oxide semiconductor films can be prevented, and the oxygen contained in the insulating film 131 can be transferred to the oxide semiconductor films to fill oxygen vacancies in the oxide semiconductor films. Thus, the transistor 103 can be prevented from being normally on and a potential to be supplied to the capacitor line 115 can be controlled so that the capacitor 105 (MOS capacitor) can be constantly in a conductive state; thus, the semiconductor device can have favorable electrical characteristics and high reliability.

The use of a nitride insulating film as the insulating film 133 over the insulating film 131 can suppress entry of impurities such as hydrogen and water into the semiconductor film 111 and the conductive film 120 from the outside. Moreover, the use of a nitride insulating film with a low hydrogen content as the insulating film 133 can minimize variations in electrical characteristics of the transistor 103 and the capacitor 105 (MOS capacitor).

Further, the capacitor 105 can be formed large (in a large area) in the pixel 101. For this reason, the semiconductor device can have charge capacity increased while improving the aperture ratio. As a result, the semiconductor device can have excellent display quality.

<Method for Manufacturing Semiconductor Device>

Next, a method for forming an element portion over the substrate 102 in the semiconductor device described above is described with reference to FIGS. 4A and 4B and FIGS. 5A and 5B.

First, the scan line 107, the capacitor line 115, and the gate electrode 627 are formed over the substrate 102. An insulating film 126 which is to be processed into the gate insulating film 127 later is formed so as to cover the scan line 107, the capacitor line 115, and the gate electrode 627. The semiconductor film 111 is formed over a portion of the insulating film 126 which overlaps with the scan line 107. The semiconductor film 119 is formed so as to overlap with a region where the pixel electrode 121b is to be formed later. The semiconductor film 628 is formed in a region overlapping with the gate electrode 627 (see FIG. 4A).

The scan line 107, the capacitor line 115, and the gate electrode 627 can be formed in such a manner that a conductive film is formed using any of the materials given above, a mask is formed over the conductive film, and the conductive film is processed using the mask. The conductive film can be formed by any of a variety of deposition methods such as an evaporation method, a CVD method, a sputtering method, and a spin coating method. Note that there is no particular limitation on the thickness of the conductive film, and the thickness of the conductive film can be determined in consideration of time needed for the formation, desired resistivity, or the like. As the mask, a resist mask formed through a photolithography process can be used. The conductive film can be processed by one or both of dry etching and wet etching.

The insulating film 126 can be formed using a material which can be used for the gate insulating film 127 by any of a variety of deposition methods such as a CVD method and a sputtering method.

In the case where gallium oxide is used for the gate insulating film 127, the insulating film 126 can be formed by a metal organic chemical vapor deposition (MOCVD) method.

The semiconductor films 111, 119, and 628 can be formed in such a manner that an oxide semiconductor film is formed using any of the oxide semiconductors given above, a mask is formed over the oxide semiconductor film, and the oxide semiconductor film is processed using the mask. The oxide semiconductor film can be formed by a sputtering method, a coating method, a pulsed laser deposition method, a laser ablation method, or the like. Alternatively, when a printing method is employed, the semiconductor films 111 and 119 which are separate from each other can be formed directly on the insulating film 126. As a power supply device for generating plasma in the case of forming the oxide semiconductor film by a sputtering method, an RF power supply device, an AC power supply device, a DC power supply device, or the like can be used as appropriate. As a sputtering gas, a rare gas (typically argon), an oxygen gas, or a mixed gas of a rare gas and oxygen is used as appropriate. In the case of the mixed of a rare gas and oxygen is used, the proportion of oxygen is preferably higher than that of the rare gas. Further, a target may be selected as appropriate in accordance with the composition of the oxide semiconductor film to be formed. As the mask, a resist mask formed through a photolithography process can be used. The oxide semiconductor film can be processed by one or both of dry etching and wet etching. The etching conditions (e.g., an etching gas or an etching solution, etching time, and temperature) are set as appropriate depending on the material so that the oxide semiconductor film can be etched to have a desired shape.

It is preferable that heat treatment be performed after the formation of the semiconductor films 111, 119, and 628 to dehydrate or dehydrogenate the semiconductor films 111, 119, and 628 which are the oxide semiconductor films. The heating temperature is typically higher than or equal to 150° C. and lower than the strain point of the substrate, preferably higher than or equal to 200° C. and lower than or equal to 450° C., more preferably higher than or equal to 300° C. and lower than or equal to 450° C. Note that the heat treatment may be performed on the oxide semiconductor film which has not been processed into the semiconductor films 111 and 119.

The heat treatment apparatus in the heat treatment is not limited to an electric furnace; the heat treatment apparatus can be an apparatus that heats an object using thermal conduction or thermal radiation given by a medium such as a heated gas or the like. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

The heat treatment may be performed in an atmosphere of nitrogen, oxygen, ultra-dry air (air in which the water content is less than or equal to 20 ppm, preferably less than or equal to 1 ppm, more preferably less than or equal to 10 ppb), or a rare gas (e.g., argon or helium). The atmosphere of nitrogen, oxygen, ultra-dry air, or a rare gas preferably does not contain hydrogen, water, and the like. Alternatively, the heat treatment may be performed first in an atmosphere of an inert gas and then in an oxygen atmosphere. The treatment time is 3 minutes to 24 hours.

In the case where a base insulating film is provided between the substrate 102, and the scan line 107, the capacitor line 115, and the insulating film 126 (to be the gate insulating film 127), the base insulating film can be formed using any of the following: silicon oxide, silicon oxynitride, silicon nitride, silicon nitride oxide, gallium oxide, hafnium oxide, yttrium oxide, aluminum oxide, aluminum oxynitride, and the like. The use of silicon nitride, gallium oxide, hafnium oxide, yttrium oxide, aluminum oxide, or the like for the base insulating film leads to suppression of diffusion of impurities typified by an alkali metal, water, and hydrogen into the semiconductor films 111, 119, and 628 from the substrate 102. The base insulating film can be formed by a sputtering method or a CVD method.

Next, the semiconductor film 119 is doped with a dopant, whereby the conductive film 120 with high conductivity is formed (see FIG. 4B).

A method of doping the semiconductor film 119 with a dopant is as follows: a mask is provided in a region except the semiconductor film 119 and the semiconductor film 119 is doped with one or more dopants selected from hydrogen, boron, nitrogen, fluorine, aluminum, phosphorus, arsenic, indium, tin, antimony, and a rare gas element by an ion implantation method, an ion doping method, or the like. Alternatively, the semiconductor film 119 may be exposed to plasma containing the dopant to be doped with the dopant, instead of employing an ion implantation method or an ion doping method. Note that heat treatment may be performed after the semiconductor film 119 is doped with the dopant.

Note that the step of doping the semiconductor film 119 with the dopant may be performed after the formation of the signal line 109, the conductive films 113 and 125, the source electrode 629, and the drain electrode 639. In that case, a region in the conductive film 120 which is in contact with the conductive film 125 is not doped with the dopant.

Note that both the oxide semiconductor film and the light-transmitting conductive film are oxide semiconductor films which contain In or Ga and have different impurity concentrations. Specifically, the impurity concentration of the light-transmitting conductive film is higher than that of the oxide semiconductor film. For example, the concentration of hydrogen contained in the oxide semiconductor film is lower than $5 \times 10^{19}$ atoms/cm$^3$, preferably lower than $5 \times 10^{18}$ atoms/cm$^3$, more preferably lower than or equal to $1 \times 10^{18}$ atoms/cm$^3$, further preferably lower than or equal to $5 \times 10^{17}$ atoms/cm$^3$, still further preferably lower than or equal to $1 \times 10^{16}$ atoms/cm$^3$. The concentration of hydrogen contained in the light-transmitting conductive film is higher than or equal to $8 \times 10^{19}$ atoms/cm$^3$, preferably higher than or equal to $1 \times 10^{20}$ atoms/cm$^3$, further preferably higher than or equal to $5 \times 10^{20}$ atoms/cm$^3$. The concentration of hydrogen contained in the light-transmitting conductive film is 2 times, preferably 10 or more times that of the oxide semiconductor film.

The light-transmitting conductive film has resistivity lower than that of the oxide semiconductor film. The resistivity of the light-transmitting conductive film is preferably greater than or equal to $1\times10^{-8}$ times and less than or equal to $1\times10^{-1}$ times the resistivity of the oxide semiconductor film. The resistivity of the light-transmitting conductive film is typically greater than or equal to $1\times10^{-3}$ Ωcm and less than $1\times10^4$ Ωcm, preferably greater than or equal to $1\times10^{-3}$ Ωcm and less than $1\times10^{-1}$ Ωcm.

Next, the signal line 109 including the source electrode of the transistor 103, the conductive film 113 including the drain electrode of the transistor 103, and the conductive film 125 electrically connecting the conductive film 120 and the capacitor line 115 are formed over the insulating film 126. In addition, the source electrode 629 and the drain electrode 639 are formed.

The signal line 109, the conductive films 113 and 125, the source electrode 629, and the drain electrode 639 can be formed as follows: a conductive film is formed using a material which can be used for the signal line 109, the conductive films 113 and 125, and the gate electrode 627, a mask is formed over the conductive film, and the conductive film is processed using the mask. The formation of the mask and the processing can be performed in manners similar to those of the scan line 107, the capacitor line 115, and the gate electrode 627.

Figure 5A:
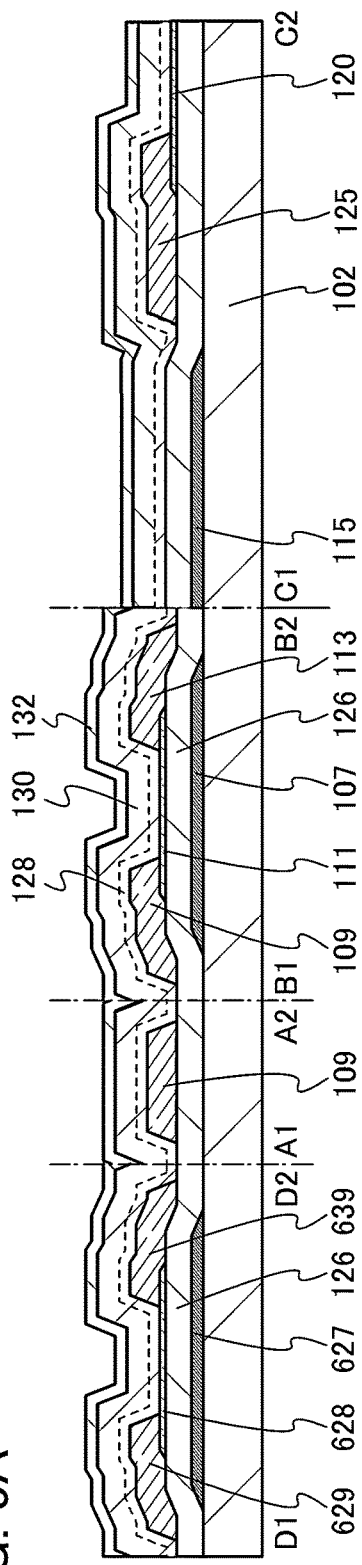
FIGS. 5A and 5B are cross-sectional views illustrating a method for manufacturing a semiconductor device of one embodiment of the present invention.

Next, an insulating film 128 is formed over the semiconductor film 111, the conductive film 120, the semiconductor film 628, the signal line 109, the conductive film 113, the conductive film 125, the source electrode 629, the drain electrode 639, and the insulating film 126; an insulating film 130 is formed over the insulating film 128; and the insulating film 132 is formed over the insulating film 130 (see FIG. 5A). Note that the insulating films 128, 130, and 132 are preferably formed successively, in which case entry of impurities into each interface can be suppressed.

The insulating film 128 can be formed using a material which can be used for the insulating film 129 by any of a variety of deposition methods such as a CVD method and a sputtering method. The insulating film 130 can be formed using a material which can be used for the insulating film 131 by any of a variety of deposition methods such as a CVD method and a sputtering method. The insulating film 132 can be formed using a material which can be used for the insulating film 133 by any of a variety of deposition methods such as a CVD method and a sputtering method.

In the case where an oxide insulating film which has lower a density of interface states between the semiconductor film 111 and the oxide insulating film is used as the insulating film 129, the insulating film 128 can be formed under the formation conditions described below. Here, as the oxide insulating film, a silicon oxide film or a silicon oxynitride film is formed. As for the formation conditions, the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., a deposition gas containing silicon and an oxidizing gas are introduced as a source gas into the treatment chamber, the pressure in the treatment chamber is greater than or equal to 20 Pa and less than or equal to 250 Pa, preferably greater than or equal to 40 Pa and less than or equal to 200 Pa, and high-frequency power is supplied to an electrode provided in the treatment chamber.

Typical examples of the deposition gas containing silicon include silane, disilane, trisilane, and silane fluoride. Examples of the oxidizing gas include oxygen, ozone, dinitrogen monoxide, and nitrogen dioxide.

By setting the ratio of the amount of the oxidizing gas to the amount of the deposition gas containing silicon to 100 or higher, the hydrogen content in the insulating film 128 (to be the insulating film 129) can be reduced and dangling bonds in the insulating film 128 (to be the insulating film 129) can be reduced. Oxygen transferred from the insulating film 130 (to be the insulating film 131) is captured by the dangling bonds in the insulating film 128 (to be the insulating film 129) in some cases; thus, in the case where the dangling bonds in the insulating film 128 (to be the insulating film 129) are reduced, oxygen in the insulating film 130 (to be the insulating film 131) can be transferred to the semiconductor film 111 efficiently to fill the oxygen vacancies in the oxide semiconductor film that is the semiconductor film 111. As a result, the amount of hydrogen which enters the oxide semiconductor film can be reduced and oxygen vacancies in the oxide semiconductor film can be reduced.

In the case where the above oxide insulating film which includes an oxygen excess region or the above oxide insulating film in which the oxygen content is higher than that in the stoichiometric composition is used as the insulating film 131, the insulating film 130 can be formed under the formation conditions described below. Here, as the oxide insulating film, a silicon oxide film or a silicon oxynitride film is formed. As for the formation conditions, the substrate placed in a treatment chamber of a plasma CVD apparatus, which is vacuum-evacuated, is held at a temperature higher than or equal to 180° C. and lower than or equal to 260° C., preferably higher than or equal to 180° C. and lower than or equal to 230° C., the pressure in the treatment chamber is greater than or equal to 100 Pa and less than or equal to 250 Pa, preferably greater than or equal to 100 Pa and less than or equal to 200 Pa with introduction of a source gas into the treatment chamber, and high-frequency power that is higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

As the source gas of the insulating film 130, a source gas which can be used for the insulating film 128 can be used.

As for the formation conditions of the insulating film 130, the high-frequency power having the above power density is supplied to the treatment chamber having the above pressure, whereby the decomposition efficiency of the source gas in plasma is increased, oxygen radicals are increased, and oxidation of the source gas proceeds; therefore, the oxygen content in the insulating film 130 is higher than that in the stoichiometric composition. However, in the case where the substrate temperature is within the above temperature range, the bond between silicon and oxygen is weak, and accordingly, part of oxygen is released by heating. Thus, it is possible to form an oxide insulating film which contains oxygen at a higher proportion than the stoichiometric composition and from which part of oxygen is released by heating. The oxygen content may be increased by adding oxygen to the insulating film 130 by an ion implantation method or the like. The insulating film 128 is provided over the semiconductor film 111. Accordingly, in the process for forming the insulating film 130, the insulating film 128 serves as a protective film of the semiconductor film 111. Thus, even when the insulating film 130 is formed using the high-frequency power having a high power density, damage to the semiconductor films 111 and 628 is not significant.

By increasing the thickness of the insulating film 130, the amount of oxygen released by heating can be increased; thus, the insulating film 130 is preferably thicker than the insulating film 128. Since the insulating film 128 is provided, favorable coverage can be achieved even when the insulating film 130 is thick.

In the case where a nitride insulating film with a low hydrogen content is used as the nitride insulating film 133, the insulating film 132 can be formed under the formation conditions described below. Here, as the nitride insulating film, a silicon nitride film is formed. The substrate placed in a treatment chamber of a plasma CVD apparatus, which is vacuum-evacuated, is held at a temperature higher than or equal to 80° C. and lower than or equal to 400° C., preferably higher than or equal to 200° C. and lower than or equal to 370° C., the pressure is greater than or equal to 100 Pa and less than or equal to 250 Pa, preferably greater than or equal to 100 Pa and less than or equal to 200 Pa with introduction of a source gas into the treatment chamber, and high-frequency power is supplied to an electrode provided in the treatment chamber.

As the source gas of the insulating film 132, a deposition gas containing silicon, nitrogen, and ammonia are preferably used. Typical examples of the deposition gas containing silicon include silane, disilane, trisilane, and silane fluoride. Further, the flow rate of nitrogen is preferably 5 times to 50 times that of ammonia, further preferably 10 times to 50 times that of ammonia. The use of ammonia as the source gas facilitates decomposition of nitrogen and the deposition gas containing silicon. This is because ammonia is dissociated by plasma energy or heat energy, and energy generated by the dissociation contributes to decomposition of a bond of the deposition gas molecules containing silicon and a bond of nitrogen molecules. Under the above conditions, a silicon nitride film which has a low hydrogen content and can suppress entry of impurities such as hydrogen and water from the outside can be formed.

It is preferable that heat treatment be performed after the formation of at least the insulating film 130 so that excess oxygen contained in the insulating film 128 or 130 is transferred to the semiconductor films 111 and 628 to fill oxygen vacancies in the semiconductor films 111 and 628 which are the oxide semiconductor films. The heat treatment can be performed as appropriate in accordance with the details of the heat treatment for dehydration or dehydrogenation of the semiconductor film 111.

Figure 5B:
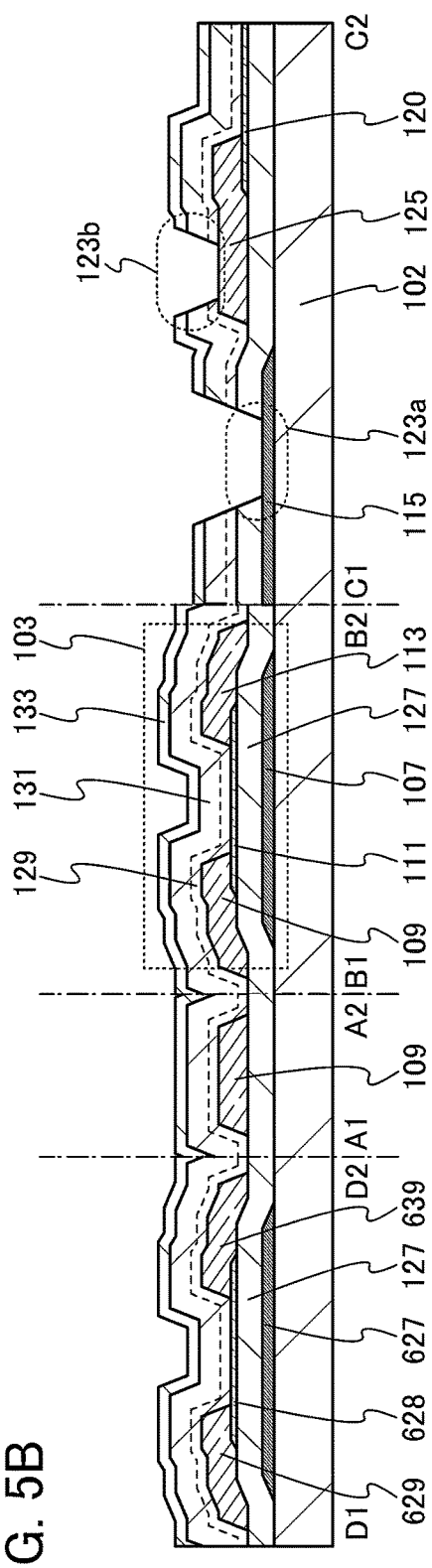

Next, the opening 123a reaching the capacitor line 115 is formed in a region in the insulating films 126, 128, 130, and 132 which overlaps with the capacitor line 115; the opening 123b reaching the conductive film 125 is formed in a region in the insulating films 128, 130, and 132 which overlaps with the conductive film 125; and the gate insulating films 127, 129, 131, and 133 are formed (see FIG. 5B).

The opening 123a can be formed in such a manner that a mask is formed and the insulating films 126, 128, 130, and 132 are processed using the mask so that the region in the insulating film 126, 128, 130, and 132 which overlaps with the capacitor line 115 is partly exposed. The opening 123b can be formed in such a manner that a mask is formed and the insulating films 128, 130, and 132 are processed using the mask so that the region in the insulating films 128, 130, and 132 which overlaps with the conductive film 125 is partly exposed. At the same time, the opening 117 (see FIG. 2) reaching the conductive film 113 is formed in a region in the insulating films 128, 130, and 132 which overlaps with the conductive film 113. The opening 117 (see FIG. 2) can be formed in a manner similar to those of the openings 123a and 123b. Note that the formation of the mask and the processing can be performed in manners similar to those of the scan line 107, the capacitor line 115, and the gate electrode 627.

In a conventional method, an opening reaching a capacitor line and an opening reaching a conductive film (a drain electrode) are separately formed and a mask is formed for the formation of each opening. In contrast, in the structure described in this embodiment, after the insulating films 128, 130, and 132 are etched to form the opening 123b reaching the conductive film 125 and the opening 117 reaching the conductive film 113, the insulating film 126 is etched in order to form the opening 123a reaching the capacitor line 115; however, the conductive film 125 and the conductive film 113, which are metals, are exposed in the opening 123b and the opening 117, so that further etching is not performed. In other words, the opening 123a reaching the capacitor line 115, the opening 123b reaching the conductive film 125, and the opening 117 reaching the conductive film 113 can be formed using the same mask, which results in a reduction in the number of masks used in the manufacturing process and a reduction in manufacturing costs.

Since the conductive film 120 is connected to the electrode 121a which is formed later through the conductive film 125, the conductive film 125 also functions as an etching protective film for the conductive film 120 in the opening 123b. Thus, the conductive film 120 can be prevented from being etched in the formation of the opening 123a after the formation of the openings 123b and 117. As a result, yield can be increased.

Lastly, the electrode 121a, the pixel electrode 121b, and the conductive film 641 are formed, so that the element portion over the substrate 102 can be formed (see FIG. 3). The electrode 121a can be formed in such a manner that a conductive film which is in contact with the capacitor line 115 and the conductive film 125 through the openings 123a and 123b is formed, a mask is formed over the conductive film, and the conductive film is processed using the mask. The pixel electrode 121b is formed in such a manner that a conductive film which is in contact with the conductive film 113 through the opening 117 is formed, a mask is formed over the conductive film, and the conductive film is processed using the mask. Note that the formation of the mask and the processing can be performed in manners similar to those of the scan line 107 and the capacitor line 115.

Modification Example 1

In the semiconductor device of one embodiment of the present invention, the top shape of the conductive film 125 which electrically connects the capacitor line 115 and the conductive film 120 serving as one electrode of the capacitor 105 can be changed as appropriate. For example, in order to reduce contact resistance between the conductive film 120 and the conductive film 125, the conductive film 125 can be provided in contact with the conductive film 120 along the outer edge thereof. The conductive film 125 is formed in a formation process which is the same as that of the signal line 109 including the source electrode of the transistor 103 and the conductive film 113 including the drain electrode of the transistor 103 and thus may have a light-blocking property; for this reason, the conductive film 125 is preferably formed into a loop shape.

Modification Example 2

Although in the pixel 101 described above, the transistor in which the semiconductor film is located between the gate insulating film and the signal line 109 including the source electrode and the conductive film 113 including the drain electrode is used, instead of the transistor, a transistor in which a semiconductor film is provided between the insulating film 129, and a signal line including a source electrode and a conductive film including a drain electrode can be used.

Modification Example 3

Although in the pixel 101 described above, a channel-etched transistor is used as the transistor, instead of the transistor, a channel protective transistor can be used. Further, when a channel protective film is provided, a surface of the semiconductor film 111 is not exposed to an etchant or an etching gas used in a formation process of the signal line and the conductive film, so that impurities between the semiconductor film 111 and the channel protective film can be reduced. As a result, leakage current flowing between the source electrode and the drain electrode of the transistor can be reduced.

Modification Example 4

Although in the pixel 101 described above, a transistor including one gate electrode is described as the transistor, a transistor including two gate electrodes which face each other with the semiconductor film 111 therebetween can be used.

The transistor is the one in which a conductive film is provided over the insulating film 133 of the transistor 103 described in this embodiment. The conductive film overlaps with at least a channel formation region of the semiconductor film 111. It is preferable that the conductive film be provided in a position overlapping with the channel formation region of the semiconductor film 111 so that the potential of the conductive film is equal to the minimum potential of a video signal input to the signal line 109. In that case, current flowing between the source electrode and the drain electrode in a surface of the semiconductor film 111 facing the conductive film can be controlled, and variations in the electrical characteristics of the transistors can be reduced. Further, when the conductive film is provided, an influence of a change in ambient electric field on the semiconductor film 111 can be reduced, leading to an improvement in the reliability of the transistor.

The conductive film can be formed using a material and a method similar to those of the scan line 107, the signal line 109, the pixel electrode 121b, or the like.

As described above, the use of the semiconductor film formed in the same formation step as the semiconductor film included in the transistor, for one electrode of the capacitor, allows fabrication of a semiconductor device including the capacitor whose charge capacity is increased while the aperture ratio is improved. As a result, the semiconductor device can have excellent display quality.

Further, oxygen vacancies and impurities such as hydrogen in the oxide semiconductor film, which is a semiconductor film included in the transistor, are reduced, so that the semiconductor device of one embodiment of the present invention has favorable electrical characteristics.

Note that the structures and the like described in this embodiment can be combined as appropriate with any of the structures and the like described in the other embodiments.

Embodiment 2

In this embodiment, a semiconductor device of one embodiment of the present invention which has a structure different from that in the above embodiment will be described with reference to drawings. In this embodiment, a liquid crystal display device is described as an example of the semiconductor device that is one embodiment of the present invention. In the semiconductor device described in this embodiment, the structure of a capacitor is different from that of the capacitor in the above embodiment. The above embodiment can be referred to for components in the semiconductor device in this embodiment which are similar to those of the semiconductor device in the above embodiment.

<Structure of Semiconductor Device>

Figure 6:
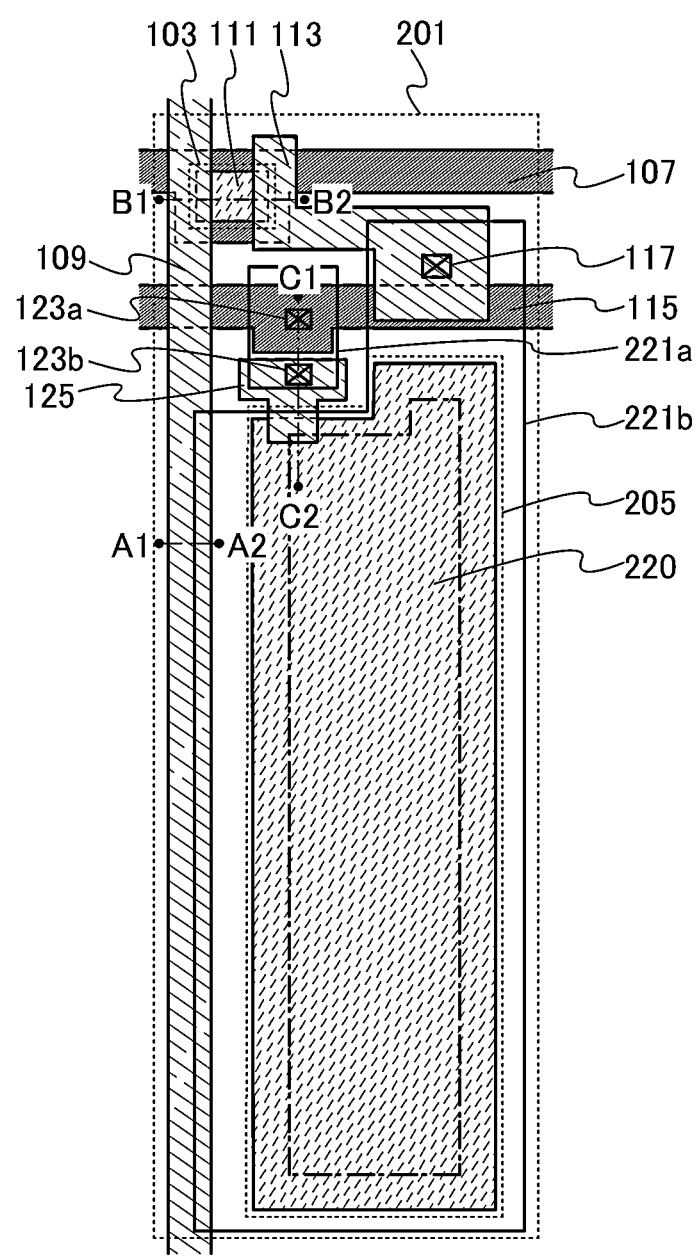
FIG. 6 is a top view illustrating a semiconductor device of one embodiment of the present invention.

FIG. 6 is a top view of a pixel 201 in this embodiment. In the pixel 201 illustrated in FIG. 6, an insulating film 229 (not illustrated) and an insulating film 231 (not illustrated) are not provided in a region indicated by a dashed-dotted line. Edges of the insulating film 229 (not illustrated) and the insulating film 231 (not illustrated) are over a conductive film 220. Thus, a capacitor 205 in the pixel 201 illustrated in FIG. 6 includes the conductive film 220 serving as one electrode, a pixel electrode 221b serving as the other electrode, and an insulating film 233 (not illustrated) serving as a dielectric film.

Figure 7:
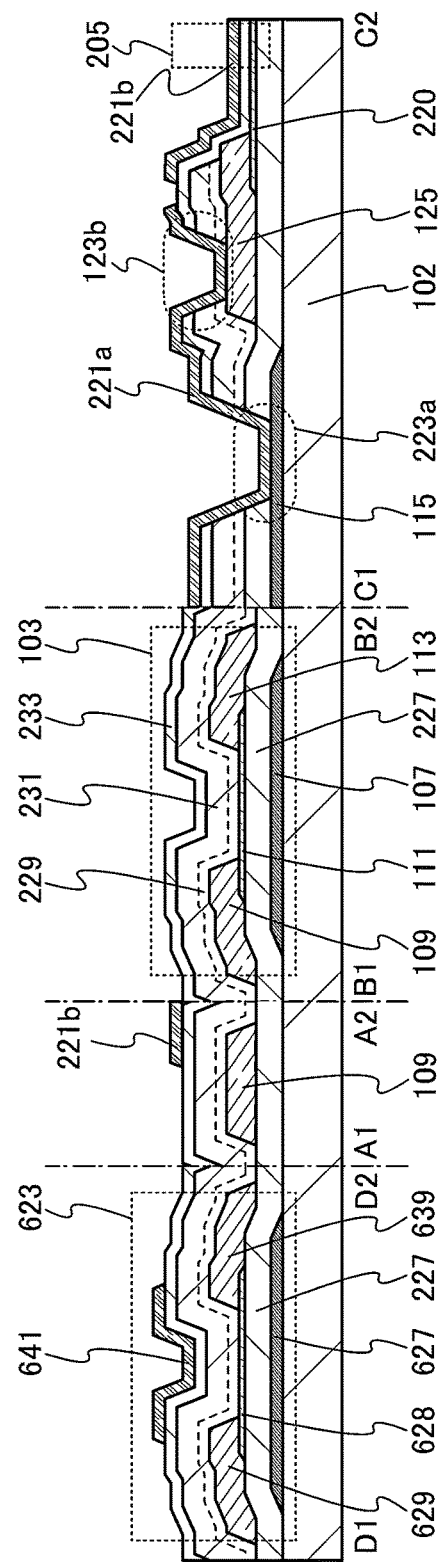
FIG. 7 is a cross-sectional view illustrating a semiconductor device of one embodiment of the present invention.

FIG. 7 illustrates a cross-sectional view of a transistor provided in the scan line driver circuit 104 (see FIG. 1A) and cross-sectional views taken along dashed-dotted line A1-A2, dashed-dotted line B1-B2, and dashed-dotted line C1-C2 in FIG. 6. Here, a top view of the scan line driver circuit 104 is omitted, and a cross-sectional view of the scan line driver circuit 104 taken along dashed-dotted line D1-D2 is illustrated. The cross-sectional view of the transistor provided in the scan line driver circuit 104 is illustrated here, and the transistor can be provided in the signal line driver circuit 106.

A cross-sectional structure of the pixel 201 in this embodiment is described below. The scan line 107 including a gate electrode of the transistor 103 and the capacitor line 115 over the same surface as the scan line 107 are provided over the substrate 102. A gate insulating film 227 is provided over the scan line 107 and the capacitor line 115. The semiconductor film 111 is provided over a region of the gate insulating film 227 which overlaps with the scan line 107, and the conductive film 220 is provided over the gate insulating film 227. The signal line 109 including the source electrode of the transistor 103 and the conductive film 113 including the drain electrode of the transistor 103 are provided over the semiconductor film 111 and the gate insulating film 227. The conductive film 125 is provided over the conductive film 220. An insulating film 229, an insulating film 231, and an insulating film 233 which function as protective insulating films of the transistor 103 are provided over the gate insulating film 227, the signal line 109, the semiconductor film 111, the conductive film 113, the conductive film 125, and the conductive film 220. The insulating film 233 is provided on and in contact with the conductive film 220 at least in a region to be the capacitor 205. An opening 223a reaching the capacitor line 115 is formed in the gate insulating film 227 and the insulating films 229, 231, and 233; an opening 223b reaching the conductive film 125 is formed in the insulating films 229, 231, and 233; and an electrode 221a is formed in the openings 223a and 223b and over the capacitor line 115, the conductive film 125, and the insulating film 233. The opening 117 (see FIG. 6) reaching the conductive film 113 is provided in the insulating films 229, 231, and 233, and the pixel electrode 221b is provided in and over the opening 117 and over the insulating film 233. Note that a base insulating film may be provided between the first substrate 102 and the scan line 107, the capacitor line 115, and the gate insulating film 227.

The gate insulating film 227 is similar to the gate insulating film 127 described in Embodiment 1. The insulating film 229 is similar to the insulating film 129 described in Embodiment 1. The insulating film 231 is similar to the insulating film 131 described in Embodiment 1. The insulating film 233 is similar to the insulating film 133 described in Embodiment 1. The pixel electrode 221b is similar to the pixel electrode 121b described in Embodiment 1.

When the insulating film 233 serves as a dielectric film between the conductive film 220 that is one electrode and the pixel electrode 221b that is the other electrode as in the capacitor 205 in this embodiment, the thickness of the dielectric film can be smaller than that of the dielectric film of the capacitor 105 in Embodiment 1. Thus, the capacitor 205 in this embodiment can have charge capacity larger than that of the capacitor 105 in Embodiment 1.

The insulating film 233 is preferably a nitride insulating film which is similar to the insulating film 133 in Embodiment 1. The insulating film 233 is in contact with the semiconductor film 119 (to be the conductive film 220), so that nitrogen and furthermore hydrogen contained in the nitride insulating film can be transferred to the semiconductor film 119; thus, the semiconductor film 119 can be an n-type semiconductor film and have higher conductivity. Further, when the insulating film 233 is formed using a nitride insulating film and is subjected to heat treatment while it is in contact with the semiconductor film 119, nitrogen and furthermore hydrogen contained in the nitride insulating film can be transferred to the semiconductor film 119, so that the conductive film 220 can be formed.

Note that both the oxide semiconductor film and the light-transmitting conductive film are oxide semiconductor films which contain In or Ga and have different impurity concentrations. Specifically, the impurity concentration of the light-transmitting conductive film is higher than that of the oxide semiconductor film. For example, the concentration of hydrogen contained in the oxide semiconductor film is lower than $5\times10^{19}$ atoms/cm$^3$, preferably lower than $5\times10^{18}$ atoms/cm$^3$, more preferably lower than or equal to $1\times10^{18}$ atoms/cm$^3$, further preferably lower than or equal to $5\times10^{17}$ atoms/cm$^3$, still further preferably lower than or equal to $1\times10^{16}$ atoms/cm$^3$. The concentration of hydrogen contained in the light-transmitting conductive film is higher than or equal to $8\times10^{19}$ atoms/cm$^3$, preferably higher than or equal to $1\times10^{20}$ atoms/cm$^3$, further preferably higher than or equal to $5\times10^{20}$ atoms/cm$^3$. The concentration of hydrogen contained in the light-transmitting conductive film is 2 times, preferably 10 or more times that of the oxide semiconductor film.

The light-transmitting conductive film has resistivity lower than that of the oxide semiconductor film. The resistivity of the light-transmitting conductive film is preferably greater than or equal to $1\times10^{-8}$ times and less than or equal to $1\times10^{-1}$ times the resistivity of the oxide semiconductor film. The resistivity of the light-transmitting conductive film is typically greater than or equal to $1\times10^{-3}$ Ωcm and less than $1\times10^{4}$ Ωcm, preferably greater than or equal to $1\times10^{-3}$ Ωcm and less than $1\times10^{-1}$ Ωcm.

The conductive film 220 has a region with conductivity higher than that of the semiconductor film 111. With this structure, at least a portion of the conductive film 220 which is in contact with the insulating film 233 is n-type and has conductivity higher than that of a region of the semiconductor film 111 which is in contact with the insulating film 229.

In an operation method of the capacitor 205 in the semiconductor device of this embodiment, the potential of the conductive film 220 (in other words, the potential of the capacitor line 115) is constantly lower than the potential of the pixel electrode 221b by greater than or equal to the threshold voltage (Vth) of the capacitor 205 (MOS capacitor) in a period when the capacitor 205 is operated, as in the operation method of the capacitor 105 in Embodiment 1. However, in the capacitor 205, the conductive film 220 serving as one electrode is n-type and has high conductivity, so that the threshold voltage is shifted in the negative direction. The potential of the conductive film 220 (in other words, the potential of the capacitor line 115) can be raised in accordance with the shift amount of the threshold voltage of the capacitor 205 in the negative direction, from the lowest potential of the pixel electrode 221b. Therefore, in the case where the threshold voltage of the capacitor 205 is a larger negative value, the potential of the capacitor line 115 can be higher than the potential of the pixel electrode 221b.

When the conductive film 220 serving as one electrode of the capacitor 205 is n-type and has high conductivity as in this embodiment, the threshold voltage can be shifted in the negative direction, so that the range of the potential needed for operating the capacitor 205 can be made large as compared with the case of the capacitor 105 in Embodiment 1. Thus, this embodiment is preferable because the capacitor 205 can be constantly operated with stability in an operation period of the capacitor 205.

Further, since the conductive film 220 included in the capacitor 205 is n-type and has high conductivity, enough charge capacity can be obtained even when the plane area of the capacitor 205 is reduced. An oxide semiconductor included in the conductive film 220 transmits 80% to 90% of visible light; thus, when the area of the conductive film 220 is reduced and a region where the conductive film 220 is not formed is provided in the pixel, the transmissivity with respect to light emitted from a light source such as a backlight can be increased.

<Method for Manufacturing Semiconductor Device>

Next, a method for forming an element portion over the substrate 102 described in this embodiment is described with reference to FIGS. 8A and 8B and FIGS. 9A and 9B.

First, the scan line 107, the capacitor line 115, and the gate electrode 627 are formed over the substrate 102. An insulating film 226 which is to be processed into the gate insulating film 227 is formed over the substrate 102, the scan line 107, the capacitor line 115, and the gate electrode 627. The semiconductor film 111, the semiconductor film 119, and the semiconductor film 628 are formed over the insulating film. The signal line 109 including the source electrode of the transistor 103, the conductive film 113 including the drain electrode of the transistor 103, and the conductive film 125 electrically connecting the conductive film 220 and the capacitor line 115 later are formed over the insulating film 226. The source electrode 629 and the drain electrode 639 are formed at the same time as the conductive film 125. After that, an insulating film 228 is formed over the semiconductor film 111, the semiconductor film 119 (to be the conductive film 220), the semiconductor film 628, the signal line 109, the conductive film 113, the conductive film 125, the source electrode 629, the drain electrode 639, and the insulating film 226; and an insulating film 230 is formed over the insulating film 228 (see FIG. 8A). Embodiment 1 can be referred to for the above steps.

Next, a mask is formed over a region of the insulating film 230 which overlaps with at least the semiconductor film 119, and the insulating film 228 and the insulating film 230 are processed using the mask to expose the semiconductor film 119 (see FIG. 8B). As the mask, a resist mask formed through a photolithography process can be used, and the processing can be performed by one or both of dry etching and wet etching.

Figure 9A:
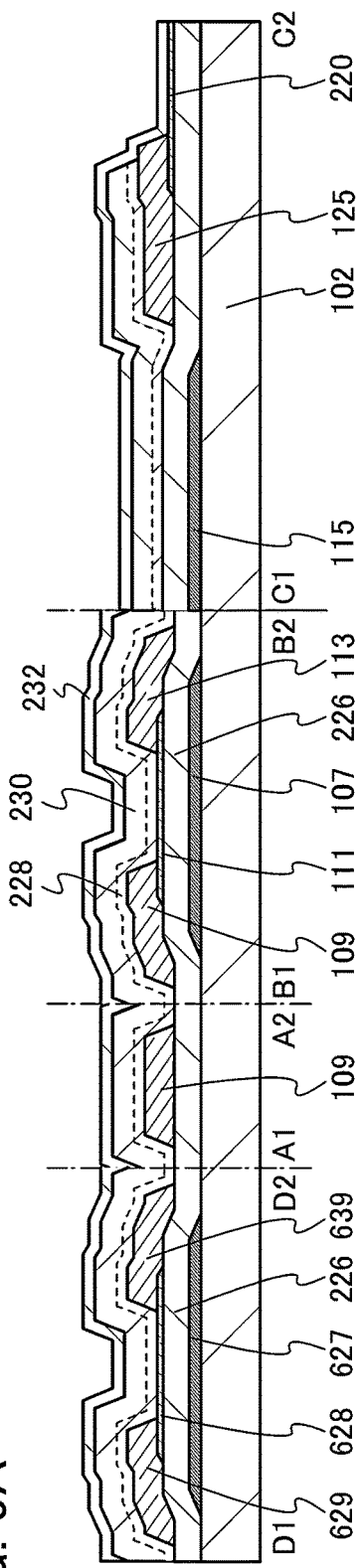
FIGS. 9A and 9B are cross-sectional views illustrating a method for manufacturing a semiconductor device of one embodiment of the present invention.

Next, an insulating film 232 is formed over the exposed region of the semiconductor film 119 and over the insulating film 230 (see FIG. 9A). The insulating film 232 is similar to the insulating film 132 described in Embodiment 1. Note that heat treatment may be performed while the insulating film 232 is in contact with the semiconductor film 119, for example, after the formation of the insulating film 232. The above steps can also be performed with reference to Embodiment 1.

The insulating film 232 is preferably a nitride insulating film similarly to the insulating film 132 in Embodiment 1. The insulating film 232 is in contact with the semiconductor film 119, so that hydrogen and/or nitrogen contained in the nitride insulating film can be transferred to the semiconductor film 119. Accordingly, the semiconductor film 119 can be an n-type semiconductor film; as a result, the conductive film 220 with increased conductivity can be formed.

Note that both the oxide semiconductor film and the light-transmitting conductive film are oxide semiconductor films which contain In or Ga and have different impurity concentrations. Specifically, the impurity concentration of the light-transmitting conductive film is higher than that of the oxide semiconductor film. For example, the concentration of hydrogen contained in the oxide semiconductor film is lower than $5 \times 10^{19}$ atoms/cm$^3$, preferably lower than $5 \times 10^{18}$ atoms/cm$^3$, more preferably lower than or equal to $1 \times 10^{18}$ atoms/cm$^3$, further preferably lower than or equal to $5 \times 10^{17}$ atoms/cm$^3$, still further preferably lower than or equal to $1 \times 10^{16}$ atoms/cm$^3$. The concentration of hydrogen contained in the light-transmitting conductive film is higher than or equal to $8 \times 10^{19}$ atoms/cm$^3$, preferably higher than or equal to $1 \times 10^{20}$ atoms/cm$^3$, further preferably higher than or equal to $5 \times 10^{20}$ atoms/cm$^3$. The concentration of hydrogen contained in the light-transmitting conductive film is 2 times, preferably 10 or more times that of the oxide semiconductor film.

The light-transmitting conductive film has resistivity lower than that of the oxide semiconductor film. The resistivity of the light-transmitting conductive film is preferably greater than or equal to $1 \times 10^{-8}$ times and less than or equal to $1 \times 10^{-1}$ times the resistivity of the oxide semiconductor film. The resistivity of the light-transmitting conductive film is typically greater than or equal to $1 \times 10^{-3}$ Ωcm and less than $1 \times 10^4$ Ωcm, preferably greater than or equal to $1 \times 10^{-3}$ Ωcm and less than $1 \times 10^{-1}$ Ωcm.

Figure 9B:
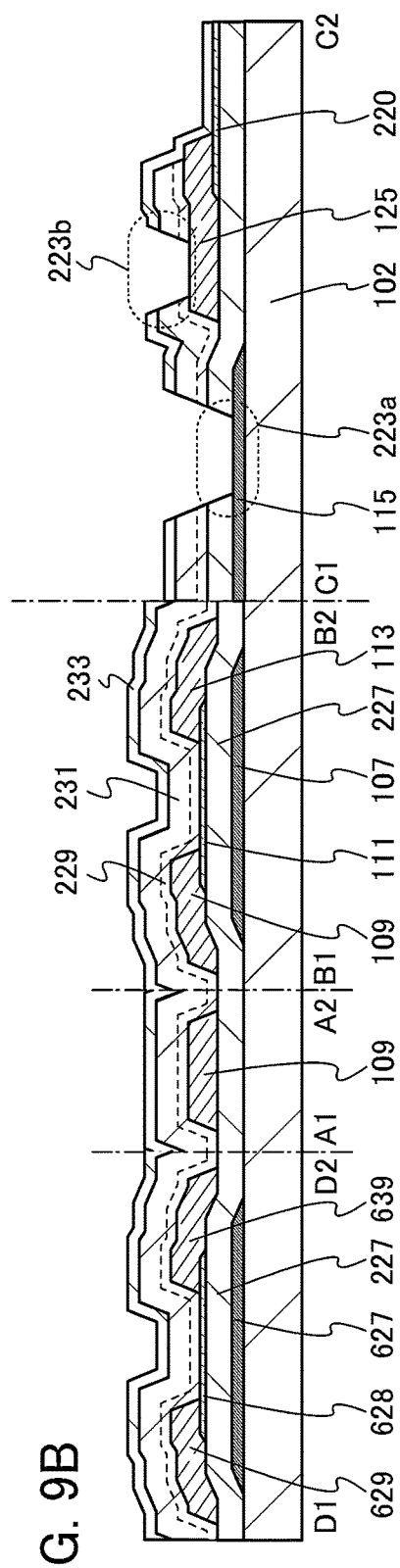

Next, the opening 223a reaching the capacitor line 115 is formed in a region in the insulating films 226, 228, 230, and 232 which overlaps with the capacitor line 115; the opening 223b reaching the conductive film 125 is formed in a region in the insulating films 228, 230, and 232 which overlaps with the conductive film 125, and the gate insulating film 227 and the insulating films 229, 231, and 233 are formed (see FIG. 9B).

The opening 223a can be formed in such a manner that a mask is formed and the insulating films 226, 228, 230, and 232 are processed using the mask so that the region in the insulating films 226, 228, 230, and 232 which overlaps with the capacitor line 115 is partly exposed. The opening 223b can be formed in such a manner that a mask is formed and the insulating films 228, 230, and 232 are processed using the mask so that the region in the insulating films 228, 230, and 232 which overlaps with the conductive film 125 is partly exposed. At the same time, the opening 117 (see FIG. 6) reaching the conductive film 113 is formed in a region in the insulating films 228, 230, and 232 which overlaps with the conductive film 113. The opening 117 (see FIG. 6) can be formed in a manner similar to those of the openings 223a and 223b. Note that the formation of the mask and the processing can be performed in manners similar to those of the scan line 107, the capacitor line 115, and the gate electrode 627.

In a conventional method, an opening reaching a capacitor line and an opening reaching a conductive film (a drain electrode) are separately formed and a mask is formed for the formation of each opening. In contrast, in the structure described in this embodiment, even after the insulating films 228, 230, and 232 are etched to form the opening 223b reaching the conductive film 125 and the opening 117 reaching the conductive film 113, the conductive film 125 and the conductive film 113, which are metals, are not etched. Meanwhile, the insulating film 226 over the capacitor line 115 is etched to form the opening 223a reaching the capacitor line 115. In other words, the opening 223a reaching the capacitor line 115, the opening 223b reaching the conductive film 125, and the opening 117 reaching the conductive film 113 can be formed using the same mask, which results in a reduction in the number of masks used in the manufacturing process and a reduction in manufacturing costs.

Since the conductive film 220 is connected to the electrode 221a which is formed later through the conductive film 125, the conductive film 125 also functions as an etching protective film for the conductive film 220 in the opening 223b. Thus, the conductive film 220 can be prevented from being etched in the formation of the opening 223a after the formation of the openings 223b and 117. As a result, yield can be increased.

Lastly, the electrode 221a, the pixel electrode 221b, and the conductive film 641 are formed, so that the element portion over the substrate 102 can be formed (see FIG. 7). The above steps can also be performed with reference to Embodiment 1.

Through the above steps, the semiconductor device of this embodiment can be manufactured.

Modification Example

In the semiconductor device of one embodiment of the present invention, the structure of the capacitor can be changed as appropriate. A specific example of the structure is described with reference to FIG. 10. Here, only a capacitor 245 which is different from the capacitor 205 described with reference to FIG. 6 and FIG. 7 is described.

In order that the semiconductor film 119 be n-type and have higher conductivity, a gate insulating film 227 has a layered structure of an insulating film 225 formed of a nitride insulating film and an insulating film 226 formed of an oxide insulating film and only the insulating film 225 which is a nitride insulating film is provided in a region where at least the semiconductor film 119 is provided. With such a structure, the nitride insulating film which is the insulating film 225 is in contact with the bottom surface of the semiconductor film 119, so that the semiconductor film 119 can be n-type; as a result, the conductive film 220 with increased conductivity can be formed. In this case, a dielectric film of the capacitor 245 includes the insulating films 129, 131, and 133. As the insulating films 225 and 226, the insulating films which can be used as the gate insulating film 227 can be used as appropriate, and the insulating film 225 may be formed using an insulating film similar to the insulating film 133. Further, in order to obtain this structure, the insulating film 226 is processed as appropriate with reference to Embodiment 1. When the structure illustrated in FIG. 10 is employed, a step of etching the insulating films 129 and 131 is not performed, which can prevent a reduction in the thickness of the semiconductor film 119; thus, the yield is increased as compared with those of the semiconductor devices illustrated in FIG. 6 and FIG. 7.

Note that in the structure illustrated in FIG. 10, the top surface of the conductive film 220 may be in contact with the insulating film 133. That is, regions of the insulating films 129 and 131 illustrated in FIG. 10 which are in contact with the conductive film 220 may be removed. In that case, a dielectric film of the capacitor 245 is the insulating film 133. When the top and bottom surfaces of the conductive film 220 are in contact with the nitride insulating film, the semiconductor film can be n-type more efficiently and sufficiently than the conductive film 220 only one of the surfaces of which is in contact with the nitride insulating film, and the conductivity can be increased.

Note that both the oxide semiconductor film and the light-transmitting conductive film are oxide semiconductor films which contain In or Ga and have different impurity concentrations. Specifically, the impurity concentration of the light-transmitting conductive film is higher than that of the oxide semiconductor film. For example, the concentration of hydrogen contained in the oxide semiconductor film is lower than $5\times10^{19}$ atoms/cm$^3$, preferably lower than $5\times10^{18}$ atoms/cm$^3$, more preferably lower than or equal to $1\times10^{18}$ atoms/cm$^3$, further preferably lower than or equal to $5\times10^{17}$ atoms/cm$^3$, still further preferably lower than or equal to $1\times10^{16}$ atoms/cm$^3$. The concentration of hydrogen contained in the light-transmitting conductive film is higher than or equal to $8\times10^{19}$ atoms/cm$^3$, preferably higher than or equal to $1\times10^{20}$ atoms/cm$^3$, further preferably higher than or equal to $5\times10^{20}$ atoms/cm$^3$. The concentration of hydrogen contained in the light-transmitting conductive film is 2 times, preferably 10 or more times that of the oxide semiconductor film.

As described above, the use of the semiconductor film formed through the same formation step as the semiconductor film included in the transistor, for one electrode of the capacitor, allows manufacture of a semiconductor device including the capacitor whose charge capacity is increased while improving the aperture ratio to typically 55% or more, preferably 60% or more. As a result, the semiconductor device can have excellent display quality.

Further, oxygen vacancies and impurities such as hydrogen in the oxide semiconductor film, which is a semiconductor film included in the transistor, are reduced, so that the semiconductor device of one embodiment of the present invention has favorable electrical characteristics.

Note that the structure and the like described in this embodiment can be combined as appropriate with any of the structures and the modification examples in the other embodiments.

Embodiment 3

In this embodiment, one embodiment applicable to an oxide semiconductor film, which is a semiconductor film, in the transistor and the capacitor included in the semiconductor device described in the above embodiment is described.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (ϕ scan) is performed under conditions where the sample is rotated around a normal vector of a sample surface as an axis (ϕ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when ϕ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depends on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

With the use of the CAAC-OS film in a transistor, change in electric characteristics of the transistor due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly also includes the case where the angle is greater than or equal to 85° and less than or equal to 95°.

In this specification, the trigonal and rhombohedral crystal systems are included in the hexagonal crystal system.

Further, it is preferable that the CAAC-OS film be deposited by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In this case, the flat-plate-like sputtered particle or the pellet-like sputtered particle reaches a surface where the CAAC-OS film is to be deposited while maintaining its crystal state, whereby the CAAC-OS film can be deposited.

The flat-plate-like sputtered particle has, for example, a diameter of a circle corresponding to a plane that is parallel to an a-b plane greater than or equal to 3 nm and less than or equal to 10 nm and a thickness (length in the direction perpendicular to the a-b plane) greater than or equal to 0.7 nm and less than 1 nm. Note that in the flat-plate-like sputtered particle, the plane parallel to the a-b plane may be a regular triangle or a regular hexagon. Here, the term "equivalent circle diameter on a plane" refers to the diameter of a perfect circle having the same area as the plane.

For the deposition of the CAAC-OS film, the following conditions are preferably used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate, so that a flat plane of the sputtered particle is attached to the substrate. At this time, the sputtered particle is charged positively, whereby sputtered particles are attached to the substrate while repelling each other; thus, the sputtered particles do not overlap with each other randomly, and a CAAC-OS film with a uniform thickness can be deposited.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas with a dew point of −80° C. or lower, preferably −100° C. or lower, more preferably −120° C. or lower is used.

In the case where the film is formed by sputtering, moisture remaining in the deposition chamber for forming the film can be removed by an entrapment vacuum pump or the like. As the entrapment vacuum pump, a cryopump, an ion pump, or a titanium sublimation pump can be used, for example. Alternatively, moisture remaining in the deposition chamber can be removed by a turbo molecular pump provided with a cold trap. With the use of the above vacuum pump, counter flow of exhaust including impurities can be reduced.

In the case where the film is formed by a sputtering method, a target containing indium is preferably used in order not to increase the number of particles. Moreover, it is preferable to use an oxide target in which the proportion of gallium is relatively small. Particularly in the case where a target containing indium is used, the conductivity of the target can be increased and DC discharge is facilitated; therefore, film formation over a large-sized substrate can be easily performed. Thus, semiconductor devices can be manufactured with improved productivity.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

After the CAAC-OS film is deposited, heat treatment may be performed. The temperature of the heat treatment is higher than or equal to 100° C. and lower than or equal to 740° C., preferably higher than or equal to 200° C. and lower than or equal to 500° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the CAAC-OS film for a short time. At the same time, the heat treatment in an inert atmosphere might generate oxygen vacancies in the CAAC-OS film. In this case, the heat treatment in an oxidation atmosphere can reduce the oxygen vacancies. The heat treatment can further increase the crystallinity of the CAAC-OS film. Note that the heat treatment may be performed under a reduced pressure, such as 1000 Pa or lower, 100 Pa or lower, 10 Pa or lower, or 1 Pa or lower. The heat treatment under the reduced atmosphere can reduce the concentration of impurities in the CAAC-OS film for a shorter time.

As an example of the sputtering target, an In—Ga—Zn—O compound target is described below.

The In—Ga—Zn-based metal oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. This pressure treatment may be performed while cooling is performed or may be performed while heating is performed. Note that X, Y, and Z are each a given positive number. Here, the predetermined molar ratio of $InO_X$ powder to $GaO_Y$ powder and $ZnO_Z$ powder ($InO_X$: $GaO_Y$: $ZnO_Z$) is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Here, Table 1 shows comparison between oxide semiconductors (represented by OS) having crystal structures and silicon semiconductors (represented by Si) having crystal structures. Note that an In—Ga—Zn-based oxide is used for the oxide semiconductor.

TABLE 1

|   |   | Amorphous | Microcrystal | Polycrystal | Continuous crystal | Single crystal |
|---|---|---|---|---|---|---|
| OS |   | a-OS<br>a-OS: H | nc-OS<br>μc-OS | Polycrystalline OS | CAAC-OS | Single crystal OS |
|   | Nanobeam electron diffraction | Halo | Ring + Spot | Spot | Spot | Spot |
|   | Crystal part | — | nm-μm | Discontinuous | Continuously connected | — |
|   | DOS | High | Slightly low | — | Low | Extremely low |
| Si | Density | Low<br>a-Si<br>a-Si: H | Medium<br>nc-Si<br>μc-Si | —<br>Polycrystalline Si | High<br>CG silicon | —<br>Single crystal Si |

As shown in Table 1, examples of oxide semiconductors having crystal structures include an amorphous oxide semiconductor (a-OS and a-OS:H), a microcrystalline oxide semiconductor (nc-OS and μc-OS), a polycrystalline oxide semiconductor (polycrystalline OS), a continuous crystal oxide semiconductor (CAAC-OS), and a single crystal oxide semiconductor (single crystal OS). Note that examples of the crystal state of silicon include, as shown in Table 1, amorphous silicon (a-Si and a-Si:H), microcrystalline silicon (nc-Si and μc-Si), polycrystalline silicon (polycrystalline Si), continuous crystal silicon (continuous grain (CG) silicon), and single crystal silicon (single crystal Si).

When the oxide semiconductors in the above crystal states are subjected to electron diffraction (nanobeam electron diffraction) using an electron beam whose diameter is reduced to less than or equal to 10 nmφ, the following electron diffraction patterns (nanobeam electron diffraction patterns) can be observed. A halo pattern (also referred to as a halo ring or a halo) is observed in the amorphous oxide semiconductor. Spots and/or a ring pattern are/is observed in the microcrystalline oxide semiconductor. Spots are observed in the polycrystalline oxide semiconductor. Spots are observed in the continuous crystal oxide semiconductor. Spots are observed in the single crystal oxide semiconductor.

According to the nanobeam electron diffraction pattern, a crystal part in the microcrystalline oxide semiconductor has a diameter of nanometers (nm) to micrometers (μm). The polycrystalline oxide semiconductor has grain boundaries between crystal parts, that is, a discontinuous boundary. No boundary is observed between crystal parts in the continuous crystal oxide semiconductor and the crystal parts are connected continuously.

The density of the oxide semiconductor in each crystal state is described. The amorphous oxide semiconductor has a low density. The microcrystalline oxide semiconductor has a medium density. The continuous crystal oxide semiconductor has a high density. That is, the density of the continuous crystal oxide semiconductor is higher than that of the microcrystalline oxide semiconductor, and the density of the microcrystalline oxide semiconductor is higher than that of the amorphous oxide semiconductor.

A feature of density of states (DOS) existing in the oxide semiconductor in each crystal state is described. The DOS of the amorphous oxide semiconductor is high. The DOS of the microcrystalline oxide semiconductor is slightly low. The DOS of the continuous crystal oxide semiconductor is low. The DOS of the single crystal oxide semiconductor is extremely low. That is, the DOS of the single crystal oxide semiconductor is lower than that of the continuous crystal oxide semiconductor, the DOS of the continuous crystal oxide semiconductor is lower than that of the microcrystalline oxide semiconductor, and the DOS of the microcrystalline oxide semiconductor is lower than that of the amorphous oxide semiconductor.

Alternatively, the CAAC-OS film is formed by a method described below.

First, a first oxide semiconductor film is formed to a thickness of greater than or equal to 1 nm and less than 10 nm. The first oxide semiconductor film is formed by a sputtering method. Specifically, the substrate temperature during the deposition is higher than or equal to 100° C. and lower than or equal to 500° C., preferably higher than or equal to 150° C. and lower than or equal to 450° C., and the proportion of oxygen in the deposition gas is higher than or equal to 30 vol. %, preferably 100 vol. %.

Next, heat treatment is performed so that the first oxide semiconductor film serves as a first CAAC-OS film with high crystallinity. The heat treatment is performed at a temperature higher than or equal to 350° C. and lower than or equal to 740° C., preferably higher than or equal to 450° C. and lower than or equal to 650° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the first oxide semiconductor film in a short time. At the same time, the heat treatment in an inert atmosphere may generate oxygen vacancies in the first oxide semiconductor film. In this case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced atmosphere can reduce the concentration of impurities in the first oxide semiconductor film for a shorter time.

The first oxide semiconductor film with a thickness of greater than or equal to 1 nm and less than 10 nm can be easily crystallized by heat treatment compared to the case where the first oxide semiconductor film has a thickness of greater than or equal to 10 nm.

Next, a second oxide semiconductor film that has the same composition as the first oxide semiconductor film is formed to a thickness of greater than or equal to 10 nm and less than or equal to 50 nm. The second oxide semiconductor film is preferably formed by a sputtering method. Specifically, the substrate temperature during the deposition is higher than or equal to 100° C. and lower than or equal to 500° C., preferably higher than or equal to 150° C. and lower than or equal to 450° C., and the proportion of oxygen in the deposition gas is higher than or equal to 30 vol. %, preferably 100 vol. %.

Next, heat treatment is performed so that solid phase growth of the second oxide semiconductor film from the first CAAC-OS film occurs, whereby the second oxide semiconductor film is turned into a second CAAC-OS film having high crystallinity. The heat treatment is performed at a temperature higher than or equal to 350° C. and lower than or equal to 740° C., preferably higher than or equal to 450° C. and lower than or equal to 650° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the second oxide semiconductor film for a short time. At the same time, the heat treatment in an inert atmosphere may generate oxygen vacancies in the second oxide semiconductor film. In this case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under a reduced pressure can reduce the concentration of impurities in the second oxide semiconductor film in a shorter time.

Further, the oxide semiconductor film may have a structure in which a plurality of oxide semiconductor films is stacked. For example, the oxide semiconductor film may have a stacked layer structure of a first oxide semiconductor film and a second oxide semiconductor film which are formed using metal oxides with different atomic ratios. For example, the first oxide semiconductor film may be formed using one of an oxide containing two kinds of metals, an oxide containing three kinds of metals, and an oxide containing four kinds of metals, and the second oxide semiconductor film may be formed using one of the above which is different from the one used for the first oxide semiconductor film.

Alternatively, the oxide semiconductor film may have a two-layer structure where the constituent elements of the first oxide semiconductor film and the second oxide semiconductor film are the same while the atomic ratios of the constituent elements of the first oxide semiconductor film and the second oxide semiconductor film are different. For example, the first oxide semiconductor film may have an atomic ratio of In:Ga:Zn=3:1:2, and the second oxide semiconductor film may have an atomic ratio of In:Ga:Zn=1:1:1. Alternatively, the first oxide semiconductor film may contain In, Ga, and Zn at an atomic ratio of 2:1:3, and the second oxide semiconductor film may contain In, Ga, and Zn at an atomic ratio of 1:3:2. Note that a proportion of each atom in the atomic ratio of the oxide semiconductor varies within a range of ±20% as an error.

In this case, in one of the first oxide semiconductor film and the second oxide semiconductor film, which is closer to the gate electrode (the oxide semiconductor film on the channel side), the atomic ratio of In to Ga is preferably as follows: In≥Ga. In the other oxide semiconductor film, which is farther from the gate electrode (on the back channel side), the atomic ratio of In to Ga preferably satisfies the relation In<Ga. With a layered structure of these oxide semiconductor films, a transistor having high field-effect mobility can be formed. On the other hand, the atomic ratio of In to Ga in the oxide semiconductor film closer to the gate electrode (the oxide semiconductor film on the channel side) satisfies the relation In<Ga and the atomic ratio of In to Ga in the oxide semiconductor film on the back channel side satisfies the relation In≥Ga, whereby a variation in threshold voltage of a transistor due to a change over time or a reliability test can be reduced.

The first oxide semiconductor film containing In, Ga, and Zn at an atomic ratio of 1:3:2 can be formed by a sputtering method using an oxide target with an atomic ratio of 1:3:2 under the conditions where the substrate temperature is room temperature and a sputtering gas is argon or a mixed gas of argon and oxygen. The second oxide semiconductor film containing In, Ga, and Zn at an atomic ratio of 3:1:2 can be formed by a sputtering method using an oxide target with an atomic ratio of 3:1:2 in a manner similar to that of the first oxide semiconductor film.

In order to achieve stable electrical characteristics of a transistor in which a channel is formed in an oxide semiconductor film, for example, it is effective to reduce the concentration of impurities in the oxide semiconductor film in which the channel is formed in a multilayer film including the oxide semiconductor film so that the oxide semiconductor film is highly purified to be intrinsic. The expression "the oxide semiconductor film is highly purified to be intrinsic" means that the concentration of impurities in the oxide semiconductor film is reduced so that the oxide semiconductor film is intrinsic or substantially intrinsic. The term "substantially intrinsic" refers to the state where an oxide semiconductor film has a carrier density lower than $1\times10^{17}/\text{cm}^3$, preferably lower than $1\times10^{15}/\text{cm}^3$, further preferably lower than $1\times10^{13}/\text{cm}^3$. In the oxide semiconductor film, hydrogen, nitrogen, carbon, silicon, and metal elements other than the main components are impurities. In order to reduce the concentration of impurities in the oxide semiconductor film, the concentration of impurities in a film which is adjacent to the oxide semiconductor film is preferably reduced.

For example, silicon forms an impurity level in an oxide semiconductor film. In some cases, the impurity level serves as a trap to deteriorate electrical characteristics of a transistor. Specifically, the concentration of silicon in the oxide semiconductor film is set to lower than $1\times10^{19}$ atoms/cm$^3$, preferably lower than $5\times10^{18}$ atoms/cm$^3$, further preferably lower than $1\times10^{18}$ atoms/cm$^3$. Note that since an insulating film containing silicon, such as a silicon oxide film, a silicon oxynitride film, a silicon nitride film, or a silicon nitride oxide film is used for a gate insulating film of a transistor in many cases, a channel is preferably formed in a layer of the oxide semiconductor film which is not in contact with the gate insulating film.

Further, in an oxide semiconductor film, hydrogen and nitrogen form donor levels, which increase carrier density.

In the case where a channel is formed at an interface between a gate insulating film and an oxide semiconductor film, interface scattering occurs at the interface, so that the field-effect mobility of a transistor is reduced. In view of the above, the channel of the transistor is preferably formed in a layer of an oxide semiconductor film which is not in contact with a gate insulating film.

In order that a channel of a transistor is separate from a gate insulating film, for example, a multilayer film including an oxide semiconductor film may be formed. For example, the multilayer film has a stacked structure of a first oxide film, an oxide semiconductor film, and a second oxide film. The first oxide film, the oxide semiconductor film, and the second oxide film may have the same constituent elements and different atomic ratios, whereby the oxide semiconductor film serving as the channel of the transistor can be separate from the gate insulating film.

In the capacitor, carriers are induced in at least a layer formed in the same layer as the oxide semiconductor film by an electric field applied from the pixel electrode; thus, the layer functions as part of the electrode. Further, a layer formed in the same layer as the first oxide film and a layer formed in the same layer as the second oxide film each have sufficiently high carrier density as compared to an insulating film such as the gate insulating film; thus, these layers each also function as part of the electrode.

Here, the structure of the multilayer film including the oxide semiconductor film is described with reference to FIG. 11.

Figure 11:
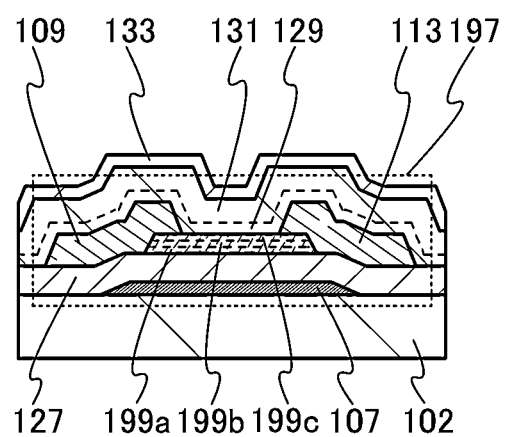
FIG. 11 is a cross-sectional view illustrating a semiconductor device of one embodiment of the present invention.

In a transistor illustrated in FIG. 11, a first oxide film 199a, an oxide semiconductor film 199b, and a second oxide film 199c are stacked in this order from the gate insulating film 127 side.

As a material for the first oxide film 199a and the second oxide film 199c, a material represented by InM$_{1x}$Zn$_y$O$_z$ (x≥1, y>1, z>0, M$_1$=Ga, Hf, or the like) is used. Note that in the case where a material for the first oxide film 199a and the second oxide film 199c contains Ga, a material containing a large proportion of Ga, specifically, a material which can be represented by 1 nM$_{1x}$Zn$_y$O$_z$ where x is larger than 10 is unsuitable because powder might be generated in deposition.

As a material for the oxide semiconductor film 199b, a material which can be represented by 1 nM$_{2x}$Zn$_y$O$_z$ (x≥1, y≥x, z>0, M$_2$=Ga, Sn, or the like) is used.

Materials for the first oxide film 199a, the oxide semiconductor film 199b, and the second oxide film 199c are selected as appropriate so that a well structure is formed in which the bottom of the conduction band of the oxide semiconductor film 199b is deeper from the vacuum level than the bottom of the conduction bands of the first oxide film 199a and the second oxide film 199c are.

Note that the first oxide film 199a, the oxide semiconductor film 199b, and the second oxide film 199c can also be referred to as a U-shaped well in which the energy of the bottom of the conduction band continuously changes.

When silicon or carbon which is one of the Group 14 elements diffuses in the oxide semiconductor film, the number of oxygen vacancies is increased. Therefore, silicon or carbon contained in an oxide semiconductor film makes the oxide semiconductor film n-type. It is particularly preferable to employ a structure in which the oxide semiconductor film 199b serving as a carrier path is sandwiched or surrounded by the first oxide film 199a and the second oxide film 199c so that a large number of Group 14 elements do not enter the oxide semiconductor film 199b. That is, the first oxide film 199a and the second oxide film 199c can also be called barrier films which prevent Group 14 elements such as silicon and carbon from entering the oxide semiconductor film 199b.

In the first oxide film 199a, the oxide semiconductor film 199b, and the second oxide film 199c, oxygen moves between the layers, so that oxygen vacancies in the oxide semiconductor film serving as a channel can be reduced.

For example, the atomic ratio of In to Ga and Zn in the first oxide film 199a may be 1:3:2, 1:3:4, 1:6:2, or 1:6:10; the atomic ratio of In to Ga and Zn in the oxide semiconductor film 199b may be 3:1:2; and the atomic ratio of In to Ga and Zn in the second oxide film 199c may be 1:1:1. Note that the second oxide film 199c can be formed by a sputtering method using an oxide target containing In, Ga, and Zn at an atomic ratio of 1:1:1.

Alternatively, a three-layer structure may be employed in which the first oxide film 199a contains In, Ga, and Zn at an atomic ratio of 1:3:2, 1:3:4, 1:6:2, or 1:6:10, the oxide semiconductor film 199b contains In, Ga, and Zn at an atomic ratio of 1:1:1 or 1:3:2, and the second oxide film 199c contains In, Ga, and Zn at an atomic ratio of 1:3:2, 1:3:4, 1:6:2, or 1:6:10.

Since the constituent elements of the first oxide film 199a, the oxide semiconductor film 199b, and the second oxide film 199c are the same, the oxide semiconductor film 199b has few defect states (trap states) at the interface with the first oxide film 199a. Specifically, the defect states (trap states) are fewer than those at the interface between the gate insulating film 127 and the first oxide film 199a. For this reason, when the above-described multilayer film is employed, the amount of change of the threshold voltage of a transistor due to change over time or a reliability test can be reduced.

Further, when materials for the first oxide film 199a, the oxide semiconductor film 199b, and the second oxide film 199c are selected as appropriate so that a well structure is formed in which the bottom of the conduction band of the oxide semiconductor film 199b is shallower from the vacuum level than the bottom of the conduction bands of the first oxide film 199a and the second oxide film 199c are, the field-effect mobility of the transistor can be increased and the amount of change of the threshold voltage of the transistor due to change over time or a reliability test can be reduced.

The first oxide film 199a, the oxide semiconductor film 199b, and the second oxide film 199c may be formed using oxide semiconductors having different crystallinities. That is, a single crystal oxide semiconductor, a polycrystalline oxide semiconductor, an amorphous oxide semiconductor, and a CAAC-OS may be combined as appropriate. When an amorphous oxide semiconductor is used as any one of the first oxide film 199a, the oxide semiconductor film 199b, and the second oxide film 199c, internal stress or external stress of the oxide semiconductor film is relieved, variations in characteristics of the transistor are reduced, and the amount of change of the threshold voltage of the transistor due to a change over time or a reliability test can be reduced.

At least the oxide semiconductor film 199b, which can serve as a channel, is preferably a CAAC-OS film. An oxide semiconductor film on the back channel side, in this embodiment, the second oxide film 199c is preferably an amorphous oxide semiconductor film or a CAAC-OS film. With such a structure, the amount of change of the threshold voltage of a transistor due to change over time or a reliability test can be reduced.

Here, the density of localized states of the oxide semiconductor film is described. Here, the result of the density of localized states of the oxide semiconductor film measured by a constant photocurrent method (CPM) is described.

First, the structures of measurement samples are described.

The measurement samples each include an oxide semiconductor film provided over a glass substrate, a pair of electrodes in contact with the oxide semiconductor film, and an insulating film covering the oxide semiconductor film and the pair of electrodes.

Next, a method of forming the oxide semiconductor film included in each measurement sample is described.

A first oxide semiconductor film was formed by a sputtering method under the following conditions: an In—Ga—Zn-oxide (In:Ga:Zn=1:1:1 [atomic ratio]) target was used, an argon gas with a flow rate of 30 sccm and an oxygen gas with a flow rate of 15 sccm were used as a deposition gas, the pressure was 0.4 Pa, the substrate temperature was room temperature, and a DC power of 0.5 kw was applied. Note that the first oxide semiconductor film is a microcrystal oxide semiconductor film.

The first oxide semiconductor film was heated at 450° C. in a nitrogen atmosphere for one hour and then heated at 450° C. in an oxygen atmosphere for one hour, whereby hydrogen contained in the first oxide semiconductor film was released and oxygen was supplied to the first oxide semiconductor film to form a second oxide semiconductor film. Note that the second oxide semiconductor film is a microcrystalline oxide semiconductor film.

Next, CPM measurement was performed on the measurement sample including the first oxide semiconductor film and the measurement sample including the second oxide semiconductor film. Specifically, the amount of light with which a surface of each measurement sample between terminals is irradiated is adjusted so that a photocurrent value is kept constant while voltage is applied between the pair of electrodes provided in contact with the oxide semiconductor film, and then an absorption coefficient was derived from the amount of irradiation light in an intended wavelength range.

Figure 31A:
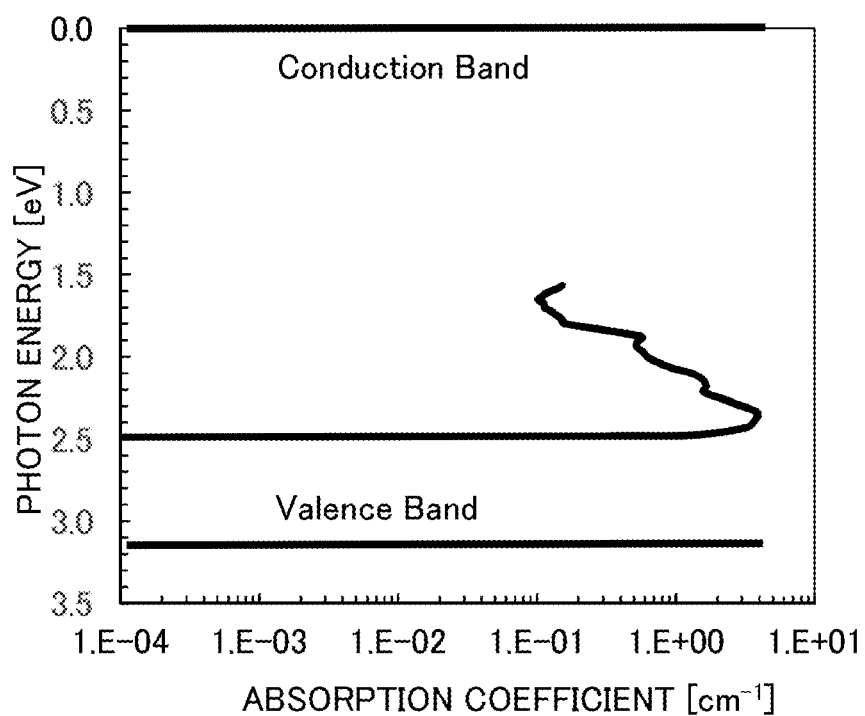
FIGS. 31A and 31B each show results of CPM measurement of an oxide semiconductor film.
Figure 31B:
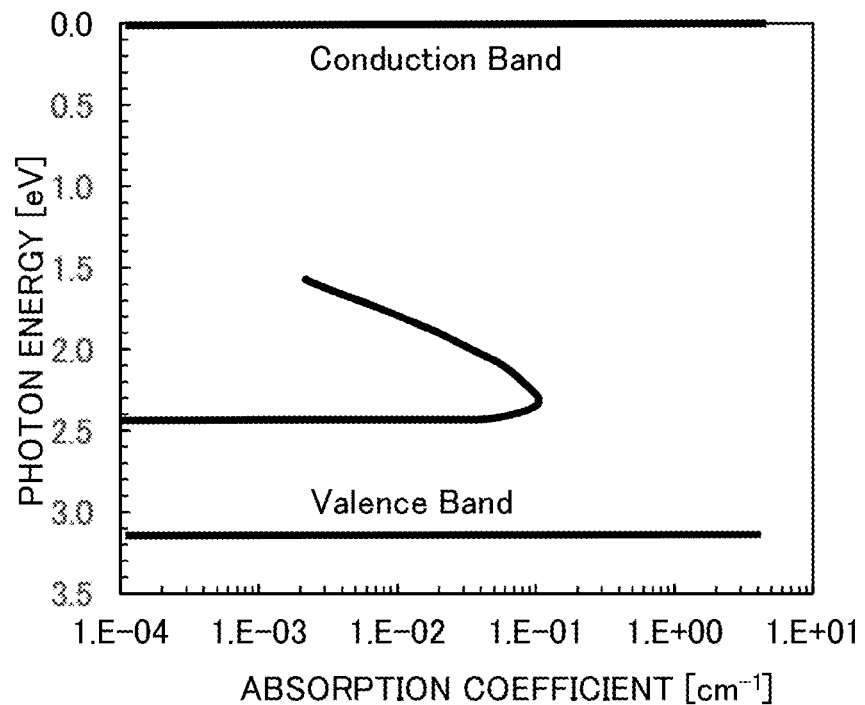

FIGS. 31A and 31B show absorption coefficients each obtained by removing an absorption coefficient due to the band tail from the absorption coefficient obtained by the CPM measurement performed on each sample, that is, absorption coefficients due to defects. In each of FIGS. 31A and 31B, the horizontal axis represents the absorption coefficient and the vertical axis represents the photon energy. On the vertical axis in each of FIGS. 31A and 31B, the bottom of the conduction band and the top of the valence band of the oxide semiconductor film are 0 eV and 3.15 eV, respectively. Curves in FIGS. 31A and 31B each represent the relation between the absorption coefficient and the photon energy, which corresponds to defect levels.

FIG. 31A shows measurement results of the measurement sample including the first oxide semiconductor film. The absorption coefficient due to the defect states of the sample was $5.28 \times 10^{-1}$ cm$^{-1}$. FIG. 31B shows measurement results of the measurement sample including the second oxide semiconductor film. The absorption coefficient due to the defect states of the sample was $1.75 \times 10^{-2}$ cm$^{-1}$.

Thus, the heat treatment can reduce defects included in the oxide semiconductor film.

Note that the film density of each of the first oxide semiconductor film and the second oxide semiconductor film was measured by X-ray reflectometry (XRR). The film densities of the first oxide semiconductor film and the second oxide semiconductor film were 5.9 g/cm$^3$ and 6.1 g/cm$^3$, respectively.

Thus, the heat treatment can increase the film density of the oxide semiconductor film.

That is, the above reveals that when the film density of the oxide semiconductor film is higher, the oxide semiconductor film has fewer defects.

Here, the density of localized states of the oxide semiconductor film is described. Here, the result of the density of localized states the oxide semiconductor film measured by a constant photocurrent method (CPM) is described.

First, a structure of a measurement sample on which CPM measurement was performed is described.

The measurement sample includes an oxide semiconductor film provided over a glass substrate, a pair of electrodes in contact with the oxide semiconductor film, and an insulating film covering the oxide semiconductor film and the pair of electrodes.

Next, a method of forming the oxide semiconductor film included in the measurement sample is described.

An oxide semiconductor film was formed by a sputtering method under the following conditions: an In—Ga—Zn-oxide (In:Ga:Zn=1:1:1 [atomic ratio]) target was used, an argon gas with a flow rate of 30 sccm and an oxygen gas with a flow rate of 15 sccm were used as a deposition gas, the pressure was 0.4 Pa, the substrate temperature was 400° C., and a DC power of 0.5 kw was applied. Next, the oxide semiconductor film was heated at 450° C. in a nitrogen atmosphere for one hour and then heated at 450° C. in an oxygen atmosphere for one hour, whereby hydrogen contained in the oxide semiconductor film was released and oxygen was supplied to the oxide semiconductor film. Note that the oxide semiconductor film is a CAAC-OS film.

Next, CPM measurement was performed on the measurement sample including the oxide semiconductor film. Specifically, the amount of light with which a surface of the sample is irradiated is adjusted so that a photocurrent value is kept constant while voltage is applied between the pair of electrodes provided in contact with the oxide semiconductor film, and then an absorption coefficient was derived from the amount of irradiation light in an intended wavelength range.

Figure 32:
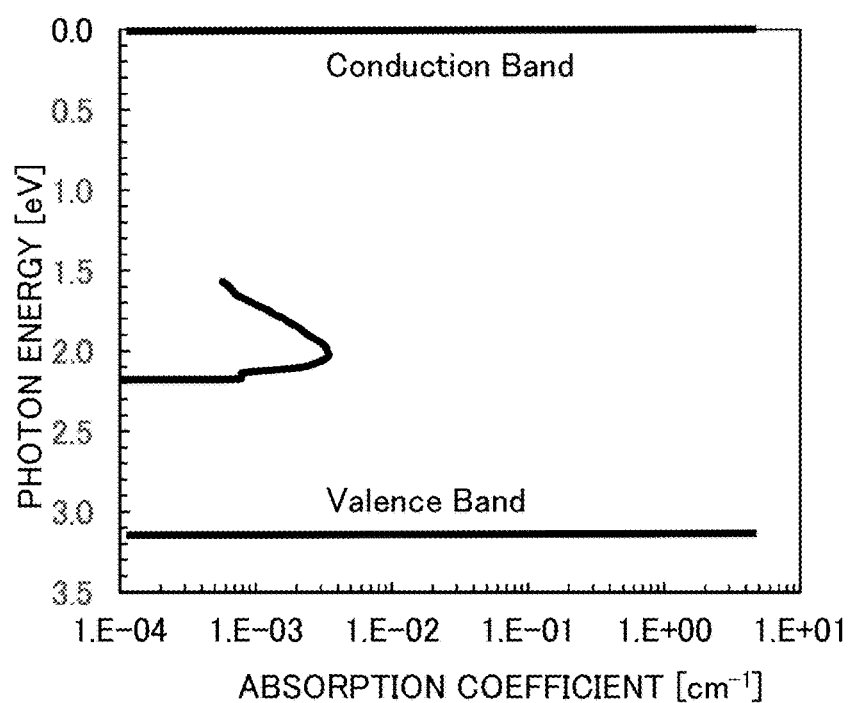
FIG. 32 shows results of CPM measurement of an oxide semiconductor film.

An absorption coefficient shown in FIG. 32 was obtained by removing an absorption coefficient due to the band tail from the absorption coefficient obtained by the CPM measurement performed on the sample. That is, an absorption coefficient due to defects is shown in FIG. 32. In FIG. 32, the horizontal axis represents the absorption coefficient and the vertical axis represents the photon energy. On the vertical axis in FIG. 32, the bottom of the conduction band and the top of the valence band of the oxide semiconductor film are 0 eV and 3.15 eV, respectively. A curve in FIG. 32 represents the relation between the absorption coefficient and the photon energy, which corresponds to defect levels.

According to the curve shown in FIG. 32, the absorption coefficient due to defect states was $5.86 \times 10^{-4}$ cm$^{-1}$. That is, the CAAC-OS film has an absorption coefficient due to defect states lower than $1 \times 10^{-3}$ cm$^{-1}$, preferably lower than $1 \times 10^{-4}$ cm$^{1}$, and has a low density of defect states.

Note that the film density of the oxide semiconductor film was measured by X-ray reflectometry (XRR). The film density of the oxide semiconductor film was 6.3 g/cm$^3$. That is, the CAAC-OS film has a high film density.

Note that the structures and the like described in this embodiment can be combined as appropriate with any of the structures and the like described in the other embodiments.

Embodiment 4

In this embodiment, a model of crystal growth of a CAAC-OS film which can be used for any of the transistors described in the above embodiments is described with reference to FIGS. 17A and 17B, FIGS. 18A to 18C, and FIGS. 19A and 19B.

Figure 17A:
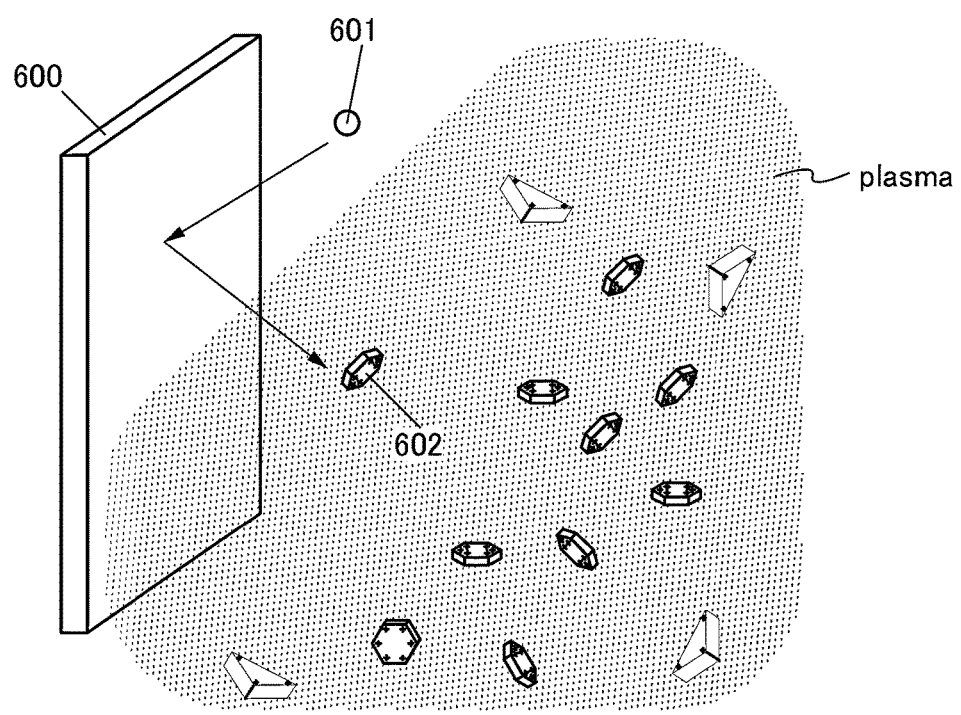
FIGS. 17A and 17B are schematic views illustrating sputtered particles separated from a sputtering target.
Figure 17B:
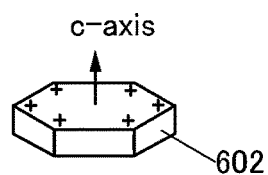

FIG. 17A is a schematic diagram showing how an ion 601 collides with a sputtering target 600 and a sputtered particle 602 is separated. Note that the sputtered particle 602 may have a hexagonal cylinder shape whose hexagonal plane is parallel to the a-b plane or a triangular prism shape. In such a case, a direction perpendicular to the hexagonal plane or the triangular plane is a c-axis direction (see FIG. 17B). The diameter (equivalent circle diameter) of the plane parallel to the a-b plane of the sputtered particle 602, although depending on the kind of oxide, is approximately greater than or equal to 1 nm and less than or equal to 30 nm or greater than or equal to 1 nm and less than or equal to 10 nm. Note that an oxygen cation is used as the ion 601. Further, in addition to the oxygen cation, an argon cation may be used. Instead of the argon cation, a cation of another rare gas may be used.

With the use of the oxygen cation as the ion 601, plasma damage at the film formation can be alleviated. Thus, a reduction in the crystallinity of the sputtering target 600 or a change of the sputtering target 600 into an amorphous state, which is caused when the ion 601 collides with the surface of the sputtering target 600, can be suppressed.

It is preferable that the separated sputtered particle 602 be positively charged. However, there is no particular limitation on the timing at which the sputtered particle 602 is positively charged. Specifically, the sputtered particle 602 is in some cases positively charged by being exposed to plasma. Alternatively, the sputtered particle 602 is in some cases positively charged by receiving an electric charge at the collision of the ion 601. Further alternatively, the sputtered particle 602 is in some cases positively charged in such a manner that the ion 601 which is an oxygen cation is bonded to a side, top, or bottom surface of the sputtered particle 602.

In the sputtered particle 602, the corners of the hexagonal plane are positively charged, whereby positive charges of the hexagonal plane repel each other. Thus, the flat-plate shape of the sputtered particle 602 can be maintained.

It is preferable to use a direct-current (DC) power source to positively charge the corners of the hexagonal plane of the sputtered particle 602. Note that a radio frequency (RF) power source or an alternating-current (AC) power source can be used. Note that it is difficult to use an RF power source for a sputtering apparatus which is capable of deposition to a large substrate. In addition, a DC power source is preferred to an AC power source from the viewpoint below.

Figures 1, 29A:
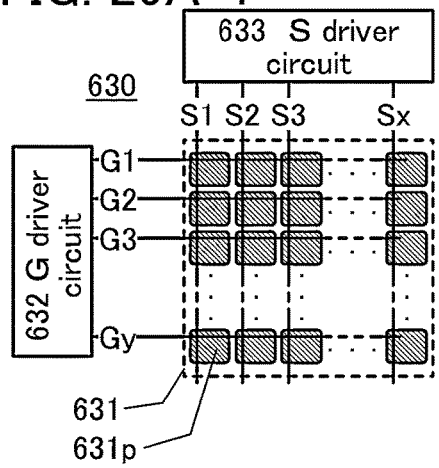
Figures 2, 29A:
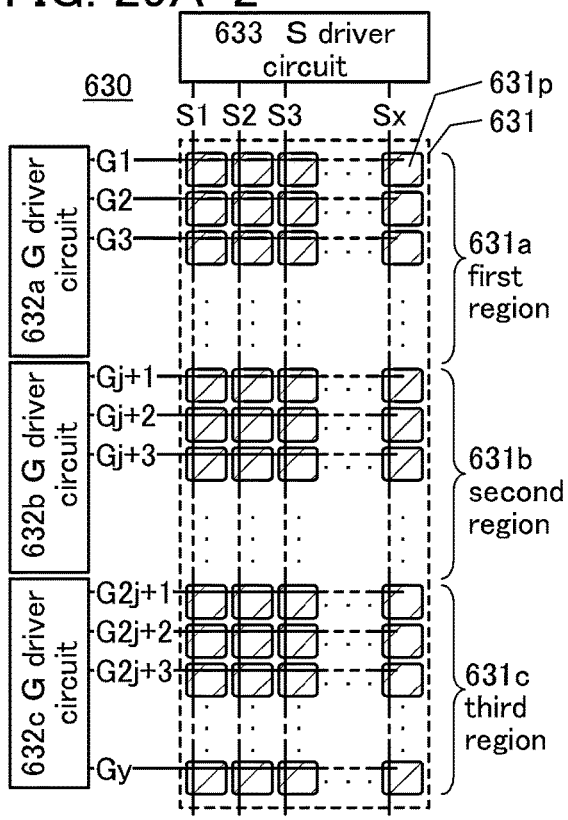

In the case where the AC power source is used, adjacent targets alternately have a cathode potential and an anode potential. In a period A shown in FIG. 18A, a target 1 functions as a cathode and a target 2 functions as an anode as illustrated in FIG. 18B1. In a period B shown in FIG. 18A, the target 1 functions as an anode and the target 2 functions as a cathode as illustrated in FIG. 18B2. The total time of the period A and the period B is 20 μsec to 50 μsec and the period A and the period B are repeated at a constant frequency.

In the case where the sputtered particle 602 is positively charged, positive charges in the sputtered particle 602 repel each other, whereby the flat-plate shape of the sputtered particles 602 can be maintained. However, in the case where the AC power source is used, there is time during which an electric field is not applied instantaneously; thus, some charges of the sputtered particle 602 are lost and the structure of the sputtered particle might be broken (see FIG. 18C). Thus, a DC power source is preferred to an AC power source.

Figure 19A:
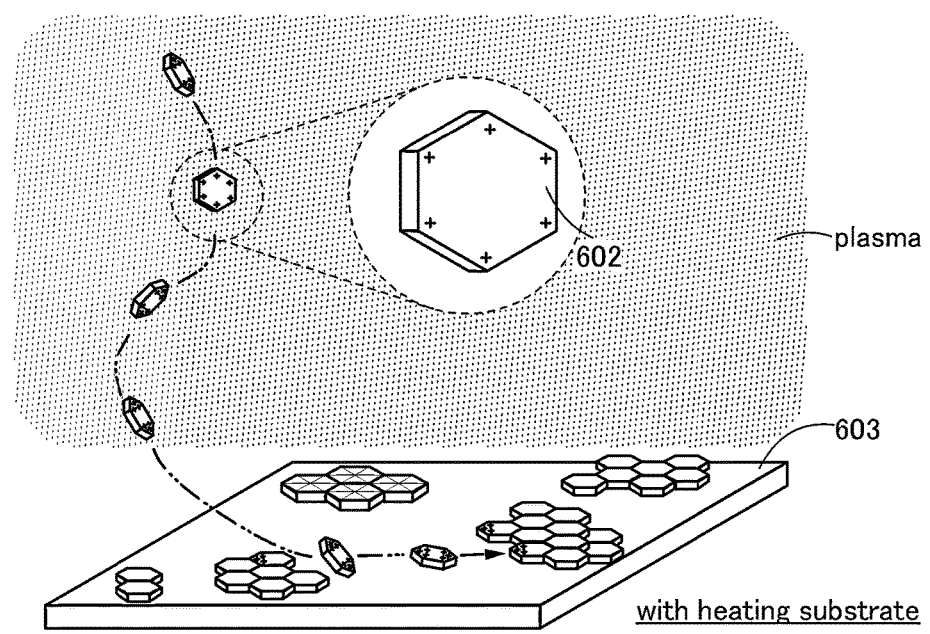
FIGS. 19A and 19B are schematic views each illustrating how sputtered particles which are charged reach a deposition surface.
Figure 19B:
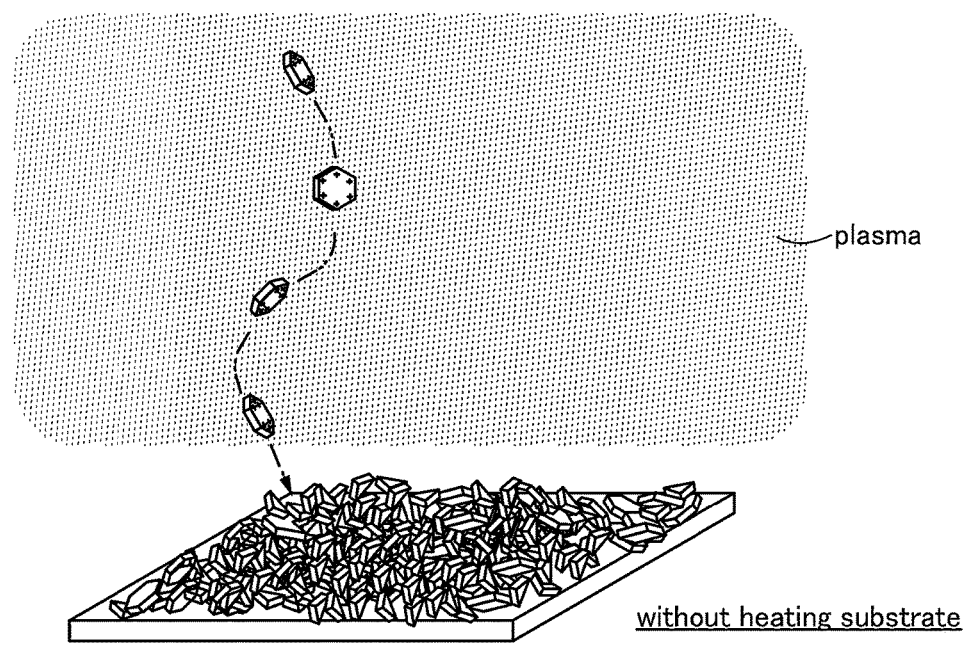

A description on how a sputtered particle is deposited on a deposition surface is given with reference to FIGS. 19A and 19B. FIG. 19A illustrates the case where film formation is performed with substrate heating and FIG. 19B illustrates a case where film formation is performed without substrate heating.

As illustrated in FIG. 19A, in the case where substrate heating is performed, one sputtered particle 602 moves to a region of a deposition surface 603 where other sputtered particles 602 have not been deposited yet, and migration of the sputtered particle 602 occurs, whereby the sputtered particle 602 is bonded to the sides of the sputtered particles which are already deposited.

The CAAC-OS film which is obtained by such a mechanism has high crystallinity even on an amorphous surface, a surface of an amorphous insulating film, a surface of an amorphous oxide film, or the like.

As illustrated in FIG. 19B, in the case where substrate heating is not performed, the sputtered particles 602 fall irregularly to the deposition surface 603. Thus, the sputtered particles 602 are deposited randomly also in a region where other sputtered particles 602 are already deposited. That is, an oxide film which is obtained by the deposition has neither a uniform thickness nor a uniform crystal orientation. The oxide film which is obtained in the above manner is the one which includes a crystal part because the crystallinity of flat plate-like sputtered particles 602 is maintained to some extent.

As described above, the diameter of the plane of the sputtered particle 602 which is parallel to the a-b plane is, for example, approximately greater than or equal to 1 nm and less than or equal to 30 nm or greater than or equal to 1 nm and less than or equal to 10 nm, and a crystal part included in the formed oxide film is smaller than the sputtered particle 602 in some cases. The oxide film includes a crystal part with a size of, for example, 10 nm or less or 5 nm or less in some cases. The oxide film including such a crystal part is referred to as a nanocrystalline (nc) oxide film.

The nanocrystalline oxide film is macroscopically equivalent to a film having disordered atomic arrangement. For this reason, in some cases, a peak indicating an orientation is not observed in X-ray diffraction (XRD) analysis which is performed on a large area of a measurement sample (for example, in which the beam diameter is larger than that of the sputtered particle 602). Further, in some cases, an electron diffraction pattern obtained by using an electron beam with a diameter larger than that of the sputtered particle 602 is a halo pattern. In this case, for example, a nanocrystalline oxide film is measured with an electron beam having a beam diameter much smaller than the sputtered particle 602, whereby a spot (bright spot) can be observed in the obtained nanobeam electron diffraction pattern.

Electron diffraction patterns of nanocrystalline oxide semiconductor films are described with reference to FIGS. 42A to 42D, FIGS. 43A and 43B, FIGS. 44A to 44C, FIG. 45, FIG. 46, FIGS. 47A and 47B, and FIG. 48.

An electron diffraction pattern obtained by electron diffraction with a beam diameter of 10 nmϕ or less (nanobeam electron diffraction) of a nanocrystalline oxide semiconductor film is neither a halo pattern indicating an amorphous state nor a pattern with spots having regularity indicating a crystalline state in which crystals are aligned with a specific plane. That is, the nanocrystalline oxide semiconductor film is an oxide semiconductor film whose electron diffraction pattern has spots not having directionality.

Figure 42A:
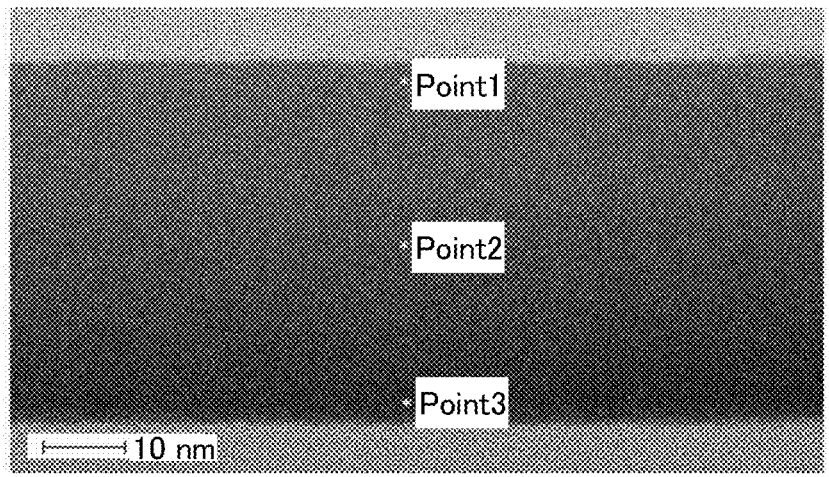
FIGS. 42A to 42D are a cross-sectional TEM image of a nanocrystalline oxide semiconductor film and electron diffraction patterns.
Figure 42B:
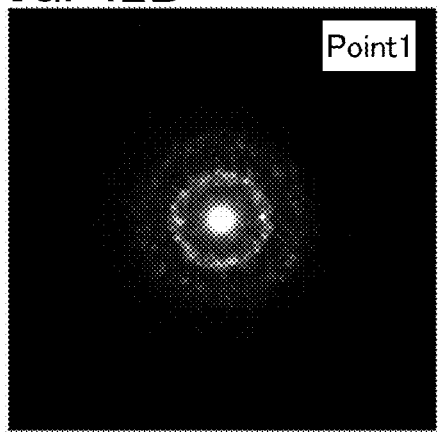
Figure 42C:
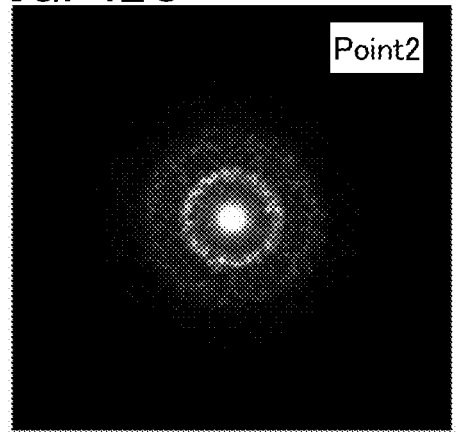
Figure 42D:
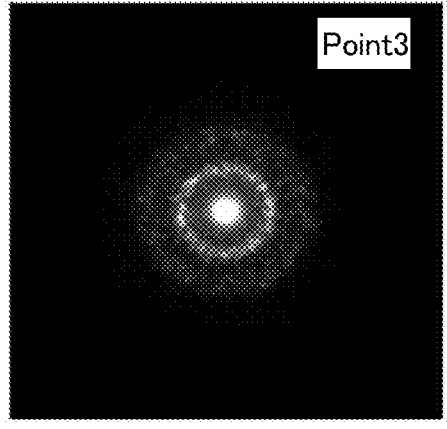

FIG. 42A is a cross-sectional transmission electron microscopy (TEM) image of a nanocrystalline oxide semiconductor film. FIGS. 42B, 42C, and 42D show electron diffraction patterns obtained by nanobeam electron diffraction performed on Points 1, 2, 3 in FIG. 42A, respectively.

A sample in which an In—Ga—Zn-based oxide film was formed, as an example of the nanocrystalline oxide semiconductor film in FIGS. 42A to 42D, over a quartz glass substrate to a thickness of 50 nm was used. The nanocrystalline oxide semiconductor film shown in FIGS. 42A to 42D was formed under the following conditions: an oxide target containing In, Ga, and Zn at an atomic ratio of 1:1:1 was used, the atmosphere was an oxygen atmosphere (flow rate of 45 sccm), the pressure was 0.4 Pa, a direct current (DC) power of 0.5 kW was applied, and the substrate temperature was room temperature. Then, the width of the formed nanocrystalline oxide semiconductor film was reduced to 100 nm or less (e.g., 40 nm±10 nm), and a cross-sectional TEM image and nanobeam electron diffraction patterns were obtained.

FIG. 42A is the cross-sectional TEM image of the nanocrystalline oxide semiconductor film which was taken with a transmission electron microscope ("H-9000NAR" manufactured by Hitachi High-Technologies Corporation) at an acceleration voltage of 300 kV and at a magnification of 2,000,000 times. FIGS. 42B to 42D show the electron diffraction patterns obtained by nanobeam electron diffraction with a beam diameter of about 1 nmϕ, with a transmission electron microscope ("HF-2000" manufactured by Hitachi High-Technologies Corporation) at an acceleration voltage of 200 kV. Note that the measurement area of the nanobeam electron diffraction with a beam diameter of about 1 nmϕ is greater than or equal to 5 nmϕ and less than or equal to 10 nmϕ.

As shown in FIG. 42B, in the nanobeam electron diffraction pattern of the nanocrystalline oxide semiconductor film, a plurality of circumferentially arranged spots (bright points) are observed. In other words, in the pattern of the nanocrystalline oxide semiconductor film, a plurality of circumferentially (concentrically) distributed spots are observed, or a plurality of circumferentially distributed spots form a plurality of concentric circles.

In FIG. 42C showing the central portion of the nanocrystalline oxide semiconductor film in the thickness direction and in FIG. 42D showing the vicinity of an interface between the nanocrystalline oxide semiconductor film and the quartz glass substrate, a plurality of circumferentially distributed spots are observed as in FIG. 42B. In FIG. 42C, the distance from a main spot to each of the circumferentially distributed spots is in the range from 3.88/nm to 4.93/nm, or from 0.203 nm to 0.257 nm when converted into interplanar spacing.

The nanobeam electron diffraction patterns shown in FIGS. 42B to 42D indicate that the nanocrystalline oxide semiconductor film includes a plurality of crystal parts whose surface orientations are random and whose sizes are different from each other.

Figure 43A:
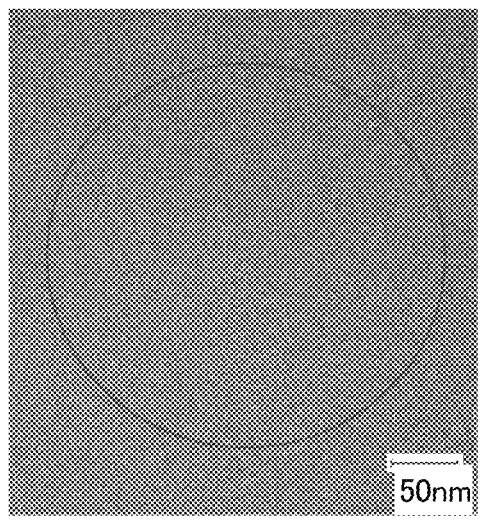
FIGS. 43A and 43B are electron diffraction patterns of a nanocrystalline oxide semiconductor film.
Figure 43B:
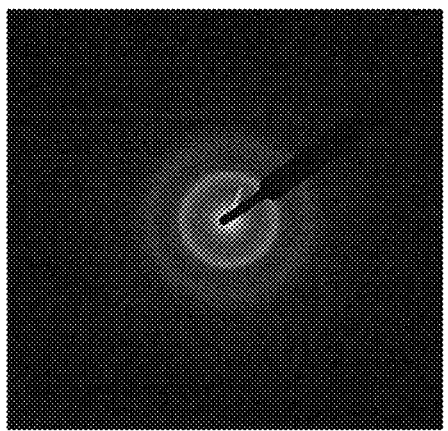

FIG. 43A is a plane TEM image of a nanocrystalline oxide semiconductor film. FIG. 43B shows an electron diffraction pattern obtained by selected-area electron diffraction performed on a region surrounded by a circle in FIG. 43A.

A sample in which an In—Ga—Zn-based oxide film was formed, as an example of the nanocrystalline oxide semiconductor film shown in FIGS. 43A and 43B, over a quartz glass substrate to a thickness of 30 nm was used. The nanocrystalline oxide semiconductor film shown in FIGS. 43A and 43B was formed under the following conditions: an oxide target containing In, Ga, and Zn at an atomic ratio of 1:1:1 was used, the atmosphere was an oxygen atmosphere (flow rate of 45 sccm), the pressure was 0.4 Pa, a direct current (DC) power of 0.5 kW was applied, and the substrate temperature was room temperature. Then, the sample was thinned, and the plane TEM image and the selected-area electron diffraction pattern of the nanocrystalline oxide semiconductor film were obtained.

FIG. 43A is the plane TEM image of the nanocrystalline oxide semiconductor film which was taken with a transmission electron microscope ("H-9000NAR" manufactured by Hitachi High-Technologies Corporation) at an acceleration voltage of 300 kV and at a magnification of 500,000 times. FIG. 43B is the electron diffraction pattern obtained by electron diffraction with a selected area of 300 nmϕ. Note that the measurement area is greater than or equal to 300 nmϕ in consideration of electron beam expansion.

As shown in FIG. 43B, the electron diffraction pattern of the nanocrystalline oxide semiconductor film which was obtained by selected-area electron diffraction the measurement area of which is wider than that of the nanobeam electron diffraction is a halo pattern, in which the plurality of spots observed by the nanobeam electron diffraction are not observed.

Figure 44A:
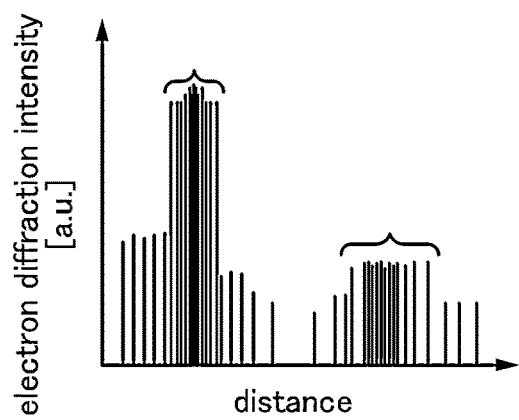
FIGS. 44A to 44C are conceptual diagrams of electron diffraction intensity distribution.
Figure 44B:
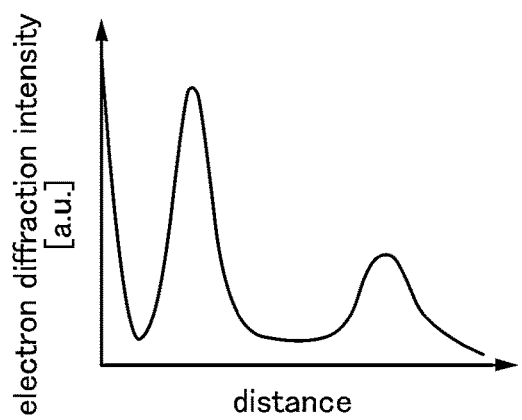
Figure 44C:
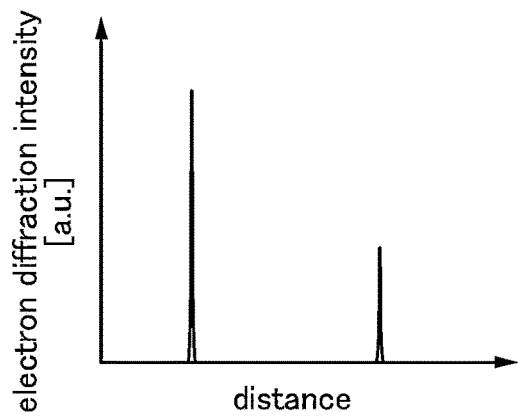

FIGS. 44A to 44C conceptually show diffraction intensity distribution in the electron diffraction patterns shown in FIGS. 42B to 42D and FIG. 43B. FIG. 44A is a conceptual diagram showing diffraction intensity distribution in the nanobeam electron diffraction patterns shown in FIGS. 42B to 42D. FIG. 44B is a conceptual diagram showing diffraction intensity distribution in the selected-area electron diffraction pattern shown in FIG. 43B. FIG. 44C is a conceptual diagram showing diffraction intensity distribution in an electron diffraction pattern of a single crystal structure or a polycrystalline structure.

In each of FIGS. 44A to 44C, the vertical axis represents the electron diffraction intensity (arbitrary unit) indicating distribution of spots or the like and the horizontal axis represents the distance from a main spot.

In FIG. 44C for the single crystal structure or the polycrystalline structure, spots are observed at a specific distance from the main spot, which is based on interplanar spacing (d value) between planes with which crystal parts are aligned.

As shown in each of FIGS. 42B to 42D, a circumferential region formed by the plurality of spots observed in the nanobeam electron diffraction pattern of the nanocrystalline oxide semiconductor film has a relatively large width. Thus, FIG. 44A shows discrete distribution. Further, in the nanobeam electron diffraction pattern, a region with high luminance formed by spots which are not clear is observed in a region between concentric circles.

Further, the electron diffraction intensity distribution in the selected-area electron diffraction pattern of the nanocrystalline oxide semiconductor film is continuous as shown in FIG. 44B. Since FIG. 44B can approximate a result obtained by widely observing the electron diffraction intensity distribution shown in FIG. 44A, the continuous intensity distribution can be considered to result from the overlapping and connection of the plurality of spots.

FIGS. 44A to 44C indicate that the nanocrystalline oxide semiconductor film includes a plurality of crystal parts whose surface orientations are random and whose sizes are different from each other and that the crystal parts are so minute that spots are not observed in the selected-area electron diffraction pattern.

In FIGS. 42B to 42D in which the plurality of spots are observed, the width of the nanocrystalline oxide semiconductor film is 50 nm or less. Further, since the diameter of the electron beam was reduced to 1 nmϕ, the measurement area is greater than or equal to 5 nm and less than or equal to 10 nm. Thus, it is assumed that the diameter of the crystal part included in the nanocrystalline oxide semiconductor film is 50 nm or less, for example, 10 nm or less or 5 nm or less.

Figure 45:
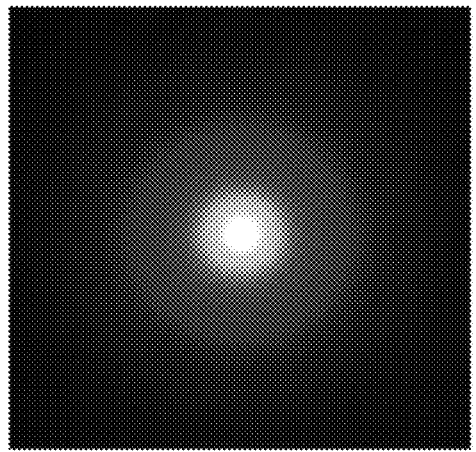
FIG. 45 is a nanobeam electron diffraction pattern of a quartz glass substrate.

FIG. 45 shows a nanobeam electron diffraction pattern of a quartz glass substrate. The measurement conditions were similar to those for the electron diffraction patterns shown in FIGS. 42B to 42D.

As shown in FIG. 45, the nanobeam electron diffraction pattern of the quartz glass substrate having an amorphous structure is a halo pattern without specific spots in which the luminance is gradually changed form a main spot. This means that a plurality of circumferentially distributed spots like those observed in the pattern of the nanocrystalline oxide semiconductor film are not observed in the pattern of a film having an amorphous structure even when electron diffraction is performed on a minute region. This indicates that the plurality of circumferentially distributed spots observed in FIGS. 42B to 42D are peculiar to the nanocrystalline oxide semiconductor film.

Figure 46:
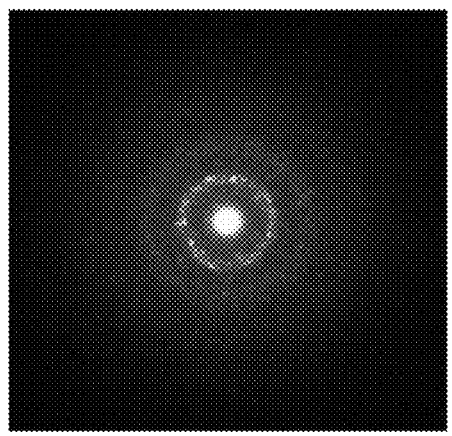
FIG. 46 is an electron diffraction pattern of a nanocrystalline oxide semiconductor film.

FIG. 46 shows an electron diffraction pattern obtained after one-minute irradiation of Point 2 in FIG. 42A with an electron beam whose diameter was reduced to about 1 nmϕ.

As in the electron diffraction pattern shown in FIG. 42C, a plurality of circumferentially distributed spots are observed in the electron diffraction pattern shown in FIG. 46, and there is no significant difference from FIG. 42C. This means that the crystal part observed in the electron diffraction pattern shown in FIG. 42C existed at the time of the formation of the oxide semiconductor film and did not result from irradiation with the electron beam with the reduced diameter.

FIGS. 47A and 47B are enlarged images of portions in the cross-sectional TEM image of FIG. 42A. FIG. 47A is a cross-sectional TEM image of the vicinity of Point 1 (the surface of the nanocrystalline oxide semiconductor film) in FIG. 42A, which was observed at an observation magnification of 8,000,000 times. FIG. 47B is a cross-sectional TEM image of the vicinity of Point 2 (the central portion of the nanocrystalline oxide semiconductor film in the thickness direction) in FIG. 42A, which was observed at an observation magnification of 8,000,000 times.

According to each of the TEM images of FIGS. 47A and 47B, a crystalline structure cannot be clearly observed in the nanocrystalline oxide semiconductor film.

Figure 48:
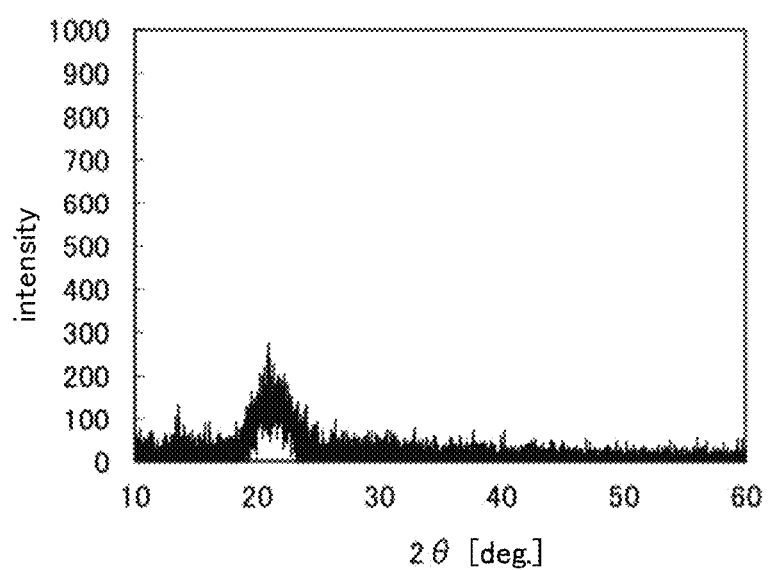
FIG. 48 shows results of X-ray diffraction of a metal oxide film of a nanocrystalline oxide semiconductor film.

The samples for the electron diffraction patterns shown in FIGS. 42A to 42D and FIGS. 43A and 43B, in each of which the nanocrystalline oxide semiconductor film of this embodiment was formed over the quartz glass substrate, were analyzed by X-ray diffraction (XRD). FIG. 48 shows an XRD spectrum of the samples measured by an out-of-plane method.

In FIG. 48, the vertical axis represents the X-ray diffraction intensity (arbitrary unit) and the horizontal axis represents the diffraction angle 2θ (degree). Note that the XRD spectrum was measured with an X-ray diffractometer, D8 ADVANCE manufactured by Bruker AXS.

As shown in FIG. 48, a peak corresponding to quartz is observed at around 2θ=20° to 23°; however, a peak corresponding to the crystal part included in the nanocrystalline oxide semiconductor film cannot be observed.

The results in FIGS. 47A and 47B and FIG. 48 also indicate that the crystal part included in the nanocrystalline oxide semiconductor film is minute.

As described above, in the case of the nanocrystalline oxide semiconductor film of this embodiment, a peak indicating an orientation was not observed by X-ray diffraction (XRD) analysis the measurement area of which is wide and the electron diffraction pattern obtained by selected-area electron diffraction the measurement area of which is wide is a halo pattern. This indicates that the nanocrystalline oxide semiconductor film of this embodiment is macroscopically equivalent to a film having disordered atomic arrangement. However, spots (bright points) can be observed in the nanobeam electron diffraction pattern of the nanocrystalline oxide semiconductor film which was obtained by nanobeam electron diffraction in which the diameter of an electron beam is sufficiently small (e.g., 10 nmϕ or less). Thus, it can be assumed that the nanocrystalline oxide semiconductor film of this embodiment is a film in which minute crystal parts having random surface orientations (e.g., crystal parts each with a diameter of 10 nm or less, 5 nm or less, or 3 nm or less) cohere. A nanocrystal region including the minute crystal parts is included in the entire region of the nanocrystalline oxide semiconductor film in the thickness direction.

Note that the deposition surface 603 is preferably an insulating surface. When the deposition surface 603 is an insulating surface, the sputtered particles 602 which are deposited on the deposition surface 603 are unlikely to loose positive charges. However, in the case where the deposition rate of the sputtered particles 602 is lower than the rate at which a positive charge is lost, the deposition surface 603 may have conductivity. The deposition surface 603 is preferably an amorphous surface or an amorphous insulating surface.

With the use of a sputtering target in the way described above, an oxide film having a uniform thickness and a uniform crystal orientation can be formed.

Note that the structures and the like described in this embodiment can be combined as appropriate with any of the structures and the like described in the other embodiments.

Embodiment 5

In this embodiment, a sputtering target of one embodiment of the present invention is described.

The relative density of the sputtering target is higher than or equal to 90%, higher than or equal to 95%, or higher than or equal to 99%.

The sputtering target includes a polycrystalline oxide containing a plurality of crystal grains whose average grain size is less than or equal to 3 μm, preferably less than or equal to 2.5 μm, further preferably less than or equal to 2 μm.

Alternatively, the sputtering target includes a polycrystalline oxide containing a plurality of crystal grains, in which the proportion of crystal grains whose grain size is greater than or equal to 0.4 μm and less than or equal to 1 μm is higher than or equal to 8%, preferably higher than or equal to 15%, further preferably higher than or equal to 25%.

Note that the grain size of the crystal grain can be measured by electron backscatter diffraction (EBSD). The grain size of the crystal grain described here is calculated from a cross-sectional area of one crystal grain measured from a crystal grain map obtained by EBSD, assuming that the cross section of the crystal grain is a perfect circle. Specifically, when the cross-sectional area of the crystal grain is denoted by S and the radius of the cross section of the crystal grain is denoted by r, the radius r is calculated from a relation, $S=pr^2$ to obtain the grain size which can be represented by 2r (twice the radius r).

Further, the plurality of crystal grains included in the sputtering target have cleavage planes. The cleavage plane is a plane parallel to an a-b plane, for example.

When the plurality of crystal grains have a small gain size, a sputtered particle is separated from the cleavage plane by collision of an ion with the sputtering target. The separated sputtered particle has a flat-plate-like shape with upper and lower surfaces parallel to the cleavage plane. Further, owing to small grain sizes of the plurality of crystal grains, distortion in crystal is caused and a sputtered particle becomes easily separated from the cleavage plane.

Note that when the plurality of crystal grains included in the sputtering target are hexagonal crystals, flat-plate-like sputtered particles each have the shape of a hexagonal cylinder whose top and bottom surfaces are approximately equilateral hexagons each having interior angles of 120°.

Although sputtered particles are ideally single crystals, part of the sputtered particles may be changed into an amorphous state due to the impact of ion collision.

As such a polycrystalline oxide included in the sputtering target, an oxide containing In, M (M is Ga, Sn, Hf, Al, La, Ce, Pr, Nd, Sm, Eu, Gd, Tb, Dy, Ho, Er, Tm, Yb, or Lu), and Zn is used. The oxide containing In, M, and Zn is also referred to as In-M-Zn oxide.

Moreover, the atomic ratio of In to M and Zn contained in the In-M-Zn oxide is preferably close to the stoichiometric composition. When the atomic ratio of In, M, and Zn contained in the In-M-Zn oxide becomes close to the stoichiometric composition ratio, the crystallinity of the In-M-Zn oxide can be increased.

In the In-M-Zn oxide, a cleavage plane is, in many cases, a plane parallel to an a-b plane in which M and Zn are mixed.

A method for forming the above sputtering target is described with reference to FIGS. 25A and 25B.

Figure 25A:
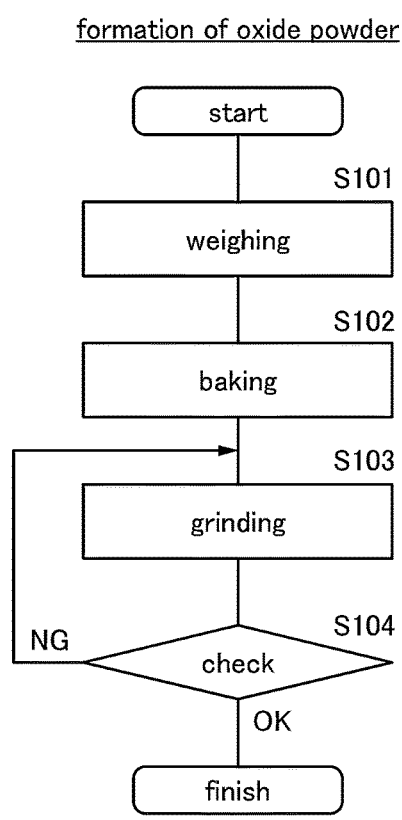
FIGS. 25A and 25B are flow charts each showing an example of a method for manufacturing a sputtering target.

FIG. 25A shows formation of an oxide powder containing a plurality of metal elements to be a sputtering target. First, the oxide powder is weighed in Step S101.

Here, description is given on the case where an oxide powder containing In, M, and Zn (also referred to as an In-M-Zn oxide powder) is obtained as the oxide powder containing a plurality of metal elements. Specifically, an $InO_X$ oxide powder, an $MO_Y$ oxide powder, and a $ZnO_Z$ oxide powder are prepared as a raw material. Note that X, Y, and Z are each a given positive number; for example, X, Y, and Z are 1.5, 1.5, and 1, respectively. It is needless to say that the above oxide powders are an example, and oxide powders can be selected as appropriate in order to obtain a desired composition. Note that M refers to Ga, Sn, Hf, Al, La, Ce, Pr, Nd, Sm, Eu, Gd, Tb, Dy, Ho, Er, Tm, Yb, or Lu. Although the case where three kinds of oxide powders are used is shown as an example in this embodiment, one embodiment of the present invention is not limited thereto. For example, this embodiment may be applied to the case where four or more kinds of oxide powders are used or the case where one or two kinds of oxide powders are used.

Next, the $InO_X$ oxide powder, the $MO_Y$ oxide powder, and the $ZnO_Z$ oxide powder are mixed in a predetermined molar ratio.

For example, the predetermined mole ratio of the $InO_X$ oxide powder, the $MO_Y$ oxide powder, and the $ZnO_Z$ oxide powder is 2:2:1, 8:4:3, 3:1:1, 1:1:1, 4:2:3, 1:1:2, 3:1:4, 1:3:2, 1:3:4, 1:3:6, 1:3:8, 1:3:10, 1:3:12, 1:6:4, 1:6:6, 1:6:8, 1:6:10, 1:6:12, 1:6:14, 1:6:16, 1:6:20, or 3:1:2. With such a molar ratio, a sputtering target including a polycrystalline oxide with high crystallinity can be obtained easily later.

Next, in Step S102, an In-M-Zn oxide is obtained by performing first baking on the $InO_X$ oxide powder, the $MO_Y$ oxide powder, and the $ZnO_Z$ oxide powder which are mixed in a predetermined molar ratio.

Note that the first baking is performed in an inert atmosphere, an oxidation atmosphere, or a reduced-pressure atmosphere at a temperature higher than or equal to 400° C. and lower than or equal to 1700° C., preferably higher than or equal to 900° C. and lower than or equal to 1500° C. The first baking is performed for longer than or equal to 3 minutes and shorter than or equal to 24 hours, preferably longer than or equal to 30 minutes and shorter than or equal to 17 hours, more preferably longer than or equal to 30 minutes and shorter than or equal to 5 hours, for example. When the first baking is performed under the above conditions, secondary reactions other than the main reaction can be suppressed, and the concentration of impurities in the In-M-Zn oxide powder can be reduced. Accordingly, the crystallinity of the In-M-Zn oxide powder can be increased.

The first baking may be performed plural times at different temperatures and/or in different atmospheres. For example, the In-M-Zn oxide powder may be first held at a first temperature in a first atmosphere and then at a second temperature in a second atmosphere. Specifically, it is preferable that the first atmosphere be an inert atmosphere or a reduced-pressure atmosphere and the second atmosphere be an oxidation atmosphere. This is because oxygen vacancy is generated in the In-M-Zn oxide when impurities contained in the In-M-Zn oxide powder are reduced in the first atmosphere. Therefore, it is preferable that oxygen vacancy in the obtained In-M-Zn oxide be reduced in the second atmosphere. The concentration of impurities contained in the In-M-Zn oxide is decreased and oxygen vacancy is reduced, whereby the crystallinity of the In-M-Zn oxide powder can be increased.

Next, the In-M-Zn oxide powder is obtained by grinding the In-M-Zn oxide in Step S103.

The In-M-Zn oxide has many surface structures of planes parallel to the a-b plane. Therefore, the obtained In-M-Zn oxide powder includes many flat plate-like crystal grains whose top and bottom surfaces are parallel to the a-b plane. Moreover, the crystal of the In-M-Zn oxide is in many cases a hexagonal crystal; therefore, in many cases, the above flat plate-like crystal grains each have the shape of a hexagonal cylinder whose top and bottom surfaces are approximately equilateral hexagons each having internal angles of 120°.

Next, the grain size of the obtained In-M-Zn oxide powder is checked in Step S104. Here, the average grain size of the In-M-Zn oxide powder is checked to be less than or equal to 3 µm, preferably less than or equal to 2.5 µm, further preferably less than or equal to 2 µm. Note that Step S104 may be skipped and only the In-M-Zn oxide powder whose grain size is less than or equal to 3 µm, preferably less than or equal to 2.5 µm, further preferably less than or equal to 2 µm may be sifted using a grain size filter. The average grain size of the In-M-Zn oxide powder can be certainly less than or equal to 3 µm, preferably less than or equal to 2.5 µm, further preferably less than or equal to 2 µm by sifting the In-M-Zn oxide powder to have the grain size which is less than or equal to 3 µm, preferably less than or equal to 2.5 µm, further preferably less than or equal to 2 µm.

In the case where the average grain size of the In-M-Zn oxide powder exceeds a predetermined size in Step S104, the procedure returns to Step S103 and the In-M-Zn oxide powder is ground again.

In the above manner, the In-M-Zn oxide powder whose average grain size is less than or equal to 3 µm, preferably less than or equal to 2.5 µm, further preferably less than or equal to 2 µm can be obtained. Note that the average grain size of the obtained In-M-Zn oxide powder is less than or equal to 3 µm, preferably less than or equal to 2.5 µm, further preferably less than or equal to 2 µm, which enables the grain size of a crystal grain included in a sputtering target that is to be formed later to be reduced.

Figure 25B:
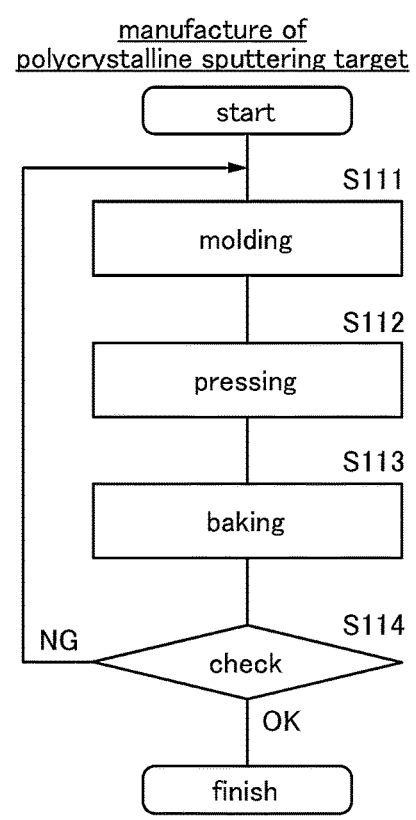

Next, FIG. 25B shows a method for manufacturing a sputtering target using the In-M-Zn oxide powder obtained as shown in the flow chart in FIG. 25A.

In Step S111, the In-M-Zn oxide powder is made to spread over a mold and molded. Here, molding refers to spreading powder or the like over a mold to obtain a uniform thickness. Specifically, the In-M-Zn oxide powder is introduced to the mold, and then vibration is externally applied so that the In-M-Zn oxide powder is molded. Alternatively, the In-M-Zn oxide powder is introduced to the mold, and then molding is performed using a roller or the like so as to obtain a uniform thickness. Note that in Step S111, slurry in which the In-M-Zn oxide powder is mixed with water, a dispersant, and a binder may be molded. In that case, the slurry is poured into the mold and then molded by sucking the mold from the bottom. After that, drying treatment is performed on a molded body after the mold is sucked. The drying treatment is preferably natural drying because the molded body is less likely to be cracked. After that, the molded body is subjected to heat treatment at a temperature higher than or equal to 300° C. and lower than or equal to 700° C., so that residual moisture or the like which cannot be taken out by natural drying is removed.

When the In-M-Zn oxide powder including many flat plate-like crystal grains whose top and bottom surfaces are parallel to the a-b plane is made to spread over the mold and molded, the crystal grains are arranged with the planes which are parallel to the a-b plane thereof facing upward. Therefore, the proportion of the surface structures of planes parallel to the a-b plane can be increased in such a manner that the obtained In-M-Zn oxide powder is made to spread over the mold and molded. Note that the mold may be formed of a metal or an oxide and the upper shape thereof is rectangular or rounded.

Next, first pressure treatment is performed on the In-M-Zn oxide powder in Step S112. After that, in Step S113, second baking is performed to obtain a plate-like In-M-Zn oxide. The second baking is performed under conditions similar to those of the first baking. The crystallinity of the In-M-Zn oxide can be increased by performing the second baking.

Note that the first pressure treatment may be performed in any manner as long as the In-M-Zn oxide powder can be pressed. For example, a weight which is formed of the same kind of material as the mold can be used. Alternatively, the In-M-Zn oxide powder may be pressed under high pressure using compressed air. Besides, the first pressure treatment can be performed using known techniques. Note that the first pressure treatment may be performed at the same time as the second baking.

Planarization treatment may be performed after the first pressure treatment. As the planarization treatment, chemical mechanical polishing (CMP) treatment or the like can be employed.

The plate-like In-M-Zn oxide thus obtained becomes a polycrystalline oxide with high crystallinity.

Next, the thickness of the obtained plate-like In-M-Zn oxide is checked in Step S114. When the thickness of the plate-like In-M-Zn oxide is less than a desired thickness, the procedure returns to Step S111 and the In-M-Zn oxide powder is made to spread over the plate-like In-M-Zn oxide and molded. When the plate-like In-M-Zn oxide has a desired thickness, the plate-like In-M-Zn oxide is used as a sputtering target. The case where the thickness of the plate-like In-M-Zn oxide is less than a desired thickness is described below.

Then, in Step S112, second pressure treatment is performed on the plate-like In-M-Zn oxide and the In-M-Zn oxide powder over the plate-like In-M-Zn oxide. After that, in Step S113, third baking is performed, whereby a plate-like In-M-Zn oxide whose thickness is increased by the thickness of the In-M-Zn oxide powder is obtained. A plate-like In-M-Zn oxide with an increased thickness is obtained through crystal growth with the use of the plate-like In-M-Zn oxide as a seed crystal; therefore, the plate-like In-M-Zn oxide is a polycrystalline oxide with high crystallinity.

Note that the third baking may be performed under conditions similar to those of the second baking. The second pressure treatment may be performed under conditions similar to those of the first pressure treatment. The second pressure treatment may be performed at the same time as the third baking.

The thickness of the obtained plate-like In-M-Zn oxide is checked again in Step S114.

Through the above steps, the thickness of the plate-like In-M-Zn oxide can be gradually increased while the crystal alignment is improved.

By repeating these steps of increasing the thickness of the plate-like In-M-Zn oxide n (n is a natural number) times, the plate-like In-M-Zn oxide having a desired thickness (t), for example, greater than or equal to 2 mm and less than or equal to 20 mm, preferably greater than or equal to 3 mm and less than or equal to 20 mm can be obtained. The plate-like In-M-Zn oxide is used as a sputtering target.

After that, planarization treatment may be performed.

Note that fourth baking may be performed on the obtained sputtering target. The fourth baking is performed under conditions similar to those of the first baking. A sputtering target including a polycrystalline oxide with much higher crystallinity can be obtained by performing the fourth baking.

In the above manner, the sputtering target which includes a polycrystalline oxide containing a plurality of crystal grains having cleavage planes parallel to the a-b plane and a small average grain size can be formed.

Note that the sputtering target formed in such a manner can have high density. When the density of the sputtering target is increased, the density of a film to be deposited can also be increased. Specifically, the relative density of the sputtering target can be set higher than or equal to 90%, preferably higher than or equal to 95%, further preferably higher than or equal to 99%.

This embodiment can be combined as appropriate with any of the other embodiments in this specification.

Embodiment 6

In this embodiment, observation results of electron diffraction patterns of a CAAC-OS film which can be used for one embodiment of the present invention are described.

The CAAC-OS film used in this embodiment is an In—Ga—Zn-based oxide film which is formed by a sputtering method using a deposition gas containing oxygen and a target of an In—Ga—Zn oxide (having an atomic ratio of In:Ga:Zn=1:1:1). The above embodiment can be referred to for detailed description of a manufacturing method and the like of the CAAC-OS film.

Figure 33:
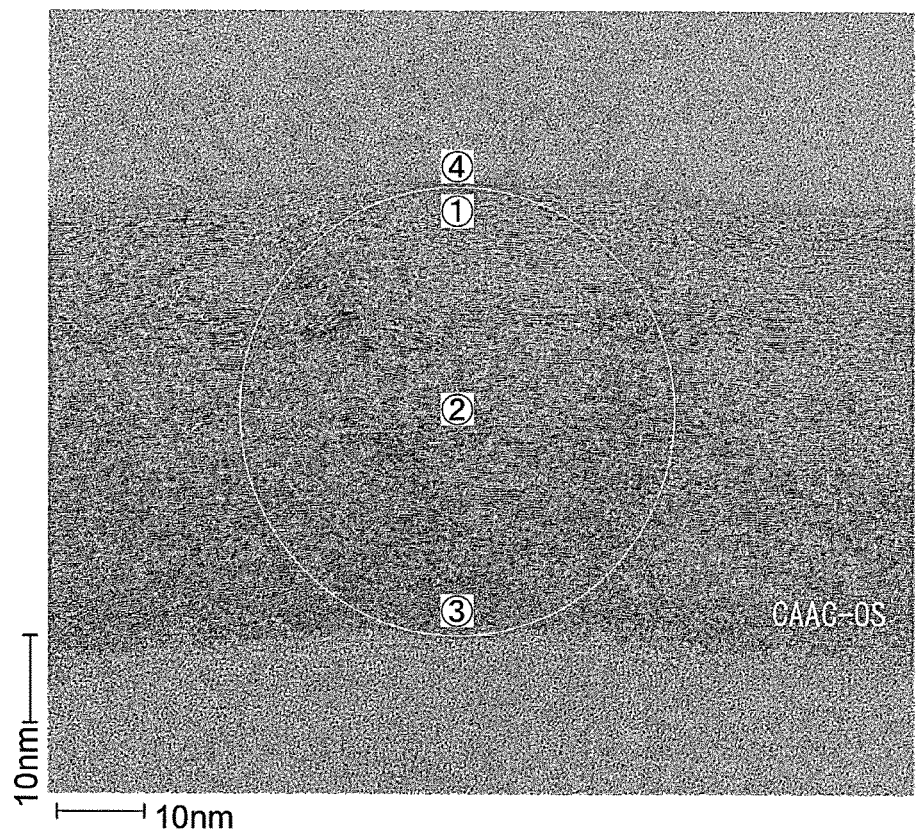
FIG. 33 is a cross-sectional TEM image of a CAAC-OS film.

FIG. 33 is a cross-sectional transmission electron microscopy (TEM) image of the CAAC-OS film. FIGS. 34A to 34D show electron diffraction patterns which were obtained by measurement of Points 1 to 4 in FIG. 33 using electron diffraction.

The cross-sectional TEM image shown in FIG. 33 was taken with a transmission electron microscope ("H-9000NAR" manufactured by Hitachi High-Technologies Corporation) at an acceleration voltage of 300 kV and at a magnification of 2,000,000 times. The electron diffraction patterns shown in FIGS. 34A to 34D were obtained with a transmission electron microscope ("HF-2000" manufactured by Hitachi High-Technologies Corporation) at an acceleration voltage of 200 kV and beam diameters of about 1 nm$\phi$ and about 50 nm$\phi$. Note that electron diffraction with a beam diameter of 10 nm$\phi$ or less is particularly referred to as nanobeam electron diffraction in some cases. Further, a measurement area of the electron diffraction with a beam diameter of about 1 nm$\phi$ is greater than or equal to 5 nm$\phi$ and less than or equal to 10 nm$\phi$.

Figure 34A:
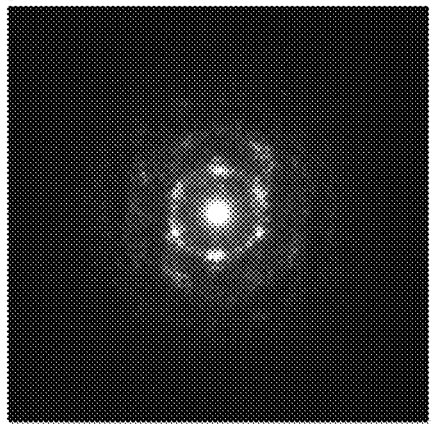
FIGS. 34A to 34D are electron diffraction patterns of a CAAC-OS film.
Figure 34B:
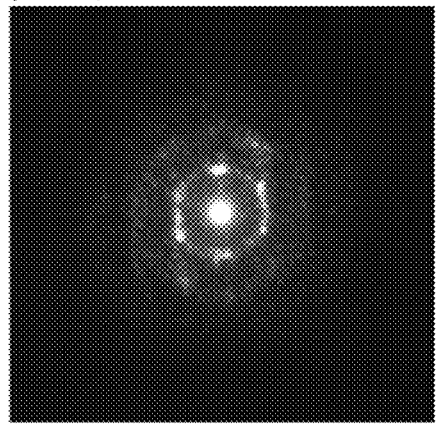
Figure 34C:
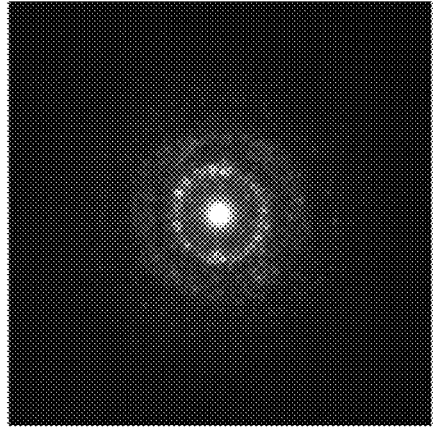
Figure 34D:
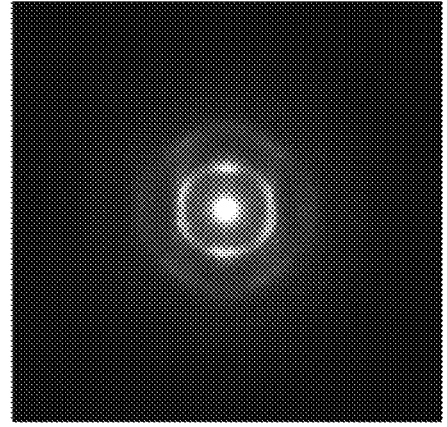

Electron diffraction patterns of Point 1 (the surface side of the film), Point 2 (the center of the film), and Point 3 (the base side of the film) shown in FIG. 33 correspond to FIGS. 34A, 34B, and 34C, respectively and are obtained with an electron-beam diameter of about 1 nm$\phi$. An electron diffraction pattern in Point 4 (the whole film) shown in FIG. 33 corresponds to FIG. 34D and is obtained with an electron-beam diameter of about 50 nm$\phi$.

A pattern formed by spots (bright points) is observed in each of the electron diffraction patterns of Point 1 (on the surface side of the film) and Point 2 (the center of the film), and a slightly broken pattern is observed in Point 3 (on the base side of the film). This indicates that the crystal state varies in the thickness direction in the CAAC-OS film. Note that a pattern formed by spots (bright points) is observed in Point 4 (the whole film), which indicates that the whole film is a CAAC-OS film or a film including a CAAC-OS film.

Figure 35:
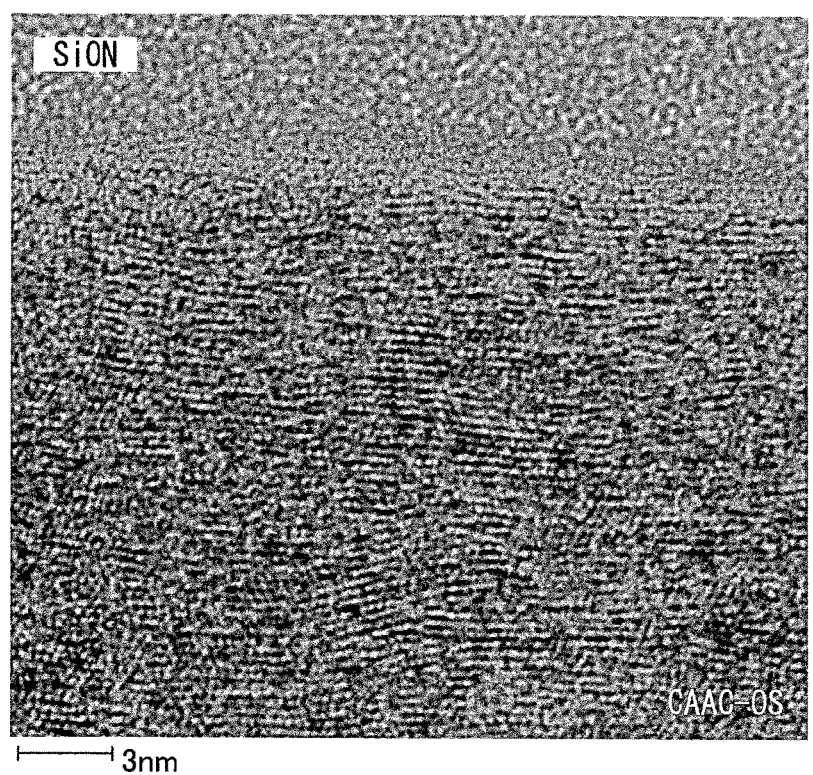
FIG. 35 is a cross-sectional TEM image of a CAAC-OS film.

FIG. 35 is an enlarged view of a portion in the vicinity of Point 1 (on the surface side of the film) in FIG. 33. In FIG. 35, a clear lattice image which shows alignment of the CAAC-OS film extends to the interface with an SiON film that is an interlayer insulating film.

Figure 36A:
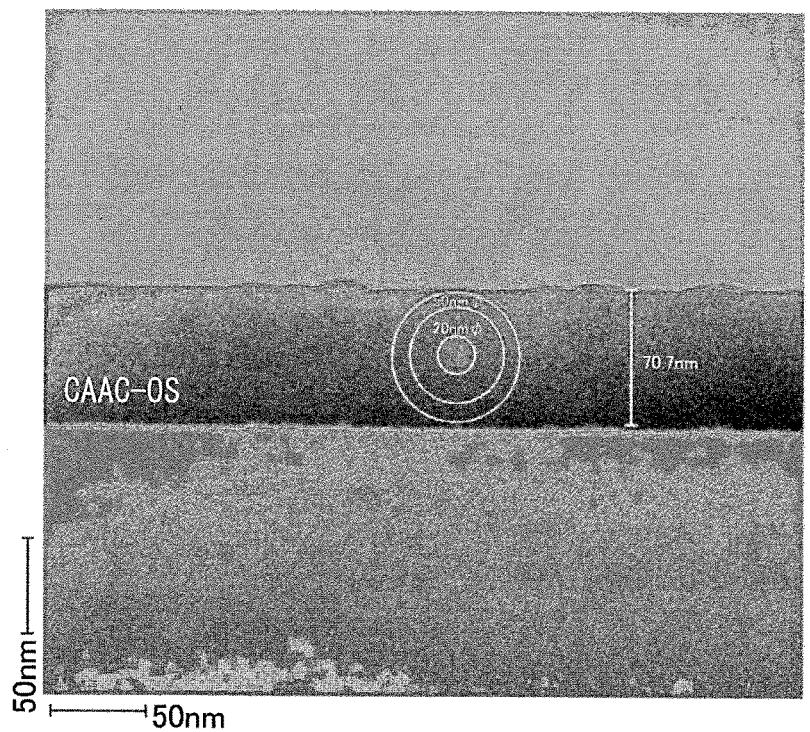
FIGS. 36A and 36B are a cross-sectional TEM image of a CAAC-OS film and an X-ray diffraction spectrum thereof.
Figure 36B:
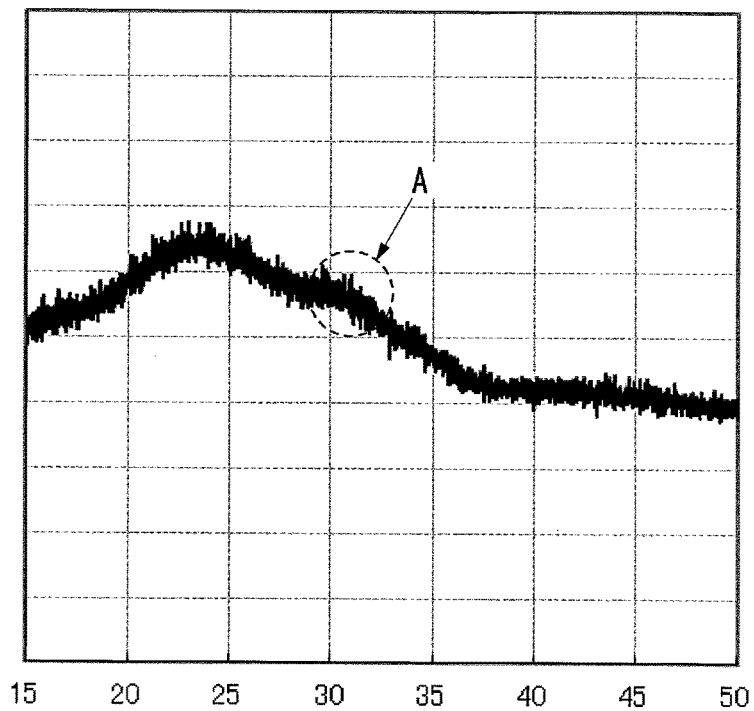
Figure 37A:
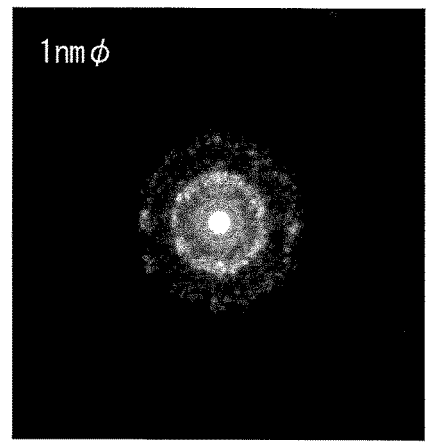
FIGS. 37A to 37D are electron diffraction patterns of a CAAC-OS film.
Figure 37B:
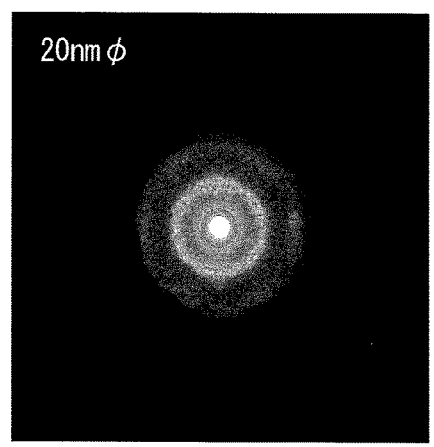
Figure 37C:
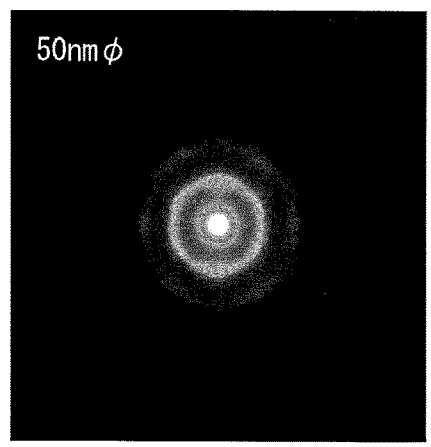
Figure 37D:
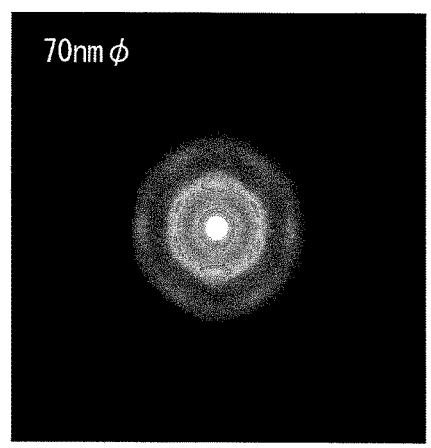

FIGS. 36A and 36B are a cross-sectional TEM photograph and an X-ray diffraction spectrum of a CAAC-OS film different from the CAAC-OS film used for the cross-sectional TEM image of FIG. 33. A CAAC-OS film may have a variety of forms, and Peak A which indicates a crystal component appears around 2θ=31° as shown in FIG. 36B, but the peak does not appear clearly in some cases.

FIGS. 37A to 37D show results of electron diffraction in regions in the CAAC-OS film with electron-beam diameters of 1 nm$\phi$, 20 nm$\phi$, 50 nm$\phi$, and 70 nm$\phi$. The regions are indicated by concentric circles in FIG. 36A. In the case of an electron-beam diameter of 1 nm$\phi$, a pattern formed by clear spots (bright points) can be observed as in FIGS. 34A and 34B. As the electron-beam diameter is increased, the spots (bright points) become unclear but a diffraction pattern can be observed; therefore, the whole film is a CAAC-OS film or a film including a CAAC-OS film.

Figure 38A:
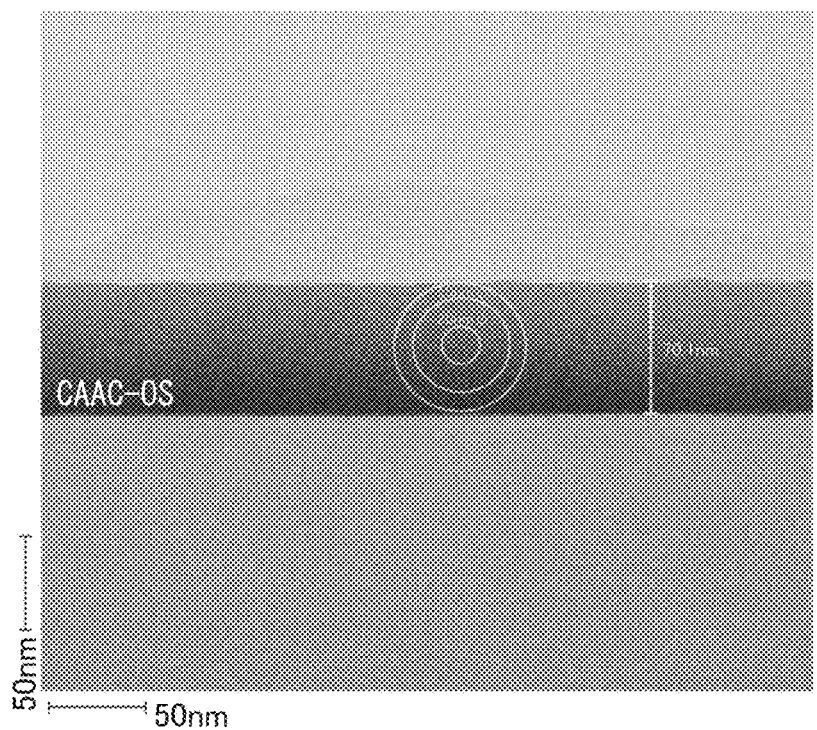
FIGS. 38A and 38B are cross-sectional TEM image of a CAAC-OS film and an X-ray diffraction spectrum thereof.
Figure 38B:
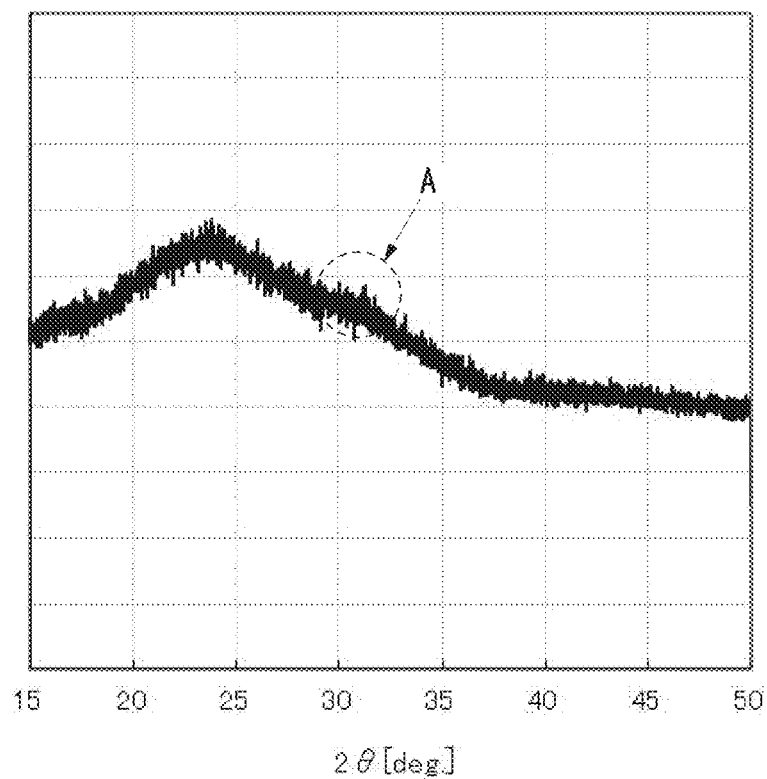
Figure 39A:
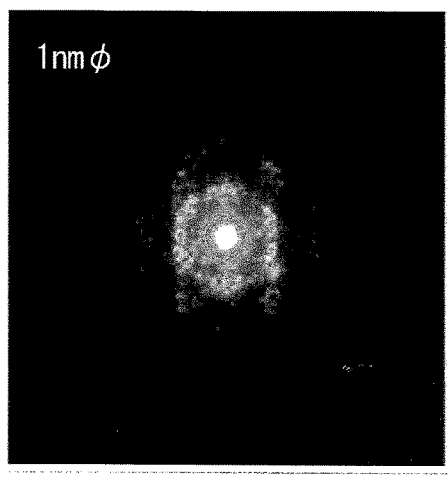
FIGS. 39A to 39D are electron diffraction patterns of a CAAC-OS film.
Figure 39B:
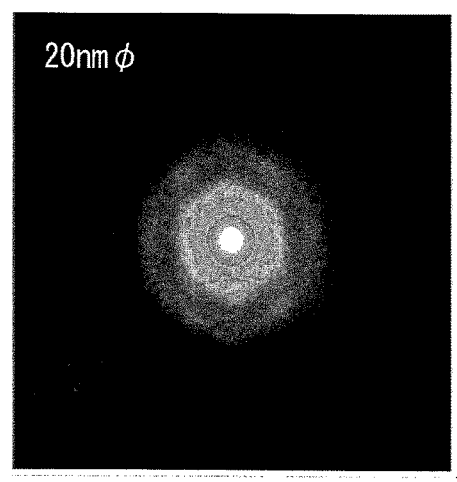
Figure 39C:
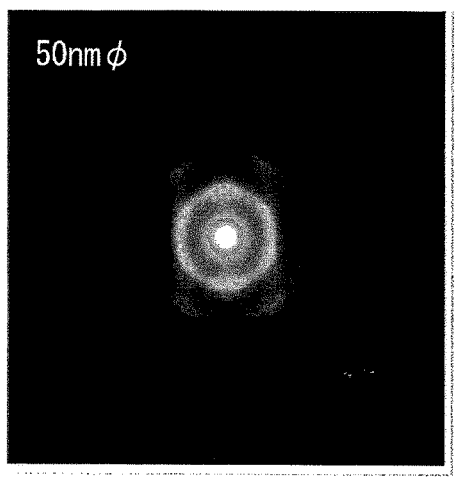
Figure 39D:
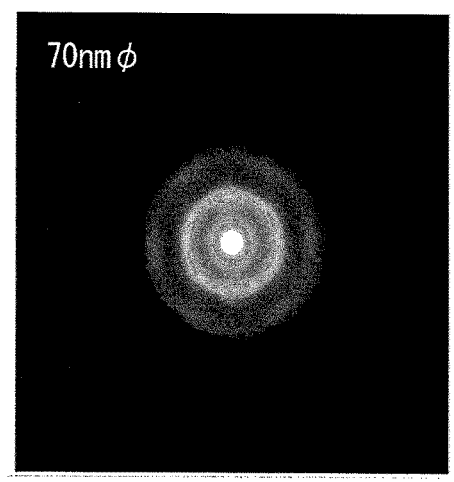

FIGS. 38A and 38B are a cross-sectional TEM image and an X-ray diffraction spectrum of the CAAC-OS film used for the cross-sectional TEM observation in FIG. 36A, which are obtained after annealing at 450° C.

FIGS. 39A to 39D show results of electron diffraction in regions in the CAAC-OS film with electron-beam diameters of 1 nm$\phi$, 20 nm$\phi$, 50 nm$\phi$, and 70 nm$\phi$. The regions are indicated by concentric circles in FIG. 38A. In the case of an electron-beam diameter of 1 nm$\phi$, a pattern formed by clear spots (bright points) can be observed as in the results shown in FIGS. 37A to 37D. As the electron-beam diameter is increased, the spots (bright points) become unclear but a diffraction pattern can be observed; therefore, the whole film is a CAAC-OS film or a film including a CAAC-OS film.

Figure 40A:
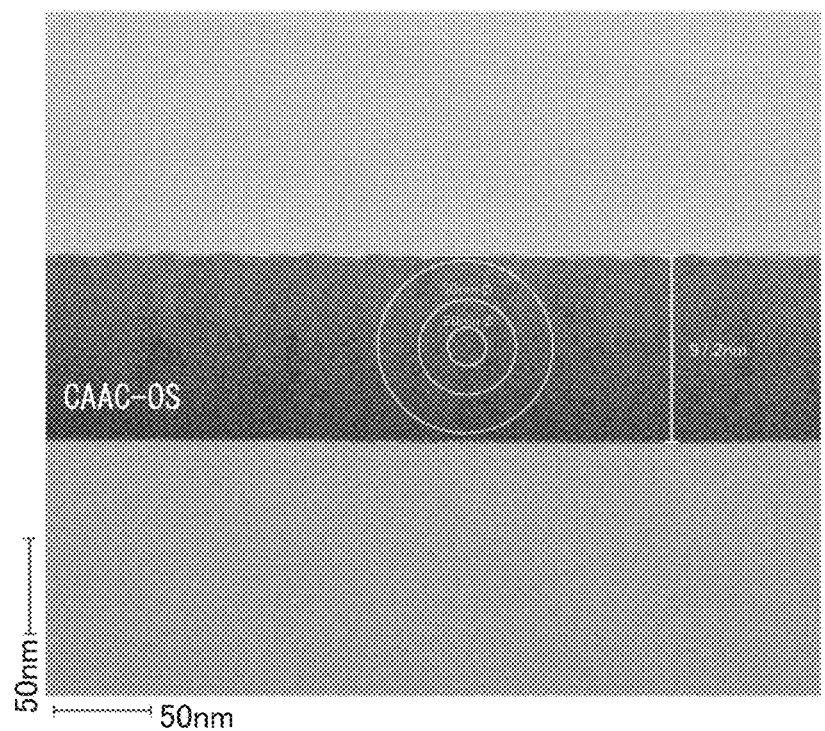
FIGS. 40A and 40B are cross-sectional TEM image of a CAAC-OS film and an X-ray diffraction spectrum thereof.
Figure 40B:
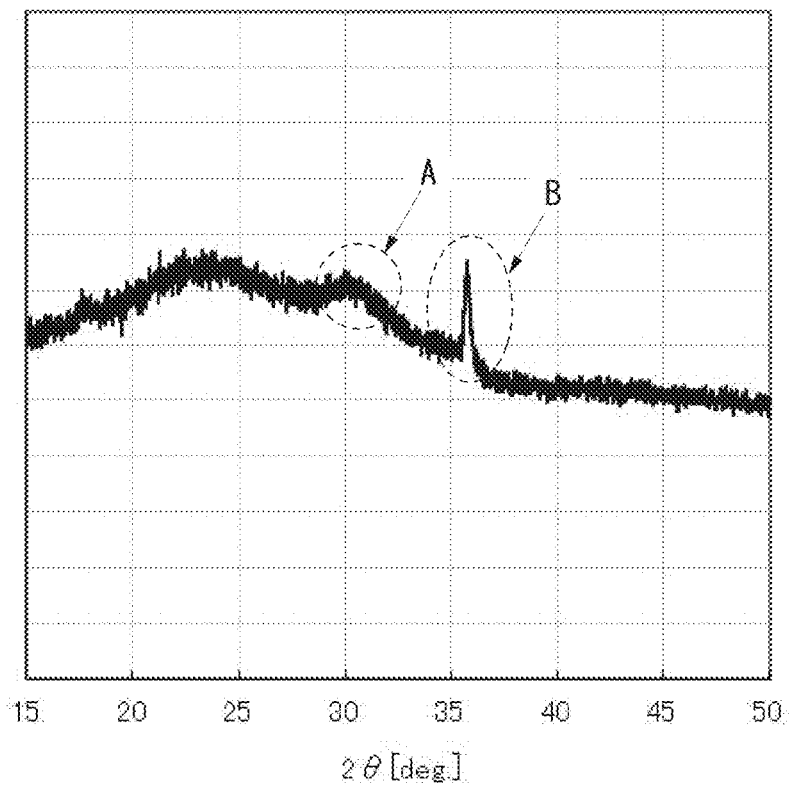
Figure 41A:
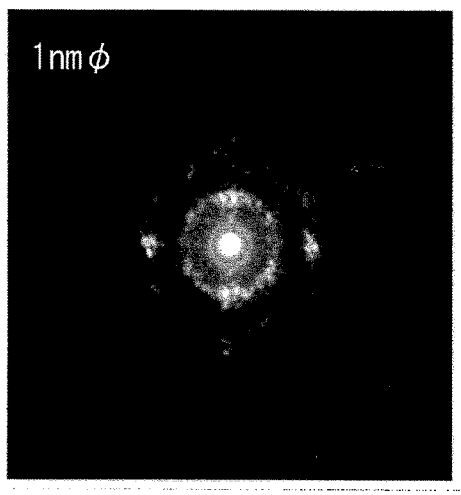
FIGS. 41A to 41D are electron diffraction patterns of a CAAC-OS film.
Figure 41B:
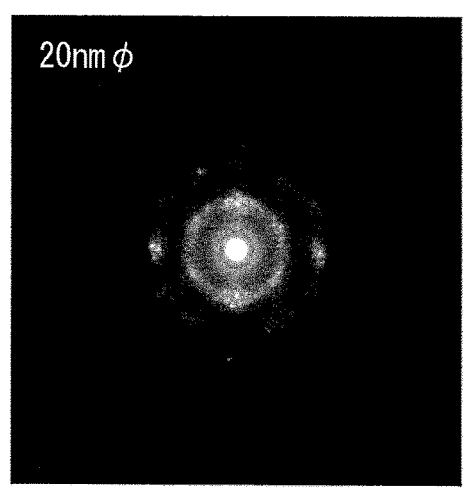
Figure 41C:
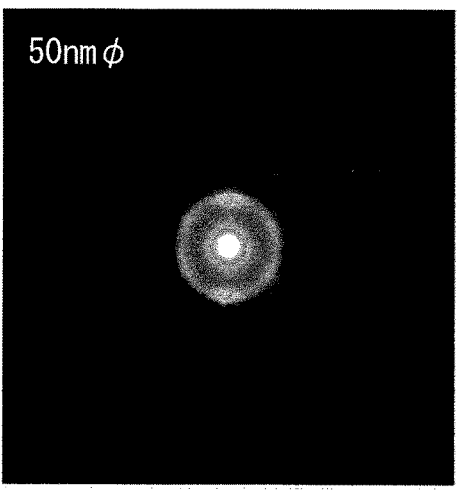
Figure 41D:
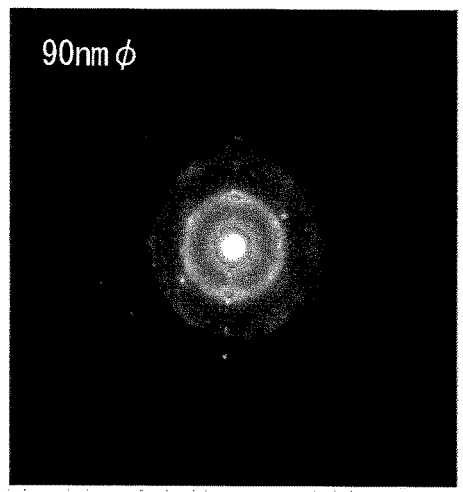

FIGS. 40A and 40B are a cross-sectional TEM image and an X-ray diffraction spectrum of a CAAC-OS film different from the CAAC-OS film used for the cross-sectional TEM image of FIG. 36A and the cross-sectional TEM observation of FIG. 36A. The CAAC-OS film has a variety of forms, and as shown in FIG. 40B, as well as Peak A indicating a crystal component around 2θ=31°, Peak B which is derived from a spinel crystal structure appears in some cases.

FIGS. 41A to 41D show results of electron diffraction in regions in the CAAC-OS film with electron-beam diameters of 1 nm$\phi$, 20 nm$\phi$, 50 nm$\phi$, and 90 nm$\phi$. The regions are indicated by concentric circles in FIG. 40A. In the case of an electron-beam diameter of 1 nm$\phi$, a pattern formed by clear spots (bright points) can be observed. As the electron-beam diameter is increased, the spots (bright points) become unclear but a diffraction pattern can be observed. Further, in the case of a beam diameter of 90 nm$\phi$, clearer spots (bright points) can be observed. Accordingly, the whole film is a CAAC-OS film or a film including a CAAC-OS film.

This embodiment can be combined as appropriate with any of the other embodiments in this specification.

Embodiment 7

A semiconductor device (also referred to as a display device) including a display device can be manufactured using the transistor and the capacitor examples of which are described in the above embodiments. Moreover, some or all of the driver circuits which include the transistor can be formed over a substrate where the pixel portion is formed, whereby a system-on-panel can be obtained. In this embodiment, an example of a display device using the transistor examples of which are shown in the above embodiments is described with reference to FIGS. 12A to 12C, FIG. 13, and FIGS. 14A to 14C. FIG. 13 is a cross-sectional view illustrating a cross-sectional portion taken along the dashed-dotted line M-N in FIG. 12B. Note that in FIG. 13, only part of the structure of the pixel portion is illustrated.

Figure 12A:
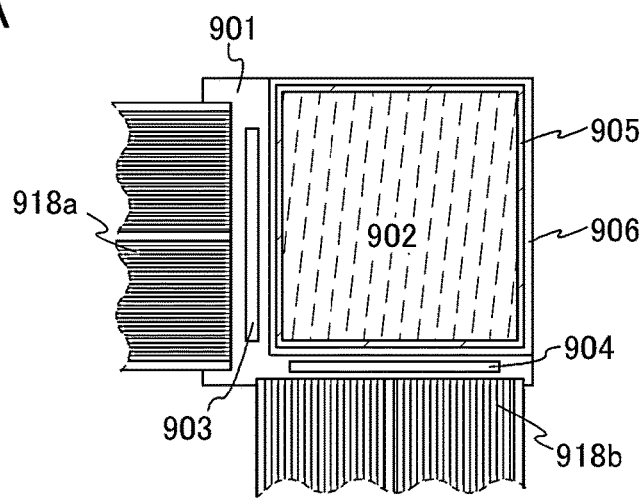
FIGS. 12A to 12C are top views each illustrating a semiconductor device of one embodiment of the present invention.
Figure 13:
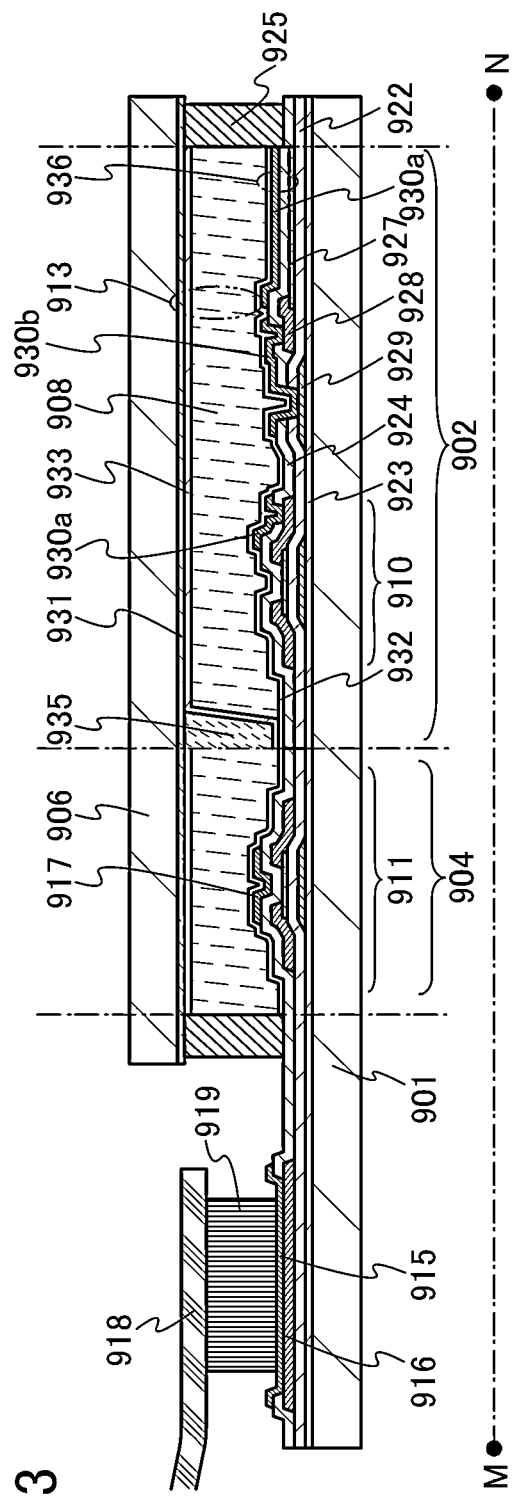
FIG. 13 is a cross-sectional view illustrating a semiconductor device of one embodiment of the present invention.

In FIG. 12A, a sealant 905 is provided so as to surround a pixel portion 902 provided over a first substrate 901, and the pixel portion 902 is sealed with a second substrate 906. In FIG. 12A, a signal line driver circuit 903 and a scan line driver circuit 904 each are formed using a single crystal semiconductor or a polycrystalline semiconductor over a substrate prepared separately, and mounted in a region different from the region surrounded by the sealant 905 over the first substrate 901. Further, various signals and potentials are supplied to the signal line driver circuit 903, the scan line driver circuit 904, and the pixel portion 902 from flexible printed circuits (FPCs) 918*a* and 918*b*.

Figure 12B:
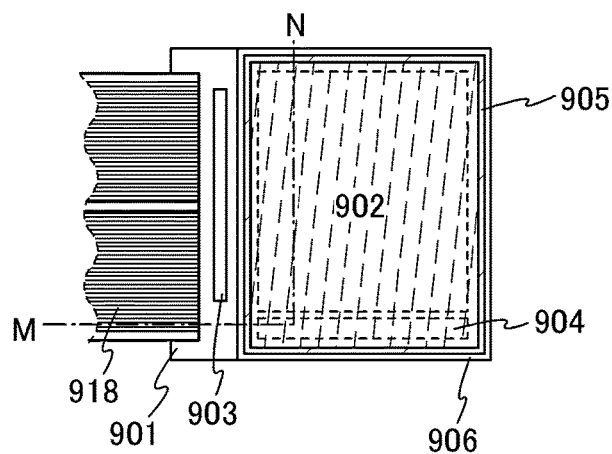
Figure 12C:
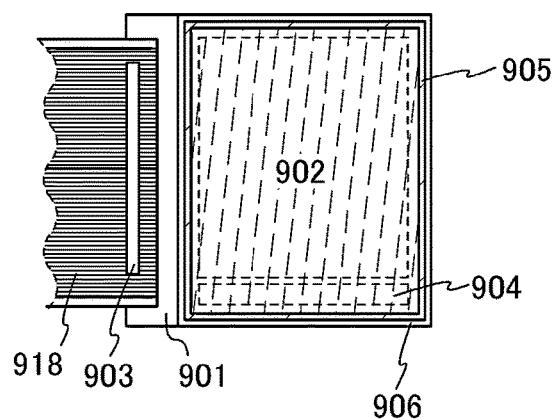

In FIGS. 12B and 12C, the sealant 905 is provided so as to surround the pixel portion 902 and the scan line driver circuit 904 which are provided over the first substrate 901. The second substrate 906 is provided over the pixel portion 902 and the scan line driver circuit 904. Thus, the pixel portion 902 and the scan line driver circuit 904 are sealed together with a display element by the first substrate 901, the sealant 905, and the second substrate 906. In FIGS. 12B and 12C, a signal line driver circuit 903 which is formed using a single crystal semiconductor or a polycrystalline semiconductor over a substrate separately prepared is mounted in a region different from the region surrounded by the sealant 905 over the first substrate 901. In FIGS. 12B and 12C, various signals and potentials are supplied to the signal line driver circuit 903, the scan line driver circuit 904, and the pixel portion 902 from an FPC 918.

Although FIGS. 12B and 12C each illustrate an example in which the signal line driver circuit 903 is formed separately and mounted on the first substrate 901, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method or the like can be used. FIG. 12A shows an example in which the signal line driver circuit 903 and the scan line driver circuit 904 are mounted by a COG method. FIG. 12B shows an example in which the signal line driver circuit 903 is mounted by a COG method. FIG. 12C shows an example in which the signal line driver circuit 903 is mounted by a TAB method.

The display device includes, in its category, a panel in which a display element is sealed, and a module in which an IC or the like including a controller is mounted on the panel.

Note that the display device in this specification refers to an image display device or a display device. The display device may serve as a light source (including a lighting device). Furthermore, the display device also includes the following modules in its category: a module to which a connector such as an FPC, or a TCP is attached; a module having a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors which are described in the above embodiments can be used.

As the display element provided in the display device, a liquid crystal element (also referred to as liquid crystal display element) or a light-emitting element (also referred to as light-emitting display element) can be used. A light-emitting element includes, in its scope, an element whose luminance is controlled by current or voltage, and specifically includes an inorganic electroluminescent (EL) element, an organic EL element, and the like. Furthermore, a display medium whose contrast is changed by an electric effect, such as electronic ink, can be used. FIG. 13 illustrates an example of a liquid crystal display device using a liquid crystal element as a display element.

The liquid crystal display device illustrated in FIG. 13 is a vertical electric field mode liquid crystal display device. The liquid crystal display device includes a connection terminal electrode 915 and a terminal electrode 916. The connection terminal electrode 915 and the terminal electrode 916 are electrically connected to a terminal included in the FPC 918 through an anisotropic conductive agent 919.

The connection terminal electrode 915 is formed using the same conductive film as a first electrode 930*a*. The terminal electrode 916 is formed using the same conductive film as source and drain electrodes of transistors 910 and 911.

Further, the pixel portion 902 and the scan line driver circuit 904 which are provided over the first substrate 901 each include a plurality of transistors, and the transistor 910 included in the pixel portion 902 and the transistor 911 included in the scan line driver circuit 904 are illustrated as an examples. An insulating film 924 corresponding to the insulating films 129, 131, and 133 described in Embodiment 1 is provided over the transistors 910 and 911. Note that an insulating film 923 is an insulating film serving as a base film.

In this embodiment, any of the transistors provided in the pixel described in Embodiments 1 to 3 can be applied to the transistor 910. Further, any of the transistors described in Embodiments 1 to 3, which is provided in the scan line driver circuit, can be applied to the transistor 911. A capacitor 936 is formed using an oxide semiconductor film 927, the insulating films 924, and the first electrode 930*a*. The oxide semiconductor film 927 is connected to a capacitor line 929 through an electrode 928 and an electrode 930*b*. The electrode 928 is formed using the same conductive film as the source and drain electrodes of each of the transistors 910 and 911. The electrode 930*b* is formed using the same conductive film as the first electrode 930*a*. The capacitor line 929 is formed using the same conductive film as a gate electrode of each of the transistors 910 and 911. Although the example in which the capacitor described in Embodiment 1 is used as the capacitor 926 is described here, any of the capacitors in the other embodiments may be used as appropriate.

The transistor 910 provided in the pixel portion 902 is electrically connected to the display element to form a display panel. There is no particular limitation on the kind of the display element as long as display can be performed, and various kinds of display elements can be employed.

A liquid crystal element 913 which is a display element includes the first electrode 930a, a second electrode 931, and a liquid crystal layer 908. An insulating film 932 and an insulating film 933 which serve as alignment films are provided so that the liquid crystal layer 908 is interposed therebetween. The second electrode 931 is provided on the second substrate 906 side, and the first electrode 930a overlaps with the second electrode 931 with the liquid crystal layer 908 interposed therebetween.

The first electrode and the second electrode (each of which may be called a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

The first electrode 930a and the second electrode 931 can be formed using materials similar to those for the electrode 121a and the pixel electrode 121b described in Embodiment 1 as appropriate.

A spacer 935 is a columnar spacer obtained by selective etching of an insulating film and is provided in order to control the distance between the first electrode 930a and the second electrode 931 (a cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed is used for the liquid crystal layer in order to improve the temperature range. Note that the alignment film is formed using an organic resin containing hydrogen, water, or the like, which might degrade the electrical characteristics of the transistor in the semiconductor device of one embodiment of the present invention. In view of the above, the use of liquid crystal which exhibits a blue phase for the liquid crystal layer enables fabrication of the semiconductor device that is an embodiment of the present invention without an organic resin, so that the semiconductor device can be highly reliable.

The first substrate 901 and the second substrate 906 are fixed in place by the sealant 925. As the sealant 925, an organic resin such as a thermosetting resin or a photocurable resin can be used. The sealant 925 is in contact with the insulating film 924. Note that the sealant 925 corresponds to the sealant 905 illustrated in FIGS. 12A to 12C.

The sealant 925 is provided over the insulating film 924. The uppermost layer of the insulating film 924 is a nitride insulating film, and can suppress entry of impurities such as hydrogen and water from the outside. Thus, variations in the electrical characteristics of the transistors 910 and 911 can be suppressed.

In the liquid crystal display device, a black matrix (light-blocking film), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

Since the transistor is easily broken owing to static electricity or the like, a protective circuit for protecting the driver circuit is preferably provided. The protection circuit is preferably formed using a nonlinear element.

Figure 14A:
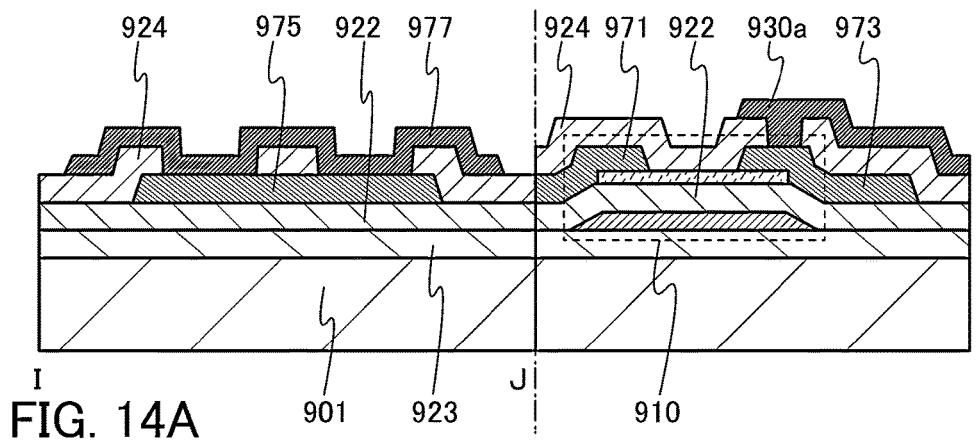
FIGS. 14A to 14C are cross-sectional views and a top view each illustrating a semiconductor device of one embodiment of the present invention.
Figure 14B:
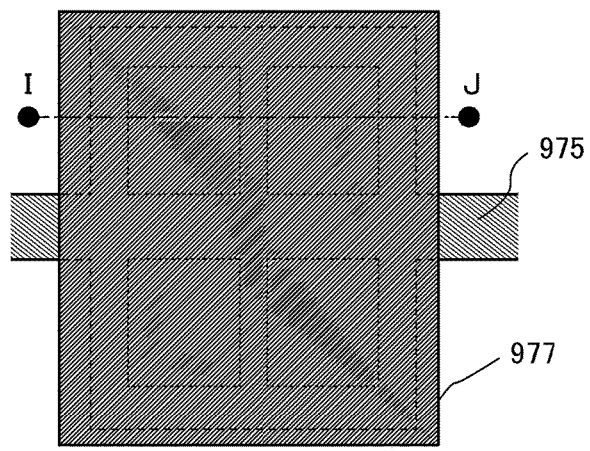
Figure 14C:
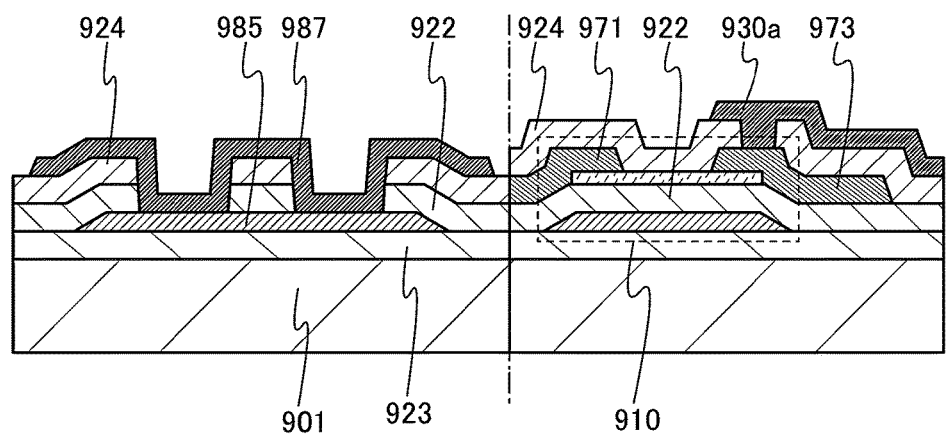

FIGS. 14A to 14C illustrate examples of the liquid crystal display device in FIG. 13 in which a common connection portion (pad portion) for being electrically connected to the second electrode 931 provided on the substrate 906 is formed over the substrate 901.

The common connection portion is provided in a position that overlaps with the sealant for bonding the substrate 901 and the substrate 906, and is electrically connected to the second electrode 931 through conductive particles contained in the sealant. Alternatively, the common connection portion is provided in a position that does not overlap with the sealant (except for the pixel portion) and a paste containing conductive particles is provided separately from the sealant so as to overlap with the common connection portion, whereby the common connection portion is electrically connected to the second electrode 931.

FIG. 14A is a cross-sectional view of the common connection portion taken along the line I-J in a top view of FIG. 14B.

A common potential line 975 is provided over the gate insulating film 922 and is formed using the same material and through the same steps as a source electrode 971 and a drain electrode 973 of the transistor 910 illustrated in FIGS. 14A to 14C.

Further, the common potential line 975 is covered with the insulating film 924, and a plurality of openings are formed in the insulating film 924 at positions overlapping the common potential line 975. These openings are formed through the same steps as a contact hole which connects the first electrode 930a and one of the source electrode 971 and the drain electrode 973 of the transistor 910.

Further, the common potential line 975 is connected to the common electrode 977 through the openings. The common electrode 977 is provided over the interlayer insulating film 934 and formed using the same material and through the same steps as the connection terminal electrode 915 and the first electrode 930a in the pixel portion.

In this manner, the common connection portion can be manufactured in the same process as the switching element in the pixel portion 902.

The common electrode 977 is an electrode in contact with the conductive particles contained in the sealant, and is electrically connected to the second electrode 931 of the substrate 906.

As illustrated in FIG. 14C, a common potential line 985 may be formed using the same material and through the same steps as the gate electrode of the transistor 910.

In the common connection portion in FIG. 14C, the common potential line 985 is provided under the gate insulating film 922 and the insulating film 924, and a plurality of openings are formed in the gate insulating film 922 and the insulating film 924 at positions overlapping with the common potential line 985. These openings are formed by etching the insulating film 924 and further selectively etching the gate insulating film 922, through the same steps as a contact hole which connects the first electrode 930a and one of the source electrode 971 and the drain electrode 973 of the transistor 910.

Further, the common potential line 985 is connected to the common electrode 987 through the openings. The common electrode 987 is provided over the insulating film 924 and formed using the same material and through the same steps as the connection terminal electrode 915 and the first electrode 930a in the pixel portion.

As described above, the use of the transistor and capacitor described in any of the above embodiments allows fabrication of a semiconductor device including the capacitor whose charge capacity is increased while the aperture ratio is improved. As a result, the semiconductor device can have excellent display quality.

Further, oxygen vacancies and impurities such as hydrogen in the oxide semiconductor film, which is a semiconductor film included in the transistor, are reduced, so that the semiconductor device of one embodiment of the present invention has favorable electrical characteristics.

Note that the structures and the like described in this embodiment can be combined as appropriate with any of the structures and the like described in the other embodiments.

Embodiment 8

In this embodiment, a human interface device to which the semiconductor device of one embodiment of the present invention can be applied is described. In particular, a structure example of a sensor capable of sensing the proximity or contact of an object (hereinafter, referred to as a touch sensor) is described.

For a touch sensor, a variety of types such as a capacitive type, a resistive type, a surface acoustic wave type, an infrared type, and an optical type can be used.

Examples of the capacitive touch sensor are typically of a surface capacitive type and a projected capacitive type. Further, examples of the projected capacitive type are of a self capacitive type and a mutual capacitive type mainly in accordance with the difference in the driving method. A manual capacitive touch sensor is preferably employed, in which case multiple points can be sensed simultaneously (i.e., multiple point sensing or multi-touch).

Although a touch sensor is described in detail here, a sensor capable of sensing the movement (gesture) of an object (e.g., a finger or a hand), the movement of user's eyes, and the like with a camera (including an infrared camera) or the like can also be used as a human interface device.

[Example of Detection Method of Sensor]

Figure 20A:
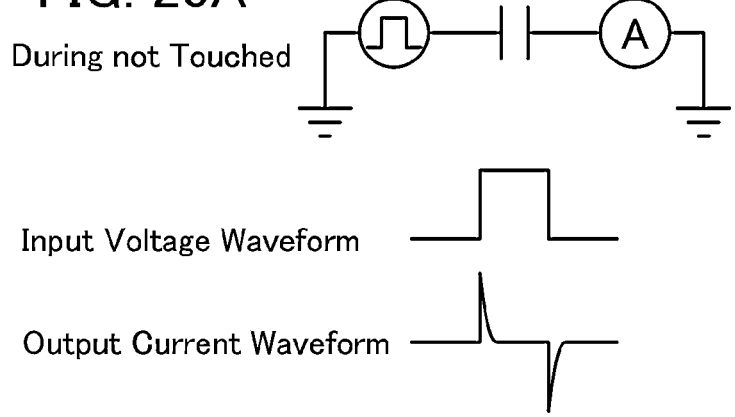
FIGS. 20A to 20C illustrate a touch sensor of one embodiment of the present invention.
Figure 20B:
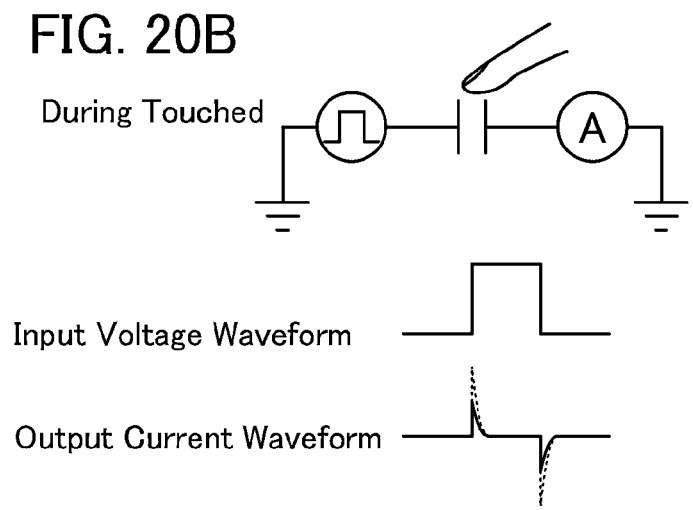

FIGS. 20A and 20B are schematic diagrams illustrating structures of a mutual capacitive touch sensor and input and output waveforms. The touch sensor includes a capacitor having a pair of electrodes. Input voltage is input to one of the pair of electrodes. Further, a detection circuit which detects current flowing through the other electrode (or a potential of the other electrode) is provided.

For example, in the case where a rectangular wave is used as an input voltage waveform as illustrated in FIG. 20A, a waveform having a sharp peak is detected as an output current waveform.

Further, in the case where a conductive object is close to or touches a capacitor as illustrated in FIG. 20B, the capacitance value between the electrodes is decreased; accordingly, the current value is decreased.

By detecting a change in capacitance by using a change in output current (or potential) with respect to input voltage in this manner, the proximity or contact of an object can be detected.

[Structure Example of Touch Sensor]

Figure 20C:
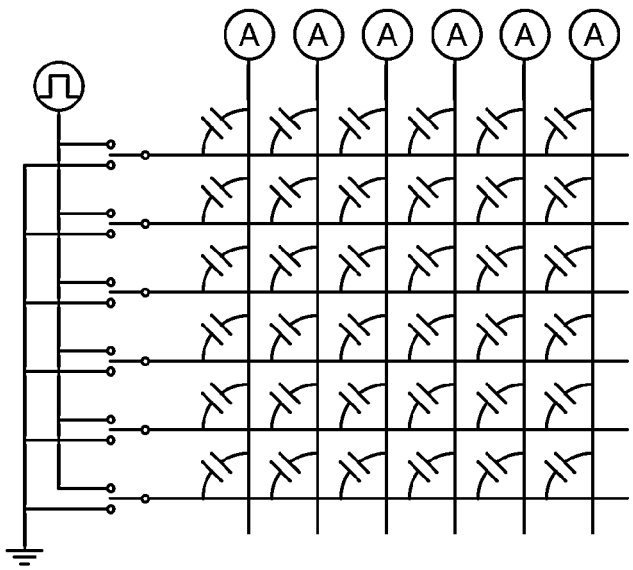

FIG. 20C illustrates a structure example of a touch sensor provided with a plurality of capacitors arranged in a matrix.

The touch sensor includes a plurality of wirings extending in the X direction (the horizontal direction of this figure) and a plurality of wirings extending in the Y direction (the vertical direction of this figure) which intersect with the plurality of wirings. Capacitance is formed between two wirings intersecting with each other.

One of input voltage and a common potential (including a grounded potential and a reference potential) is input to each of the wirings extending in the X direction. Further, a detection circuit (e.g., a source meter or a sense amplifier) is electrically connected to the wirings extending in the Y direction and can detect current (or potential) flowing through the wirings.

The touch sensor is capable of two-dimensional sensing of an object in such a manner that the touch sensor sequentially scans the plurality of wirings extending in the X direction so that input voltage is input and detects a change in current (or potential) flowing through the wirings extending in the Y direction.

[Structure Example of Touchscreen]

A structure example of a touchscreen including a touch sensor and a display portion including a plurality of pixels and a case where the touchscreen is incorporated in an electronic appliance are described below.

Figure 21A:
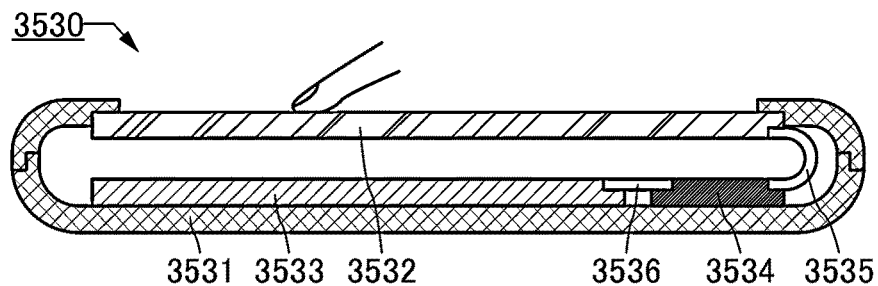
FIG. 21A illustrates a structure example of an electronic appliance of one embodiment of the present invention and FIGS. 21B to 21E each illustrate a structure example of a touchscreen of one embodiment of the present invention.

FIG. 21A is a schematic cross-sectional view of an electronic appliance including a touchscreen.

An electronic appliance 3530 includes a housing 3531 and at least a touchscreen 3532, a battery 3533, and a control portion 3534, which are provided in the housing 3531. The touchscreen 3532 is electrically connected to the control portion 3534 through a wiring 3535. The control portion 3534 controls image display on a display portion and the sensing operation of the touch sensor. The battery 3533 is electrically connected to the control portion 3534 through a wiring 3536 to supply electric power to the control portion 3534.

The touchscreen 3532 is provided so that its surface is not covered. An image can be displayed on the exposed surface of the touchscreen 3532 and the proximity or the contact of an object can be detected.

FIGS. 21B to 21E each illustrate a structure example of a touchscreen.

Figure 21B:
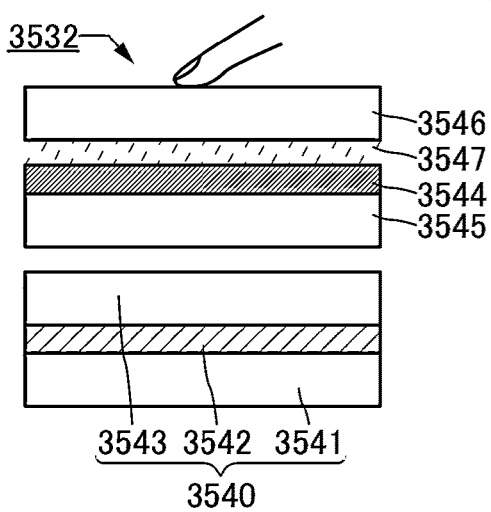

The touchscreen 3532 illustrated in FIG. 21B includes a display panel 3540 in which a display portion 3542 is provided between a first substrate 3541 and a second substrate 3543, a third substrate 3545 provided with a touch sensor 3544, and a protective substrate 3546.

As the display panel 3540, a variety of display devices such as a display device including a liquid crystal element or an organic electroluminescence (EL) element and an electronic paper can be used. Note that the touchscreen 3532 may additionally include a backlight, a polarizing plate, and the like in accordance with the structure of the display panel 3540.

An object comes in contact with or close to one of the surfaces of the protective substrate 3546; thus, the mechanical strength of at least the surface is preferably high. For example, a tempered glass which has been subjected to physical or chemical treatment by an ion exchange method, a thermal tempering method, or the like and has a surface to which compressive stress has been applied can be used as the protective substrate 3546. Alternatively, a flexible substrate with a coated surface, such as a plastic substrate can be used. Note that a protective film or an optical film may be provided over the protective substrate 3546.

The touch sensor 3544 is provided on at least one of the surfaces of the third substrate 3545. Alternatively, a pair of electrodes included in the touch sensor 3544 may be formed on both surfaces of the third substrate 3545. A flexible film may be used as the third substrate 3545 for thickness reduction of the touchscreen. The touch sensor 3544 may be held between a pair of substrates (provided with a film).

Although the protective substrate 3546 and the third substrate 3545 provided with the touch sensor 3544 are bonded to each other by a bonding layer 3547 in FIG. 21B, the protective substrate 3546 and the third substrate 3545 are not necessarily bonded to each other. The third substrate 3545 and the display panel 3540 may be bonded to each other by the bonding layer 3547.

In the touchscreen 3532 illustrated in FIG. 21B, the display panel and the substrate provided with the touch sensor are separately provided. The touchscreen having such a structure can also be referred to as an externally attached touchscreen. In such a structure, the display panel and the substrate provided with the touch sensor are separately formed and then they are overlapped with each other, so that the display panel can have a touch sensor function. Thus, the touchscreen can be easily manufactured without a special manufacturing process.

Figure 21C:
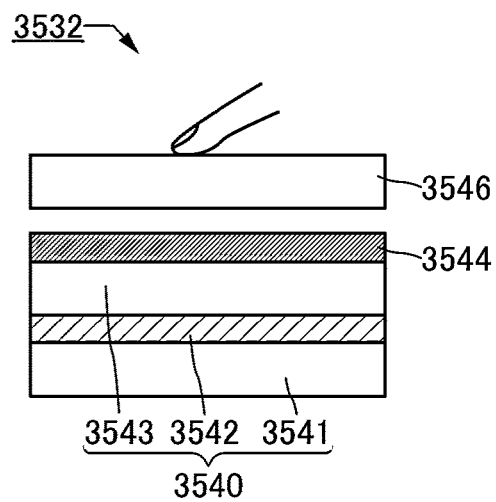

In the touchscreen 3532 illustrated in FIG. 21C, the touch sensor 3544 is provided on a surface of the second substrate 3543 which is on the protective substrate 3546 side. The touchscreen having such a structure can also be referred to as an on-cell touchscreen. With such a structure, the number of substrates needed can be reduced, which results in reductions in the thickness and weight of the touchscreen.

Figure 21D:
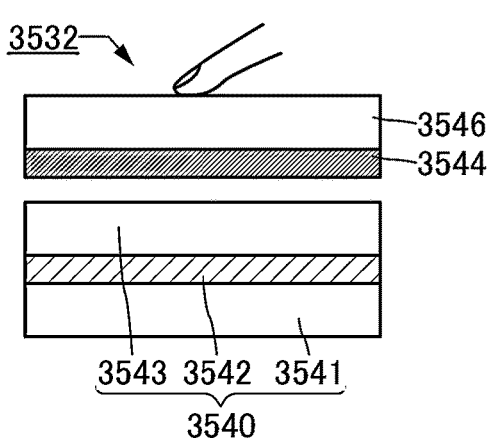

In the touchscreen 3532 illustrated in FIG. 21D, the touch sensor 3544 is provided on one of the surfaces of the protective substrate 3546. With such a structure, the display panel and the touch sensor can be separately manufactured; thus, the touchscreen can be easily manufactured. Furthermore, the number of substrates needed can be reduced, which results in reductions in the thickness and weight of the touchscreen.

Figure 21E:
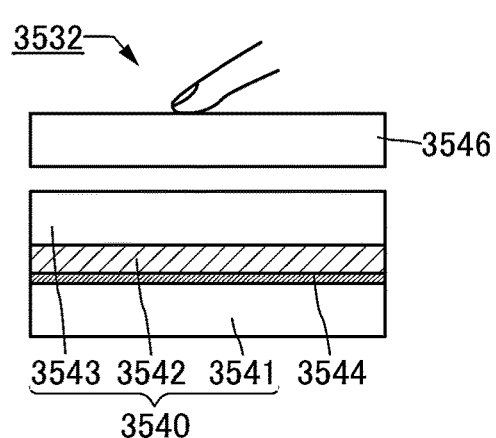

In the touchscreen 3532 illustrated in FIG. 21E, the touch sensor 3544 is provided between the pair of substrates in the display panel 3540. The touchscreen having such a structure can also be referred to as an in-cell touchscreen. With such a structure, the number of substrates needed can be reduced, which results in reductions in the thickness and weight of the touchscreen. Such a touchscreen can be achieved, for example, in such a manner that a circuit functioning as a touch sensor is formed using a transistor, a wiring, an electrode, and the like included in the display portion 3542 on the first substrate 3541 or the second substrate 3543. Further, in the case of using an optical touch sensor, a photoelectric conversion element may be provided.

[Structure Example of In-Cell Touchscreen]

A structure example of a touchscreen incorporating a touch sensor into a display portion including a plurality of pixels is described below. Here, an example in which a liquid crystal element is used as a display element provided in the pixel is described.

Figure 22A:
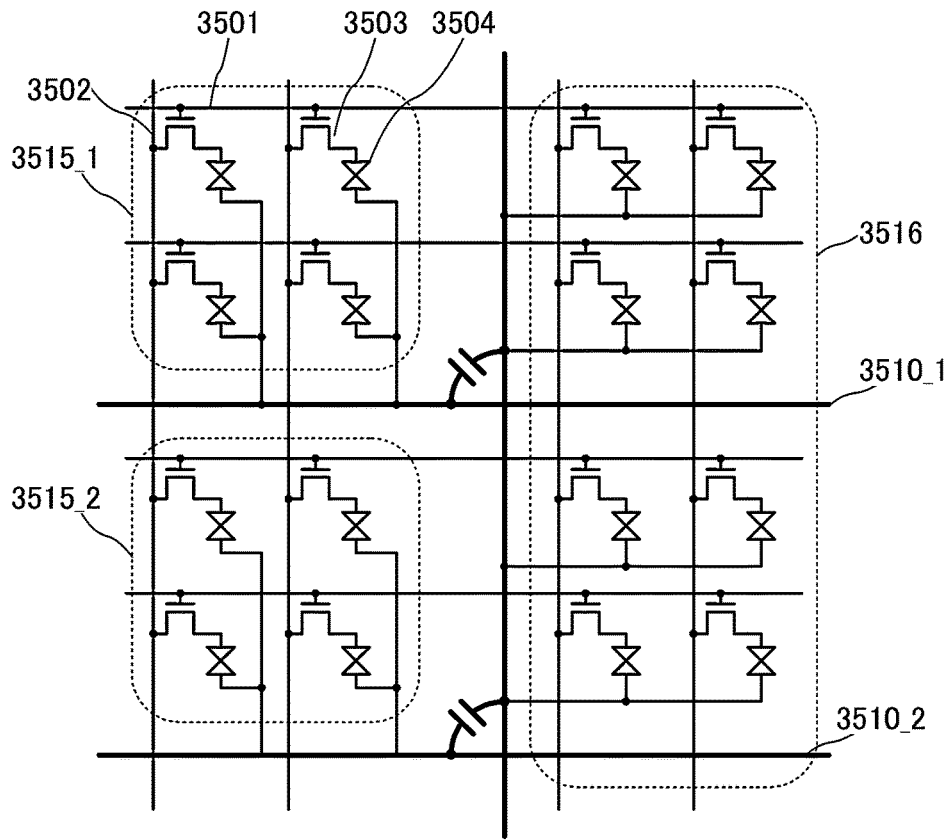
FIGS. 22A and 22B illustrate a pixel provided with a touch sensor of one embodiment of the present invention.

FIG. 22A is an equivalent circuit diagram of part of a pixel circuit provided in the display portion of the touch panel described in this structure example Each pixel includes at least a transistor 3503 and a liquid crystal element 3504. A gate of the transistor 3503 is electrically connected to a wiring 3501, and one of a source and a drain of the transistor 3503 is electrically connected to a wiring 3502.

The pixel circuit includes a plurality of wirings extending in the X direction (e.g., a wiring 3510_1 and a wiring 3510_2) and a plurality of wirings extending in the Y direction (e.g., wirings 3511). These wirings are provided to intersect with each other, and capacitance is formed therebetween.

Among the pixels provided in the pixel circuit, ones of electrodes of the liquid crystal elements of some pixels adjacent to each other are electrically connected to each other to form one block. The block is classified into two types: an island-shaped block (e.g., a block 3515_1 or a block 3515_2) and a linear block (e.g., a block 3516) extending in the Y direction. Note that although only part of the pixel circuit is illustrated in FIG. 22A, units each including these two kinds of blocks are continuously arranged in the X direction and the Y direction in an actual pixel circuit.

The wiring 3510_1 (or wiring 3510_2) extending in the X direction is electrically connected to the island-shaped block 3515_1 (or the block 3515_2). Although not illustrated, the wiring 3510_1 extending in the X direction is electrically connected to a plurality of island-shaped blocks 3515_1 which are provided discontinuously along the X direction with the linear blocks therebetween. Further, the wiring 3511 extending in the Y direction is electrically connected to the linear block 3516.

Figure 22B:
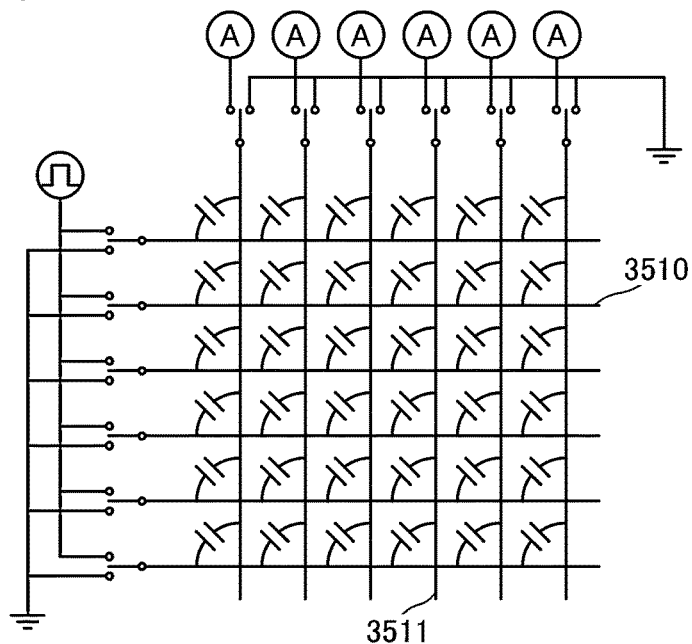

FIG. 22B is an equivalent circuit diagram illustrating the connection between a plurality of wirings 3510 extending in the X direction and the plurality of wirings 3511 extending in the Y direction. Input voltage or a common potential can be input to each of the wirings 3510 extending in the X direction. Further, a ground potential can be input to each of the wirings 3511 extending in the Y direction, or the wirings 3511 can be electrically connected to the detection circuit.

[Operation Example of Touchscreen]

Operation of the above-described touchscreen is described with reference to FIGS. 23A to 23C.

Figure 23A:
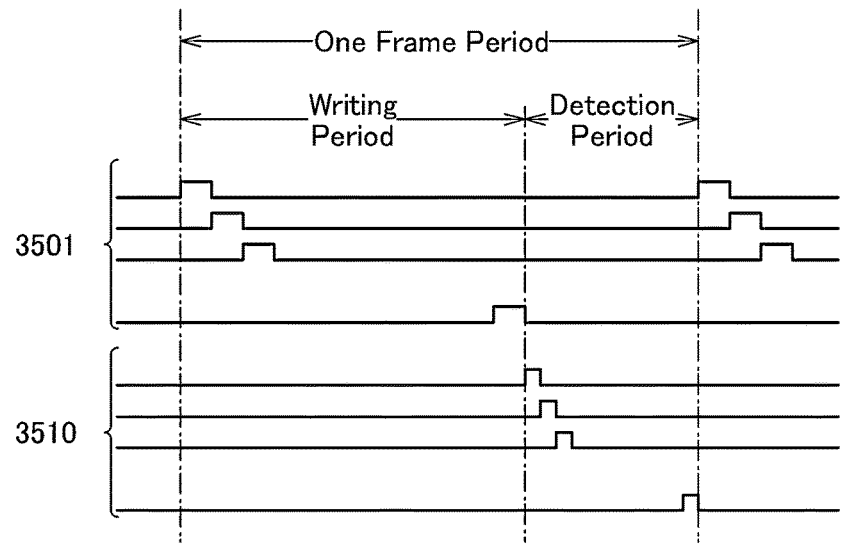
FIGS. 23A to 23C illustrate operation of a touch sensor and pixels of one embodiment of the present invention.

As illustrated in FIG. 23A, one frame period is divided into a writing period and a detecting period. The writing period is a period in which image data is written to a pixel, and the wirings 3510 (also referred to as gate lines) are sequentially selected. On the other hand, the detecting period is a period in which sensing is performed by a touch sensor, and the wirings 3510 extending in the X direction are sequentially selected and input voltage is input.

Figure 23B:
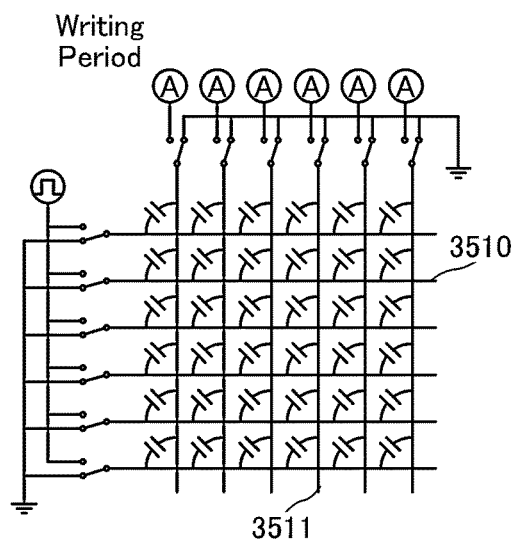

FIG. 23B is an equivalent circuit diagram in the writing period. In the wiring period, a common potential is input to both the wiring 3510 extending in the X direction and the wiring 3511 extending in the Y direction.

Figure 23C:
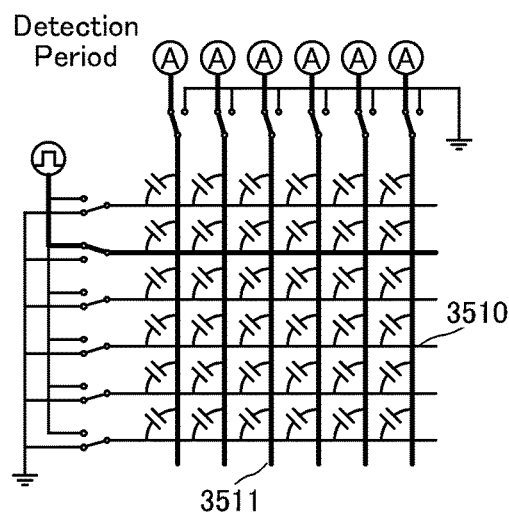

FIG. 23C is an equivalent circuit diagram at some point in time in the detection period. In the detection period, each of the wirings 3511 extending in the Y direction is electrically connected to the detection circuit. Input voltage is input to the wirings 3510 extending in the X direction which are selected, and a common potential is input to the wirings 3510 extending in the X direction which are not selected.

It is preferable that a period in which an image is written and a period in which sensing is performed by a touch sensor be separately provided as described above. Thus, a decrease in the sensitivity of the touch sensor caused by noise generated when data is written to a pixel can be suppressed.

[Structure Example of Pixel]

Structure examples of a pixel which can be used for the above touchscreen are described below.

Figure 24A:
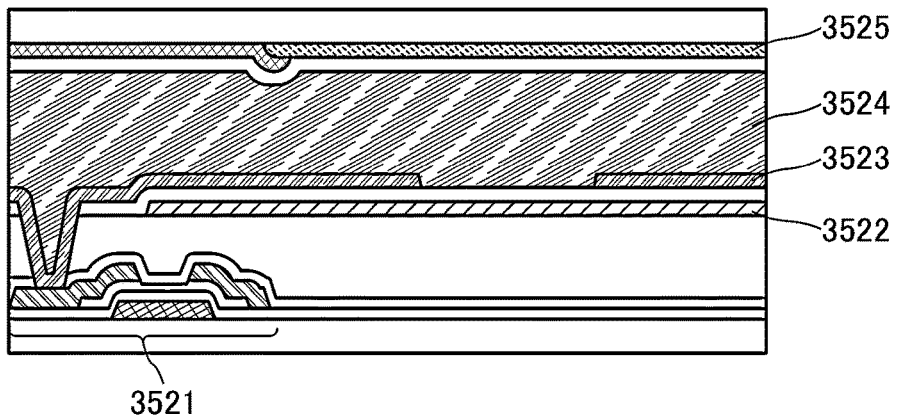
FIGS. 24A to 24C each illustrate a structure of a pixel of one embodiment of the present invention.

FIG. 24A is a cross-sectional schematic view illustrating part of a pixel having a fringe field switching (FFS) mode.

The pixel includes a transistor 3521, an electrode 3522, an electrode 3523, a liquid crystal 3524, and a color filter 3525. The electrode 3523 having an opening is electrically connected to one of a source and a drain of the transistor 3521. The electrode 3523 is provided over the electrode 3522 with an insulating layer therebetween. The electrode 3523 and the electrode 3522 can each function as one electrode of a liquid crystal element. By applying voltage to the electrode 3523 and the electrode 3522 so that a potential difference is generated therebetween, alignment of liquid crystals can be controlled.

For example, the electrode 3522 is electrically connected to the above-described wiring 3510 or wiring 3511; thus, the pixel of the above-described touch panel can be formed.

Note that the electrode 3522 can be provided over the electrode 3523. In that case, the electrode 3522 may have an opening and may be provided over the electrode 3523 with an insulating layer therebetween.

Figure 24B:
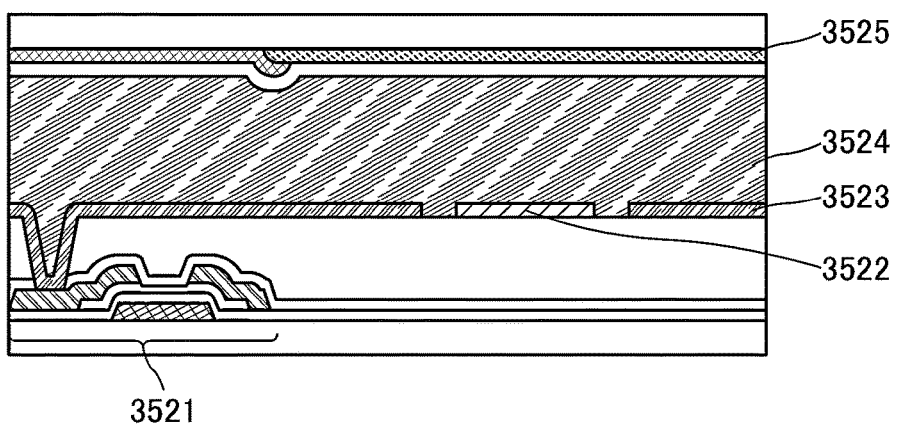

FIG. 24B is a cross-sectional schematic view illustrating part of a pixel having an in-plane-switching (IPS) mode.

The electrode 3523 and electrode 3522 provided in the pixel each have a comb-like shape and are provided on the same plane so as to engage with each other and be apart from each other.

Figure 24C:
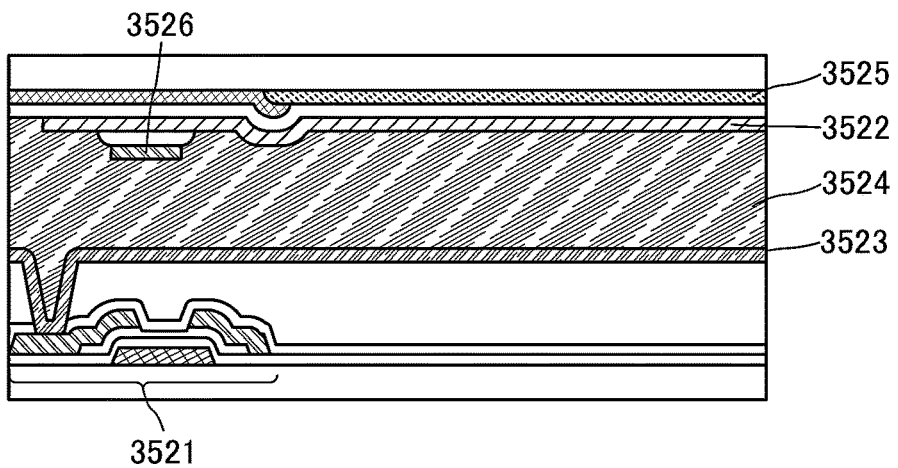

For example, the electrode 3522 is electrically connected to the above-described wiring 3510 or wiring 3511; thus, the pixel of the above-described touch panel can be formed FIG. 24C is a cross-sectional schematic view illustrating part of a pixel having a vertical alignment (VA) mode.

The electrode 3522 is provided so as to face the electrode 3523 with the liquid crystal 3524 therebetween. The wiring 3526 is provided on the electrode 3522. For example, the wiring 3526 can be provided to electrically connect the block including the pixel illustrated in FIG. 24C and blocks different from the block including the pixel illustrated in FIG. 24C.

For example, the electrode 3522 is electrically connected to the above-described wiring 3510 or wiring 3511; thus, the pixel of the above-described touch panel can be formed.

This embodiment can be combined with any of the other embodiments disclosed in this specification as appropriate.

Embodiment 9

In this embodiment, a structure of an information processor including the transistor described as an example of one embodiment of the present invention is described with reference to drawings.

Specifically, description is given on an information processor which has a first mode in which a G signal for selecting a pixel is output at a rate of 30 Hz (30 times per second) or more, preferably more than or equal to 60 Hz (60 times per second) and less than 960 Hz (960 times per second) and a second mode in which the G signal is output at a rate of more than or equal to 11.6 µHz (once per day) and less than 0.1 Hz (0.1 times per second), preferably more than or equal to 0.28 mHz (once per hour) and less than 1 Hz (once per second).

When a still image is displayed with this information processor, the refresh rate can be set to less than 1 Hz, preferably less than or equal to 0.2 Hz. This enables eye-friendly display, i.e., display which causes less eye fatigue to a user or display which does not put strain on the user's eyes. Further, a display image can be refreshed at an optimal rate in accordance with the quality of the image displayed on the display portion. Specifically, in displaying a still image, the refresh rate can be set lower than in displaying a smooth moving image; thus, a still image with less flicker can be displayed and power consumption can be reduced.

Figure 26A:
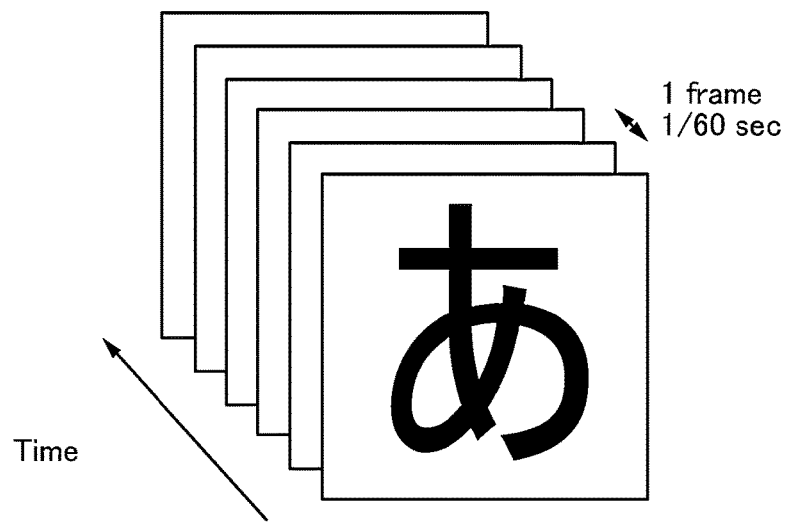
FIGS. 26A and 26B are views for explaining nervous asthenopia.
Figure 26B:
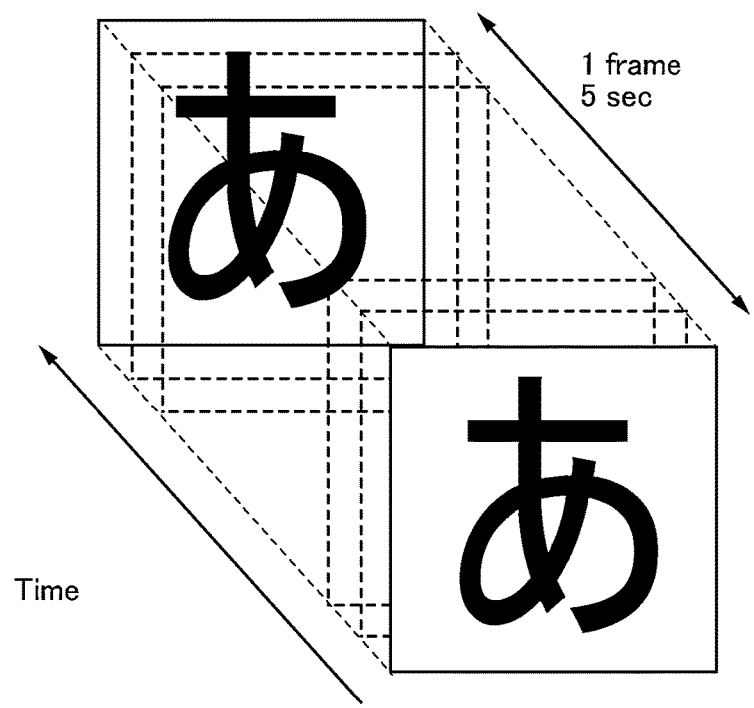

FIGS. 26A and 26B are views for explaining nervous asthenopia.

FIGS. 27A and 27B are views for explaining muscular asthenopia.

<Eye Fatigue>

Here, eye fatigue is described. Eye fatigue is classified into two categories: nervous asthenopia and muscular asthenopia.

Nervous asthenopia is caused when a user keeps looking at light emitted from a display portion or blinking images for a long time. This is because the brightness stimulates and fatigues the retina or nerve of the eye or the brain. Frequent blinking of fluorescent light or a display portion of a conventional display device, which is called flicker, causes nervous asthenopia.

The muscle strain is caused by overuse of a ciliary muscle which works for adjusting the focus.

FIG. 26A is a schematic view showing display on a conventional display portion. In the display on the conventional display portion, image rewriting is performed 60 times per second. When a user keeps looking at such display for a long time, the retina or nerve of the eye or the brain might be stimulated and eye fatigue might be caused as a result.

FIG. 26B schematically shows display of an information processor described in this embodiment. In the information processor in this embodiment, the rate at which the G signal for selecting a pixel is output can be changed. In particular, a transistor with extremely low off-state current is used in a pixel portion of a display portion; thus, frame frequency can be lowered while flicker is reduced. For example, an image can be rewritten as less frequently as once every five seconds. This enables the user to see the same one image, so that flickers on the screen perceived by the user are reduced. Thus, stimuli to the retina or nerve of the eye or the brain of the user are reduced, and nervous asthenopia is reduced accordingly.

Note that a transistor including an oxide semiconductor, particularly a transistor including a CAAC-OS film is suitably used as a transistor with extremely low off-state current.

As shown in FIG. 27A, when the size of each pixel is large (e.g., when the resolution is less than 150 ppi), a character displayed on the display portion is blurred. When a user keeps looking at a blurred character displayed on the display portion for a long time, it remains difficult to focus the eye on the character even though the ciliary muscle constantly moves in order to focus the eye, which might put strain on the eye.

In contrast, as shown in FIG. 27B, the display device of one embodiment of the present invention is capable of display with a resolution as high as 150 ppi or more, preferably 200 ppi or more because the size of each pixel is small; thus, smooth, high-resolution images can be displayed. In this case, the ciliary muscle can easily focus the eye on the character, so that the user's muscular asthenopia is reduced. Note that resolution can be expressed by pixel density (pixel per inch (ppi)). Pixel density is the number of pixels per inch. A pixel is a unit composing an image.

Methods for quantitatively measuring eye fatigue have been studied. For example, critical flicker (fusion) frequency (CFF) is known as an indicator for evaluating nervous asthenopia. Further, accommodation time, near point distance, and the like are known as indicators for evaluating muscular asthenopia.

Others methods for evaluating eye fatigue include electroencephalography, thermography, counting the number of times of blinking, measuring tear volume, measuring the speed of contractile response of the pupil, and questionnaires for surveying subjective symptoms.

Figure 28:
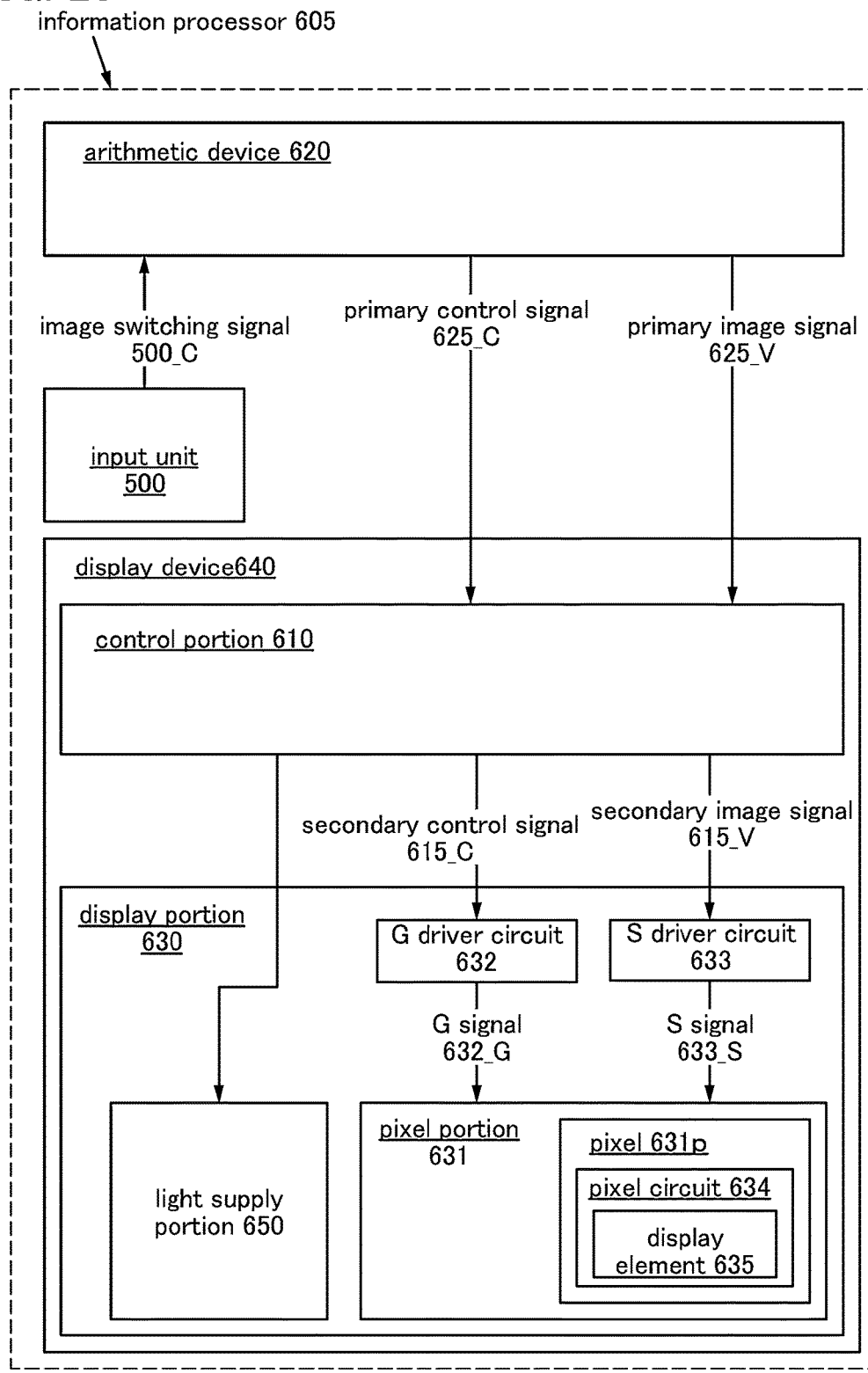
FIG. 28 is a block diagram illustrating a structure of an information processor having a display function of Embodiment.

An information processor 605 with a display function, which is described in this embodiment, includes a display device 640, an arithmetic device 620, and an input unit 500 (see FIG. 28).

<1. Structure of Display Device 640>

A display device 640 includes a display portion 630 and a control portion 610 (see FIG. 28). A primary image signal 625_V and a primary control signal 625_C can be supplied to the display device 640. The display device 640 can display image information on the display portion 630.

The primary image signal 625_V includes, for example, chromaticity information on an image as well as grayscale information (also can be referred to as luminance information).

The primary control signal 625_C includes, for example, a signal for controlling the timing of scan operation of the display device 640.

Note that a power supply potential or the like is supplied to the control portion 610 and the display portion 630 in the display device 640.

[1.1 Control Portion 610]

The control portion 610 has a function of controlling the display portion 630. For example, the control portion 610 generates a secondary image signal 615_V and/or a secondary control signal 615_C.

The control portion 610 may include, for example, a polarity determination circuit. The polarity determination circuit can invert the polarity of a signal every frame.

The polarity determination circuit notifies the timing at which the polarity of the secondary image signal 615_V is to be inverted; accordingly, the control portion 610 may be configured to invert the polarity of the secondary image signal 615_V at the notified timing Note that the polarity of the secondary image signal 615_V may be inverted in the control portion 610, or may be inverted in the display portion 630 in accordance with an instruction from the control portion 610.

The polarity determination circuit may also include a counter and a signal generation circuit and have a function of determining the timing at which the polarity of the secondary image signal 615_V is inverted by using a synchronizing signal.

The counter has a function of counting the number of frame periods by using the pulse of a horizontal synchronizing signal. The signal generation circuit has a function of notifying the control portion 610 of the timing at which the polarity of the secondary image signal 615_V is inverted. This allows the polarity of the secondary image signal 615_V to be inverted every several successive frame periods with the use of information on the number of frame periods obtained by the counter.

[1.1.1 Secondary Image Signal]

The secondary image signal 615_V can include image data.

For example, the control portion 610 may generate the secondary image signal 615_V from the primary image signal 625_V and output the secondary image signal 615_V.

The control portion 610 may also generate, as the secondary image signal 615_V, a signal whose amplitude is a difference between the potential of the primary image signal 625_V and a reference potential Vsc and whose polarity is inverted every frame.

[1.1.2 Secondary Control Signal]

The secondary control signal 615_C can include a signal for controlling a first driver circuit (also referred to as a G driver circuit 632) of the display portion 630 or a signal for controlling a second driver circuit (also referred to as an S driver circuit 633) of the display portion 630.

For example, the control portion 610 may generate the secondary control signal 615_C from the primary control signal 625_C including a synchronizing signal such as a vertical synchronizing signal or a horizontal synchronizing signal.

The secondary control signal 615_C includes, for example, a start pulse signal SP, a latch signal LP, a pulse width control signal PWC, and a clock signal CK.

Specifically, the secondary control signal 615_C includes an S driver circuit start pulse signal SP, an S driver circuit clock signal CK, a latch signal LP, and the like that control the operation of the S driver circuit 633, and the like. The secondary control signal 615_C can also include a G driver circuit start pulse signal SP, a G driver circuit clock signal CK, a pulse width control signal PWC, and the like that control the operation of the G driver circuit 632.

[1.2 Structure of Display Portion 630]

The display portion 630 includes a pixel portion 631, a first driver circuit (also referred to as the G driver circuit 632), and a second driver circuit (also referred to as the S driver circuit 633).

The pixel portion 631 does not include light with a wavelength shorter than 420 nm as display light and includes a plurality of pixels 631p arranged at a resolution of 150 ppi or more and wirings that connect the plurality of pixels 631p. Each of the plurality of pixels 631p is connected to at least one of scan lines G and at least one of signal lines S. Note that the kinds and number of the wirings depend on the structure, number, and position of the pixel 631p.

For example, in the case where the pixels 631p are arranged in a matrix of x columns and y rows in the pixel portion 631, the signal lines S1 to Sx and scan lines G1 to Gy are provided in the pixel portion 631 (see FIG. 29A-1). The plurality of scan lines (G1 to Gy) can supply G signals to the respective rows. The plurality of signal lines (S1 to Sx) can supply S signals to the plurality of pixels.

The G driver circuit 632 can control the supply of a G signal 632_G and select the scan line G (see FIG. 28).

For example, the pixel portion 631 may be divided into a plurality of regions (specifically, a first region 631a, a second region 631b, and a third region 631c) to be driven (see FIG. 29A-2).

In each region, the plurality of pixels 631p, the plurality of scan lines G for selecting the pixels 631p row by row, and the plurality of signal lines S for supplying S signals 633_S to the selected pixels 631p can be provided.

In addition, a plurality of G driver circuits (specifically, a first G driver circuit 632a, a second G driver circuit 632b, and a third G driver circuit 632c) may be provided.

The G driver circuit can control the supply of a G signal 632_G and select the scan lines G in each region (specifically, the scan lines G1 to Gj in the first G driver circuit 632a, the scan lines Gj+1 to G2j in the second G driver circuit 632b, and the scan line G2j+1 to Gy in the third G driver circuit 632c).

[1.2.1 G Driver Circuit]

The G driver circuit outputs the first driving signal (G signal) 632_G for selecting the pixel circuit 634 to the pixel circuit 634. The G driver circuit 632 has a first mode of outputting the G signal 632_G for selecting a scan line to each scan line at a rate of 30 Hz (30 times per second) or more, preferably more than or equal to 60 Hz (60 times per second) and less than 960 Hz (960 times per second) and a second mode of outputting the G signal 632_G to each scan line at a rate of more than or equal to 11.6 μHz (once per day) and less than 0.1 Hz (0.1 times per second), preferably more than or equal to 0.28 mHz (once per hour) and less than 1 Hz (once per second).

The G driver circuit 632 can be switched between the first mode and the second mode to be operated. For example, the G driver circuit 632 can be switched between the first mode and the second mode with the use of the secondary control signal 615_C including a mode switching signal or the G driver circuit start pulse signal included in the secondary control signal 615_C. Specifically, the frequency of output of the G driver circuit start pulse signal from the control portion 610 may be controlled.

The G signal 632_G is generated by the G driver circuit 632. The G signal 632_G are output to the pixels 631p, whereby the pixels 631p are selected row by row.

[1.2.2 S Driver Circuit]

The display portion 630 may include the S driver circuit 633. The S driver circuit generates a second driver signal (also referred to as an S signal 633_S) from the secondary image signal 615_V and controls the supply of the S signals 633_S to the signal lines S (specifically S1 to Sx).

The S signal 633_S includes grayscale information on an image and the like. The S signal 633_S is supplied to the pixel 631p selected by the G signal 632_G.

[1.2.3 Details of Structure of Pixel Portion 631]

The pixel portion 631 includes the plurality of pixels 631p.

The pixel 631p includes a display element 635 and a pixel circuit 634 including the display element 635 (see FIG. 28).

The pixel circuit 634 holds the S signal 633_S supplied and displays some image data in the display element 635. The structure of the pixel circuit 634 can be selected in accordance with the kind or the driving method of the display element 635.

[1.2.3.1 Pixel Circuit]

Figures 1, 29B:
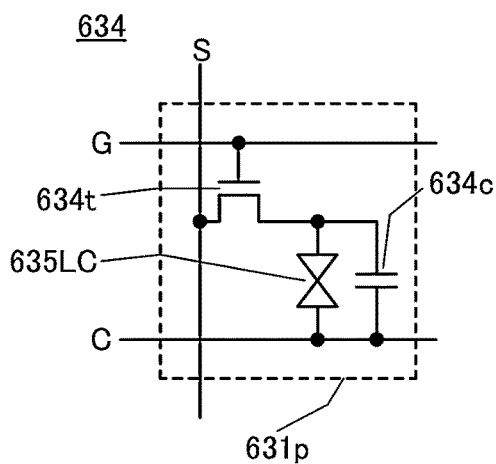
Figures 2, 29B:
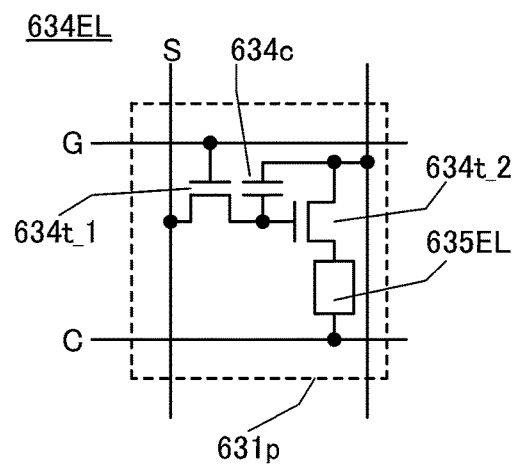

FIG. 29B-1 illustrates, as an example of the pixel circuit 634, a structure in which a liquid crystal element 635LC is used as the display element 635.

The pixel circuit 634 includes a transistor 634t including a gate electrode to which the G signal 632_G is input and a first electrode to which the S signal is input, and the liquid crystal element 635LC including a first electrode electrically connected to a second electrode of the transistor 634t and a second electrode to which a common potential is supplied.

The pixel circuit 634 includes the transistor 634t for controlling supply of the S signal 633_S to the display element 635.

A gate of the transistor 634t is connected to any one of the scan lines G1 to Gy. One of a source and a drain of the transistor 634t is connected to any one of the signal lines S1 to Sx. The other of the source and the drain of the transistor 634t is connected to the first electrode of the display element 635.

In the pixel 631p, one transistor 634t is used as a switching element for controlling input of the S signal 633_S to the pixel 631p. Alternatively, a plurality of transistors which serve as one switching element may be used in the pixel 631p. In that case, the plurality of transistors serving as one switching element may be connected to each other in parallel, in series, or in combination of parallel connection and series connection.

Note that the pixel 631p may further include a capacitor 634c for holding voltage between the first electrode and a second electrode of the liquid crystal element 635LC and another circuit element such as a transistor, a diode, a resistor, a capacitor, or an inductor as needed. A predetermined common potential Vcom is applied to the second electrode of the display element 635.

The capacitance of the capacitor 634c may be adjusted as appropriate. For example, in the second mode described later, the capacitor 634c is provided in the case where the S signal 633_S is held for a relatively long period (specifically, 1/60 sec or longer). It is also possible to adjust the capacitance of the pixel circuit 634 with use of a structure other than the capacitor 634c. For example, a virtual capacitor may be formed by a structure in which the first electrode and the second electrode of the liquid crystal element 635LC are provided to overlap with each other.

FIG. 29B-2 illustrates, as an example of the pixel circuit, a structure in which an EL element 635EL is applied to the display element 635.

A pixel circuit 634EL includes a first transistor 634t_1 including a gate electrode to which the G signal 632_G is input, a first electrode to which the S signal is input, and a second electrode which is electrically connected to a first electrode of the capacitor 634c. The pixel circuit 634EL also includes a second transistor 634t_2 including a gate electrode electrically connected to a second electrode of the first transistor 634t_1, a first electrode electrically connected to a second electrode of the capacitor 634c, and a second electrode electrically connected to a first electrode of the EL element 635EL. A power supply potential is supplied to the second electrode of the capacitor 634c and the first electrode of the second transistor 634t_2, and a common potential is supplied to a second electrode of the EL element 635EL. Note that the difference between the power supply potential and the common potential is higher than the emission start voltage of the EL element 635EL.

[1.2.3.2 Transistor]

In the pixel circuit 634, the transistor 634t controls whether to apply the potential of the signal line S to the first electrode of the display element 635.

Note that a transistor including an oxide semiconductor can be suitably used as the transistor in the display device of one embodiment of the present invention. The above embodiments can be referred to for the details of the transistor including an oxide semiconductor.

A transistor including an oxide semiconductor film can have leakage current between a source and a drain in an off state (off-state current) much lower than that of a conventional transistor including silicon. A transistor with extremely low off-state current is used in a pixel portion of a display portion; thus, frame frequency can be lowered while flicker is reduced.

[1.2.3.3 Display Element]

Besides the liquid crystal element 635LC, any of a variety of display elements such as an OLED element generating electroluminescence when voltage is applied thereto and electronic ink utilizing electrophoresis can be used as the display element 635.

Here, for example, the polarized light transmittance of the liquid crystal element 635LC can be controlled by the potential of the S signal 633_S; thus, gradation can be expressed.

[1.2.4 Light Supply Portion]

For example, in the case where a transmissive liquid crystal element is applied to the display element 635, a light supply portion 650 can be provided in the display portion 630. The light supply portion 650 includes a light source. The control portion 610 controls driving of the light source in the light supply portion 650. The light supply portion 650 supplies light to the pixel portion 631 including the liquid crystal element, and functions as a backlight.

The light source in the light supply portion 650 can be a cold cathode fluorescent lamp, a light-emitting diode (LED), an OLED element, or the like.

In particular, the intensity of blue light emitted from the light source is preferably lower than that of light of any other color. Since blue light included in light emitted from the light source is not absorbed by the cornea and lens of the eye and reaches the retina, this structure can reduce long-term effects of blue light on the retina (e.g., age-related macular degeneration), adverse effects of exposure to blue light until midnight on the circadian rhythm, and the like. Specifically, it is preferable to use a light source which does not emit light with wavelengths shorter than or equal to 400 nm, preferably shorter than or equal to 420 nm, more preferably shorter than or equal to 440 nm (such light is also referred to as UVA).

<2. Arithmetic Device>

The arithmetic device 620 generates the primary image signal 625_V and the primary control signal 625_C including a mode switching signal.

[Example 1 of Primary Control Signal Including Mode Switching Signal]

The mode switching signal may be generated by, for example, order of a user of the information processor 605.

The user of the information processor 605 can give an order to switch display by using an input unit 500. The arithmetic device 620 may be configured to be supplied with an image switching signal 500_C and to output the primary control signal 625_C including the mode switching signal.

The primary control signal 625_C including a mode switching signal is supplied to the control portion 610 in the display device 640, and the primary control signal 625_C including the mode switching signal is output by the control portion.

For example, when the primary control signal 625_C including the mode switching signal for switching the G driver circuit 632 from the second mode to the first mode is supplied to the G driver circuit 632, the G driver circuit 632 is switched from the second mode to the first mode. After that, the G driver circuit 632 outputs the G signal for at least one frame, and then switched to the second mode.

Specifically, the input unit 500 may be configured to output the image switching signal 500_C to the arithmetic device 620 when sensing a page turning operation.

The arithmetic device 620 generates the primary image signal 625_V including the page turning operation and outputs the primary image signal 625_V as well as the primary control signal 625_C including a mode switching signal.

The control portion 610 supplied with the primary image signal 625_V and the primary control signal 625_C supplies the secondary control signal 615_C including the mode switching signal and the secondary image signal 615_V for executing the page turning operation.

The G driver circuit 632 supplied with the secondary control signal 615_C including the mode switching signal is switched from the second mode to the first mode and outputs the G signal 632_G at a high rate.

The S driver circuit 633 supplied with the secondary image signal 615_V including the page turning operation outputs the S signal 633_S generated from the secondary image signal 615_V to the pixel circuit 634.

In this manner, many frame images including the page turning operation can be displayed at high rate by the pixels 631*p*. As a result, smooth images based on the secondary image signals 615_V for executing the page turning operation can be displayed.

[Example 2 of Primary Control Signal Including Mode Switching Signal]

The arithmetic device 620 may be configured to determine whether an image based on the primary image signal 625_V output to the display portion 630 is a moving image or a still image and to output the primary control signal 625_C including the mode switching signal in accordance with the determination result.

Specifically, the arithmetic device 620 outputs a switching signal for selecting the first mode when the image based on the primary image signal 625_V is a moving image and outputs a switching signal for selecting the second mode when the image based on the primary image signal 625_V is a still image.

A method for determining whether the image based on the primary image signals is a moving image or a still image is as follows. Signals for one frame included in the primary image signals 625_V are compared with signals for the pervious frame and signals for the next frame, whereby differences are obtained. It is determined that the image is a moving image when the differences are each greater than a predetermined difference, and it is determined that the image is a still image in other cases When the control portion 610 switches the operating mode of the G driver circuit from one mode to another mode (e.g., from the second mode to the first mode), the G driver circuit may be configured to output the G signals 632_G one or more predetermined times, and then be switched to the other mode <3. Input Unit>

As the input unit 500, a touch panel, a touch pad, a mouse, a finger joystick, a trackball, a data glove, or an imaging device can be used, for example. In the arithmetic device 620, an electric signal output from the input unit 500 can be associated with coordinates of a display portion. Accordingly, a user can input an instruction for processing information displayed on the display portion.

Examples of information input with the input unit 500 by a user are instructions for dragging an image displayed on the display portion to another position on the display portion; for swiping a screen for turning a displayed image and displaying the next image; for scrolling a continuous image; for selecting a specific image; for pinching a screen for changing the size of a displayed image; and for inputting handwritten characters.

Note that illuminance is the amount of light incident on an irradiation surface per unit area and unit time, in which the spectral sensitivity of the eye is taken into consideration.

Note that the structures and the like described in this embodiment can be combined as appropriate with any of the structures and the like described in the other embodiments.

Embodiment 10

Figure 15A:
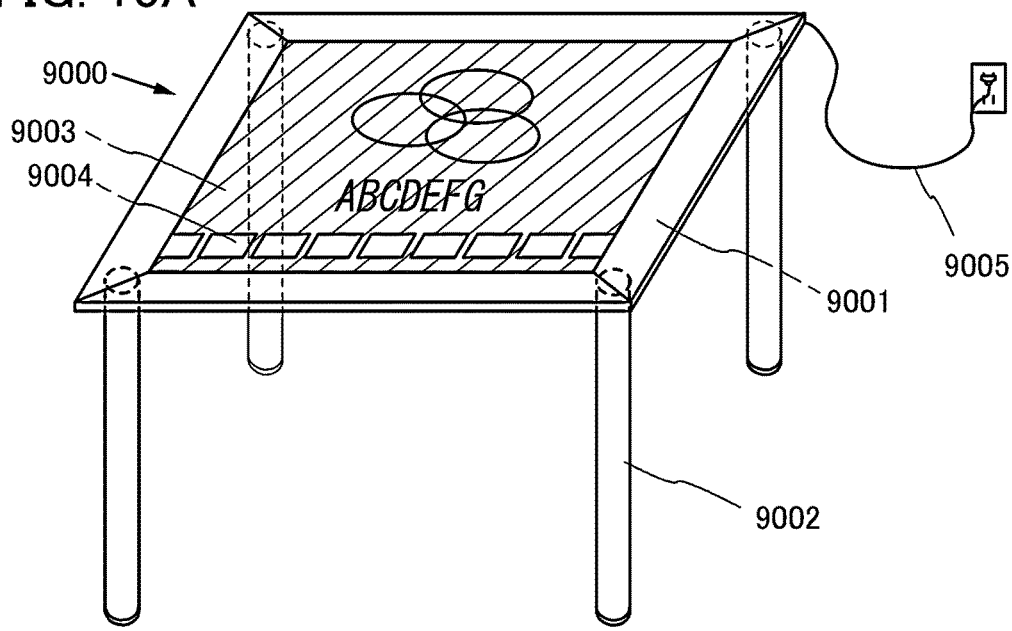
FIGS. 15A to 15C illustrate electronic appliances each including a semiconductor device of one embodiment of the present invention.
Figure 15B:
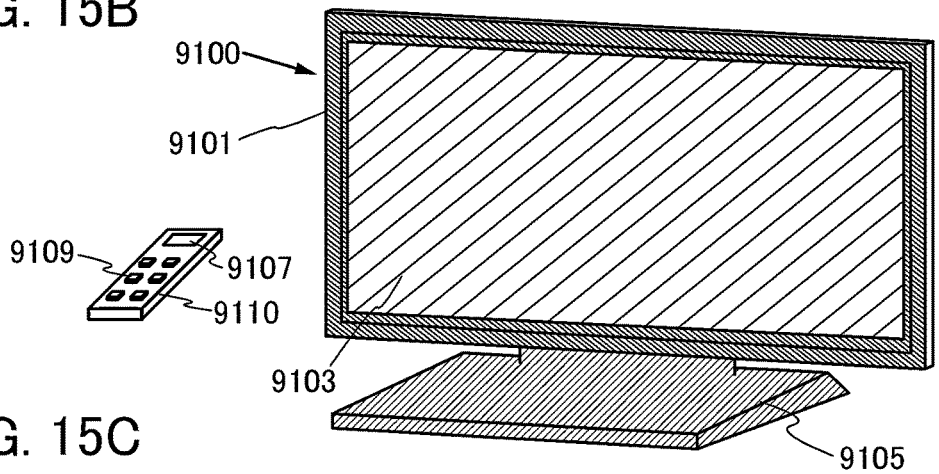
Figure 15C:
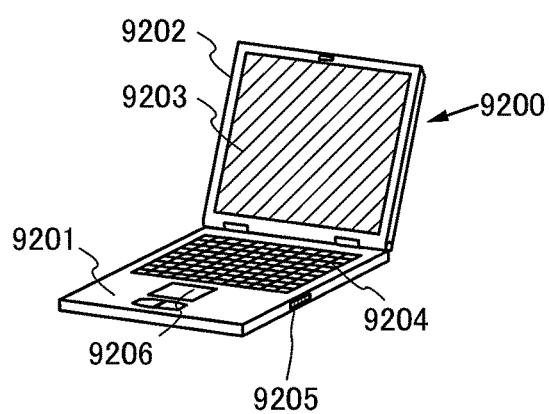

The semiconductor device of one embodiment of the present invention can be applied to a variety of electronic appliances (including game machines). Examples of electronic appliances include a television device (also referred to as television or television receiver), a monitor of a computer or the like, a camera such as a digital camera or a digital video camera, a digital photo frame, a mobile phone, a portable game machine, a portable information terminal, an audio reproducing device, a game machine (e.g., a pachinko machine or a slot machine), and a game console. FIGS. 15A to 15C illustrate examples of these electronic appliances.

FIG. 15A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

Any of the semiconductor devices described in the above embodiments can be used for the display portion 9003. Thus, the display portion 9003 can have high display quality.

The display portion 9003 has a touch-input function. When a user touches displayed buttons 9004 which are displayed on the display portion 9003 of the table 9000 with his/her fingers or the like, the user can carry out operation of the screen and input of information. Further, when the table 9000 may be made to communicate with home appliances or control the home appliances, the table 9000 may function as a control device which controls the home appliances by operation on the screen. For example, with the use of a semiconductor device having an image sensor function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 15B illustrates a television device 9100. In the television device 9100, a display portion 9103 is incorporated in a housing 9101 and an image can be displayed on the display portion 9103. Note that the housing 9101 is supported by a stand 9105 here.

The television device 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television device 9100 illustrated in FIG. 15B is provided with a receiver, a modem, and the like. With the receiver, the television device 9100 can receive a general television broadcast. Further, when the television device 9100 is connected to a communication network by wired or wireless connection via the modem, one-way (from a transmitter to a receiver) or two-way (between a transmitter and a receiver or between receivers) data communication can be performed.

Any of the semiconductor devices described in the above embodiments can be used for the display portions 9103 and 9107. Thus, the television device can have high display quality.

FIG. 15C illustrates a computer 9200, which includes a main body 9201, a housing 9202, a display portion 9203, a keyboard 9204, an external connection port 9205, a pointing device 9206, and the like.

Any of the semiconductor devices described in the above embodiments can be used for the display portion 9203. Thus, the computer 9200 can have high display quality.

The display portion 9203 has a touch-input function. When a user touches displayed buttons which are displayed on the display portion 9203 of the computer 9200 with his/her fingers or the like, the user can carry out operation of the screen and input of information. Further, when the computer 9200 may be made to communicate with home appliances or control the home appliances, the computer 9200 may function as a control device which controls the home appliances by operation on the screen. For example, with the use of the semiconductor device having an image sensing function described in Embodiment 5, the display portion 9203 can have a touch-input function.

Figure 16A:
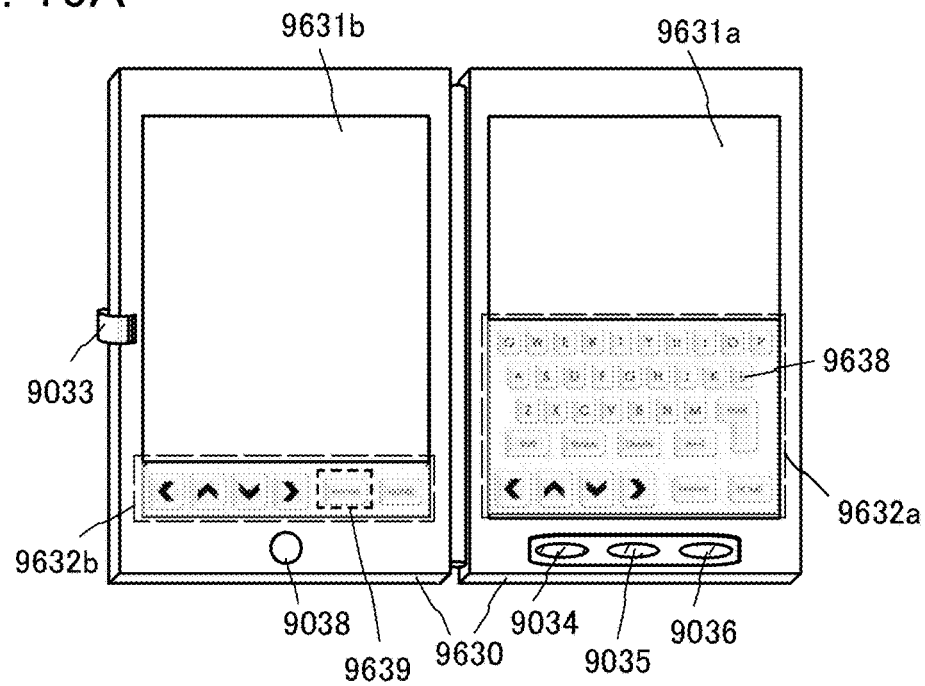
FIGS. 16A to 16C illustrate an electronic appliance including a semiconductor device of one embodiment of the present invention.
Figure 16B:
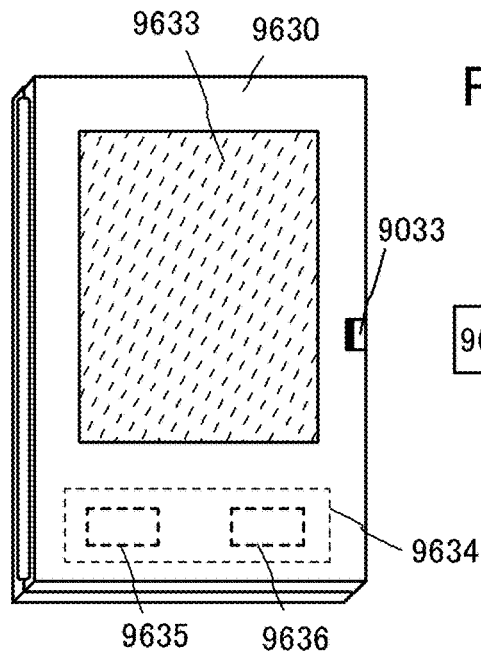

FIGS. 16A and 16B illustrate a foldable tablet terminal. In FIG. 16A, the tablet terminal is opened, and includes a housing 9630, a display portion 9631$a$, a display portion 9631$b$, a display-mode switching button 9034, a power button 9035, a power-saving-mode switching button 9036, a clip 9033, and an operation button 9038.

The semiconductor device described in any of the above embodiments can be used for the display portion 9631$a$ and the display portion 9631$b$. Thus, the display quality of the tablet terminal can be improved.

Part of the display portion 9631$a$ can be a touch panel region 9632$a$, and data can be input by touching operation keys 9638 that are displayed. Although a structure in which a half region in the display portion 9631$a$ has only a display function and the other half region also has a touch panel function is illustrated as an example, the structure of the display portion 9631$a$ is not limited thereto. The whole area of the display portion 9631$a$ may have a touchscreen function. For example, all the area of the display portion 9631$a$ can display keyboard buttons and serve as a touchscreen while the display portion 9631$b$ can be used as a display screen.

Like the display portion 9631$a$, part of the display portion 9631$b$ can be a touchscreen region 9632$b$. When a finger, a stylus, or the like touches the place where a button 9639 for switching to keyboard display is displayed in the touchscreen, keyboard buttons can be displayed on the display portion 9631$b$.

Touch input can be performed concurrently on the touch panel regions 9632$a$ and 9632$b$.

The display-mode switching button 9034 can switch display orientation (e.g., between landscape mode and portrait mode) and select a display mode (switch between monochrome display and color display), for example. With the power-saving-mode switching button 9036, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although the display portion 9631$a$ and the display portion 9631$b$ have the same display area in FIG. 16A, one embodiment of the present invention is not limited to this example. The display portion 9631$a$ and the display portion 9631$b$ may have different areas or different display quality. For example, one of them may be a display panel that can display higher-definition images than the other.

In FIG. 16B, the tablet terminal is folded and includes the housing 9630, a solar cell 9633, and a charge and discharge control circuit 9634. Note that in FIG. 16B, an example in which the charge and discharge control circuit 9634 includes the battery 9635 and the DCDC converter 9636 is illustrated.

Since the tablet terminal can be folded in two, the housing 9630 can be closed when the tablet terminal is not in use. Thus, the display portions 9631a and 9631b can be protected, thereby providing a tablet terminal with high endurance and high reliability for long-term use.

In addition, the tablet terminal illustrated in FIGS. 16A and 16B can have a function of displaying various kinds of data (e.g., a still image, a moving image, and a text image), a function of displaying a calendar, a date, the time, or the like on the display portion, a touch-input function of operating or editing the data displayed on the display portion by touch input, a function of controlling processing by various kinds of software (programs), and the like.

The solar cell 9633, which is attached on the surface of the tablet terminal, supplies electric power to a touch panel, a display portion, an image signal processor, and the like. Note that the solar cell 9633 can be provided on one or both surfaces of the housing 9630, so that the battery 9635 can be charged efficiently. When a lithium ion battery is used as the battery 9635, there is an advantage of downsizing or the like.

Figure 16C:
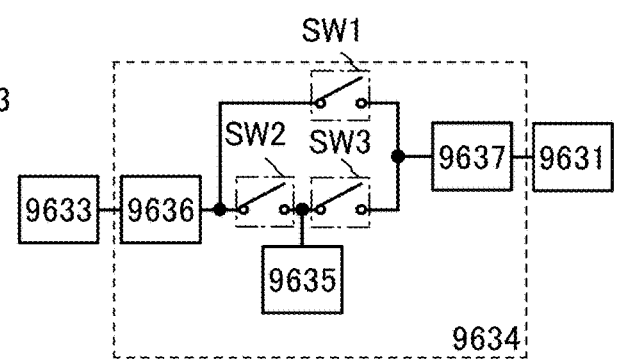

The structure and operation of the charge and discharge control circuit 9634 illustrated in FIG. 16B are described with reference to a block diagram of FIG. 16C. FIG. 16C illustrates the solar cell 9633, the battery 9635, the DC-to-DC converter 9636, a converter 9637, switches SW1 to SW3, and a display portion 9631. The battery 9635, the DC-to-DC converter 9636, the converter 9637, and the switches SW1 to SW3 correspond to the charge and discharge control circuit 9634 illustrated in FIG. 16B.

First, an example of the operation in the case where power is generated by the solar cell 9633 using external light is described. The voltage of power generated by the solar battery is raised or lowered by the DC-to-DC converter 9636 so that the power has voltage for charging the battery 9635. When the display portion 9631 is operated with the power from the solar cell 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Note that the solar cell 9633 is described as an example of a power generation means; however, without limitation on the power generation means, the battery 9635 may be charged using another power generation means such as a piezoelectric element or a thermoelectric conversion element (Peltier element). For example, the battery 9635 may be charged with a non-contact power transmission module which is capable of charging by transmitting and receiving power by wireless (without contact), or another charging means may be used in combination.

Note that the structures and the like described in this embodiment can be combined as appropriate with any of the structures and the like described in the other embodiments.

Example

Figure 49:
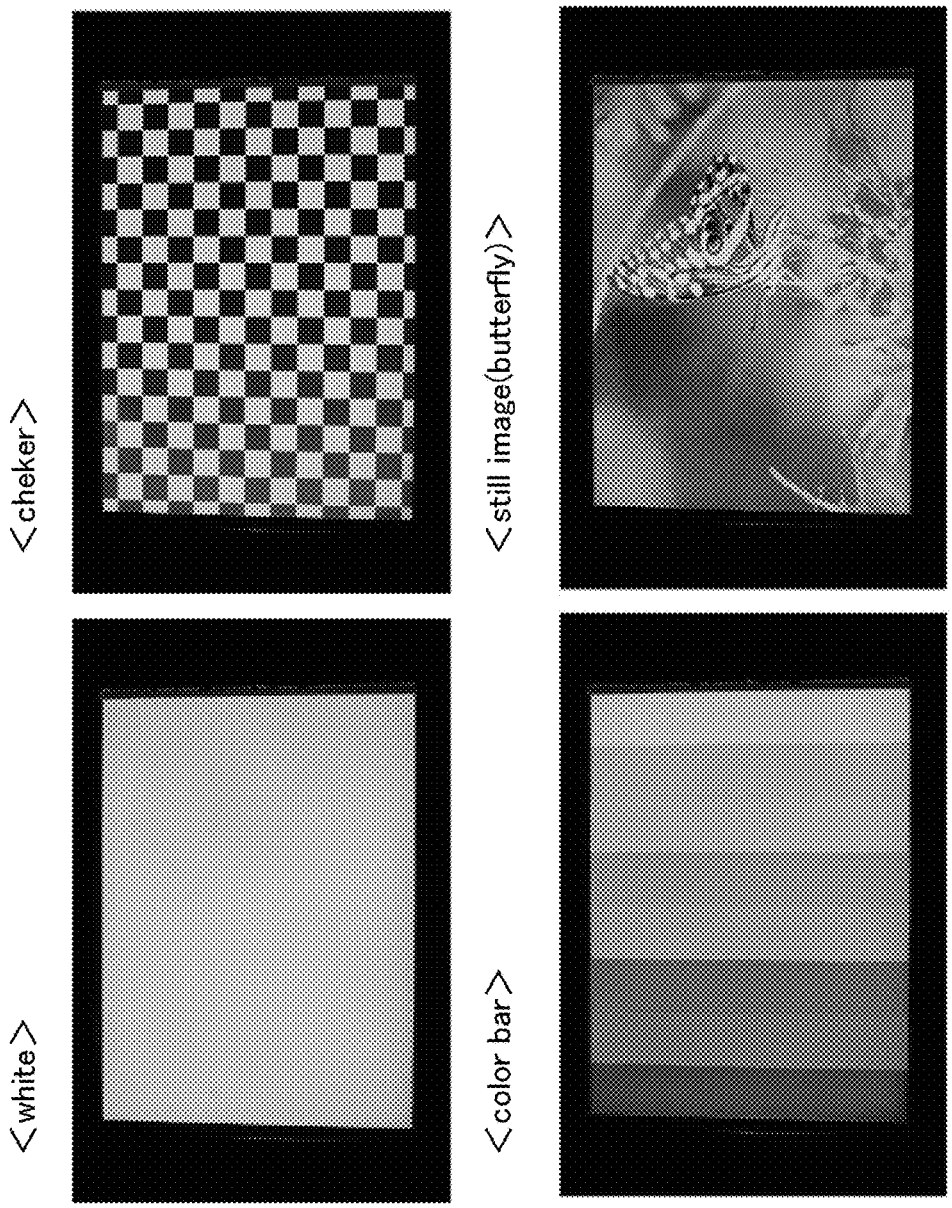
FIG. 49 shows display results.

In this example, an electrode formed of a light-transmitting semiconductor film containing an impurity was used as one of a pair of electrodes included in a capacitor, and display was performed. FIG. 49 shows displayed images.

FIG. 49 demonstrates that display was possible even when the capacitor including the electrode formed of the light-transmitting semiconductor film containing an impurity was used.

Reference Example

The relation between the wavelength and the transmittance is shown in order to check that an oxide semiconductor absorbs blue light.

A sample 1 includes a 400-nm-thick silicon nitride film, a 50-nm-thick silicon oxynitride film over the silicon nitride film, a 35-nm-thick In—Ga—Zn-based oxide film over the silicon oxynitride film, a 100-nm-thick silicon nitride film over the In—Ga—Zn-based oxide film, and a 100-nm-thick film of a compound of silicon oxide and indium tin oxide over the silicon nitride film.

A sample 2 includes a 400-nm-thick silicon nitride film, a 35-nm-thick In—Ga—Zn-based oxide film over the silicon nitride film, a 450-nm-thick silicon oxide film over the In—Ga—Zn-based oxide film, a 100-nm-thick silicon nitride film over the silicon oxide film, and a 100-nm-thick film of a compound of silicon oxide and indium tin oxide over the silicon nitride film.

A sample 3 includes a 400-nm-thick silicon nitride film, a 50-nm-thick silicon oxynitride film over the silicon nitride film, a 35-nm-thick In—Ga—Zn-based oxide film over the silicon oxynitride film, a 450-nm-thick silicon oxide film over the In—Ga—Zn-based oxide film, a 100-nm-thick silicon nitride film over the silicon oxide film, a 100-nm-thick film of a compound of silicon oxide and indium tin oxide over the silicon nitride film.

Figure 30:
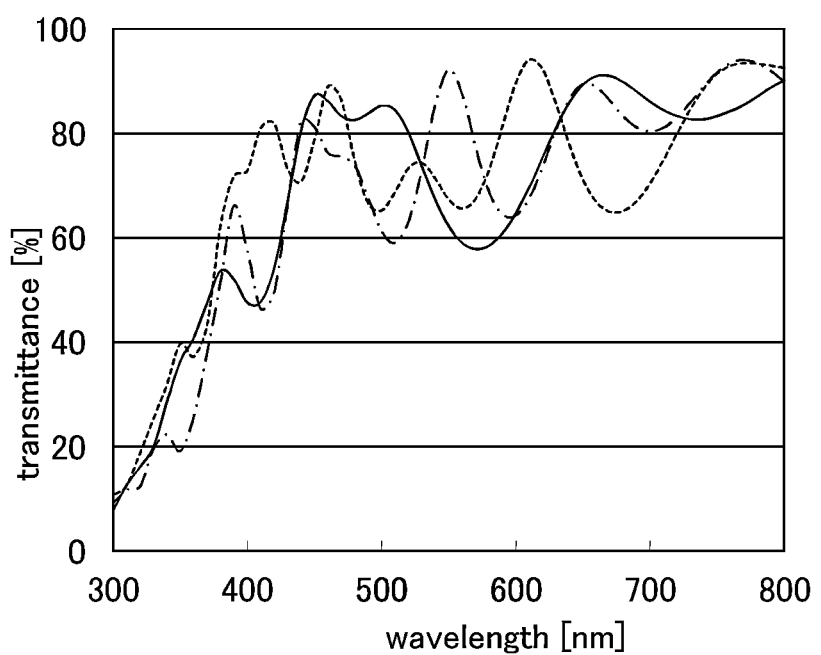
FIG. 30 shows relation between the wavelength and the transmittance through samples in Comparative Example.

FIG. 30 shows the relation between the wavelength and the transmittance. In FIG. 30, a solid line, a dotted line, and a dashed-dotted line represent the sample 1, the sample 2, and the sample 3, respectively. FIG. 30 demonstrate that the transmittance of light with wavelengths of 400 nm to 460 nm through every sample is lower than that of light with a wavelength in the visible range through every sample. The reduction in the transmittance indicates that the samples absorbed light with wavelengths of 400 nm to 460 nm.

This application is based on Japanese Patent Application serial no. 2012-281865 filed with Japan Patent Office on Dec. 25, 2012, the entire contents of which are hereby incorporated by reference.

What is claimed is:
1. A semiconductor device comprising:
a transistor comprising a gate electrode, a source electrode, a drain electrode, and a light-transmitting semiconductor film;
a light-transmitting conductive film on a surface where the light-transmitting semiconductor film is formed, wherein the light-transmitting conductive film functions as one of a pair of electrodes of a capacitor;
an insulating film over the light-transmitting conductive film, wherein the insulating film functions as a dielectric film of the capacitor;
a pixel electrode electrically connected to the transistor, wherein the pixel electrode functions as the other of the pair of electrodes of the capacitor;
a capacitor line on a surface where the gate electrode is formed;
an electrode on a surface where the pixel electrode is formed; and
a conductive film on a surface where the source electrode or the drain electrode is formed,
wherein the capacitor line is electrically connected to the light-transmitting conductive film through the electrode and the conductive film,
wherein the light-transmitting conductive film includes a region whose conductivity is higher than the conductivity of the light-transmitting semiconductor film, wherein the electrode and the conductive film are formed from at least one of different materials, and wherein the conductive film is in contact with a side surface of the light-transmitting conductive film.

2. The semiconductor device according to claim 1,
wherein the light-transmitting semiconductor film is over the gate electrode,
wherein the source electrode and the drain electrode are over the light-transmitting semiconductor film, and
wherein the electrode is over the conductive film.

3. The semiconductor device according to claim 1,
wherein the light-transmitting semiconductor film is an oxide semiconductor film.

4. The semiconductor device according to claim 3, further comprising a first oxide film and a second oxide film between which the oxide semiconductor film is interposed.

5. The semiconductor device according to claim 1,
wherein the light-transmitting conductive film comprises one or more elements selected from the group consisting of hydrogen, boron, nitrogen, fluorine, aluminum, phosphorus, arsenic, indium, tin, antimony, and a rare gas element.

6. A semiconductor device comprising:
a transistor comprising a gate electrode, a source electrode, a drain electrode, and a light-transmitting semiconductor film;
an insulating film having a stacked structure of an oxide insulating film and a nitride insulating film over the oxide insulating film, wherein the insulating film is over the light-transmitting semiconductor film;
a light-transmitting conductive film on a surface where the light-transmitting semiconductor film is formed, wherein the light-transmitting conductive film is in contact with the oxide insulating film and functions as one of a pair of electrodes of a capacitor;
a pixel electrode electrically connected to the transistor, wherein the pixel electrode functions as the other of the pair of electrodes of the capacitor;
a capacitor line on a surface where the gate electrode is formed;
an electrode on a surface where the pixel electrode is formed; and
a conductive film on a surface where the source electrode or the drain electrode is formed,
wherein the nitride insulating film functions as a dielectric film of the capacitor,
wherein the capacitor line is electrically connected to the light-transmitting conductive film through the electrode and the conductive film,
wherein the light-transmitting conductive film includes a region whose conductivity is higher than the conductivity of the light-transmitting semiconductor film,
wherein the electrode and the conductive film are formed from at least one of different materials, and
wherein the conductive film is in contact with a side surface of the light-transmitting conductive film.

7. The semiconductor device according to claim 6,
wherein the light-transmitting semiconductor film is over the gate electrode,
wherein the source electrode and the drain electrode are over the light transmitting semiconductor film, and
wherein the electrode is over the conductive film.

8. The semiconductor device according to claim 6,
wherein the light-transmitting semiconductor film is an oxide semiconductor film.

9. The semiconductor device according to claim 8, further comprising a first oxide film and a second oxide film between which the oxide semiconductor film is interposed.

10. The semiconductor device according to claim 6,
wherein the light-transmitting conductive film comprises one or more elements selected from the group consisting of hydrogen, boron, nitrogen, fluorine, aluminum, phosphorus, arsenic, indium, tin, antimony, and a rare gas element.

11. The semiconductor device according to claim 1,
wherein the conductive film is sandwiched between the light-transmitting conductive film and the pixel electrode.

12. The semiconductor device according to claim 1,
wherein a bottom surface of the electrode is electrically connected to an upper surface of the conductive film.

* * * * *